United States Patent
Sharangpani et al.

(10) Patent No.: US 10,276,583 B2
(45) Date of Patent: *Apr. 30, 2019

(54) THREE-DIMENSIONAL MEMORY DEVICE CONTAINING COMPOSITE WORD LINES INCLUDING A METAL SILICIDE AND AN ELEMENTAL METAL AND METHOD OF MAKING THEREOF

(71) Applicant: SANDISK TECHNOLOGIES LLC, Plano, TX (US)

(72) Inventors: Rahul Sharangpani, Fremont, CA (US); Fumitaka Amano, Yokkaichi (JP); Raghuveer S. Makala, Campbell, CA (US); Adarsh Rajashekhar, Santa Clara, CA (US); Fei Zhou, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/730,045

(22) Filed: Oct. 11, 2017

(65) Prior Publication Data

US 2018/0033646 A1 Feb. 1, 2018

Related U.S. Application Data

(63) Continuation-in-part of application No. PCT/US2016/049496, filed on Aug. 30, 2016, which is a continuation of application No. 15/086,702, filed on Mar. 31, 2016, now Pat. No. 9,793,139.

(Continued)

(51) Int. Cl.
*H01L 27/11563* (2017.01)
*H01L 27/11578* (2017.01)
(Continued)

(52) U.S. Cl.
CPC .... *H01L 27/11563* (2013.01); *H01L 21/3065* (2013.01); *H01L 21/311* (2013.01);
(Continued)

(58) Field of Classification Search
CPC ............... H01L 27/0688; H01L 27/088; H01L 27/1052; H01L 27/108; H01L 27/10844;
(Continued)

(56) References Cited

U.S. PATENT DOCUMENTS 5,084,417 A   1/1992 Joshi et al.
5,583,360 A  12/1996 Roth et al.
(Continued)

FOREIGN PATENT DOCUMENTS

WO   WO2002/015277 A1   2/2002
WO   WO2013/154963 A2  10/2013

OTHER PUBLICATIONS

U.S. Appl. No. 15/624,006, filed Jun. 15, 2017, Sandisk Technologies LLC.
(Continued)

*Primary Examiner* — Eduardo A Rodela
(74) *Attorney, Agent, or Firm* — The Marbury Law Group PLLC

(57) ABSTRACT

Word lines for a three-dimensional memory device can be formed by forming a stack of alternating layers comprising insulating layers and sacrificial material layers and memory stack structures vertically extending therethrough. Backside recesses are formed by removing the sacrificial material layers through a backside via trench. A metal silicide layer and metal portion are formed in the backside recesses to form the word lines including a metal portion, a metal silicide layer, and optionally, a silicon-containing layer.

13 Claims, 76 Drawing Sheets

Related U.S. Application Data

(60) Provisional application No. 62/247,839, filed on Oct. 29, 2015.

(51) Int. Cl.

| | |
|---|---|
| *H01L 27/11568* | (2017.01) |
| *H01L 27/1157* | (2017.01) |
| *H01L 27/11582* | (2017.01) |
| *H01L 21/3065* | (2006.01) |
| *H01L 21/311* | (2006.01) |
| *H01L 21/441* | (2006.01) |
| *H01L 21/443* | (2006.01) |
| *H01L 21/768* | (2006.01) |
| *H01L 27/06* | (2006.01) |
| *H01L 27/105* | (2006.01) |
| *H01L 27/108* | (2006.01) |
| *H01L 27/11534* | (2017.01) |
| *H01L 27/11556* | (2017.01) |
| *H01L 27/11573* | (2017.01) |
| *H01L 29/49* | (2006.01) |

(52) U.S. Cl.
CPC .......... *H01L 21/441* (2013.01); *H01L 21/443* (2013.01); *H01L 21/76871* (2013.01); *H01L 27/0688* (2013.01); *H01L 27/108* (2013.01); *H01L 27/1052* (2013.01); *H01L 27/10844* (2013.01); *H01L 27/1157* (2013.01); *H01L 27/11534* (2013.01); *H01L 27/11556* (2013.01); *H01L 27/11568* (2013.01); *H01L 27/11573* (2013.01); *H01L 27/11578* (2013.01); *H01L 27/11582* (2013.01); *H01L 29/495* (2013.01); *H01L 29/4975* (2013.01)

(58) Field of Classification Search
CPC ............... H01L 27/11; H01L 27/11514; H01L 27/11551; H01L 27/11563; H01L 27/11568; H01L 27/11578; H01L 27/11582; H01L 21/3065; H01L 21/311; H01L 21/441; H01L 21/443
See application file for complete search history.

(56) References Cited

U.S. PATENT DOCUMENTS

| | | | |
|---|---|---|---|
| 5,633,523 A * | 5/1997 | Kato | H01L 21/823835 257/369 |
| 5,670,410 A * | 9/1997 | Pan | B24B 37/013 148/DIG. 14 |
| 5,807,788 A | 9/1998 | Brodsky et al. | |
| 5,897,354 A | 4/1999 | Kachelmeier | |
| 5,915,167 A | 6/1999 | Leedy | |
| 6,238,978 B1 | 5/2001 | Huster | |
| 6,759,343 B2 | 7/2004 | Lee et al. | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,259,092 B2 * | 8/2007 | Jung | H01L 21/28562 257/E21.171 |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,008,722 B2 | 8/2011 | Kim et al. | |
| 8,053,829 B2 | 11/2011 | Kang et al. | |
| 8,102,694 B2 | 1/2012 | Herner et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,237,213 B2 | 8/2012 | Liu | |
| 8,283,228 B2 | 10/2012 | Alsmeier | |
| 8,349,681 B2 | 1/2013 | Alsmeier et al. | |
| 8,349,682 B2 | 1/2013 | Alsmeier et al. | |
| 8,445,347 B2 | 5/2013 | Alsmeier | |
| 8,461,000 B2 | 6/2013 | Alsmeier et al. | |
| 8,580,639 B2 | 11/2013 | Alsmeier et al. | |
| 8,765,543 B2 | 7/2014 | Alsmeier et al. | |
| 8,829,591 B2 | 9/2014 | Alsmeier | |
| 8,847,302 B2 | 9/2014 | Alsmeier et al. | |
| 8,928,061 B2 | 1/2015 | Chien et al. | |
| 8,946,810 B2 | 2/2015 | Alsmeier | |
| 9,397,046 B1 | 7/2016 | Sharangpani et al. | |
| 9,449,984 B2 | 9/2016 | Alsmeier et al. | |
| 9,524,977 B2 | 12/2016 | Sharangpani et al. | |
| 9,524,981 B2 | 12/2016 | Pachamuthu et al. | |
| 9,576,967 B1 | 2/2017 | Kimura et al. | |
| 9,613,977 B2 | 4/2017 | Sharangpani et al. | |
| 9,627,399 B2 | 4/2017 | Kanakamedala et al. | |
| 9,646,975 B2 | 5/2017 | Peri et al. | |
| 9,793,139 B2 * | 10/2017 | Sharangpani | H01L 21/443 |
| 2005/0104108 A1 * | 5/2005 | Hong | H01L 21/823842 257/298 |
| 2007/0210338 A1 | 9/2007 | Orlowski | |
| 2007/0252201 A1 | 11/2007 | Kito et al. | |
| 2008/0173928 A1 | 7/2008 | Arai et al. | |
| 2008/0316808 A1 | 12/2008 | Herner et al. | |
| 2009/0242967 A1 | 10/2009 | Katsumata et al. | |
| 2009/0283819 A1 | 11/2009 | Ishikawa et al. | |
| 2009/0294828 A1 | 12/2009 | Ozawa et al. | |
| 2010/0044778 A1 | 2/2010 | Seol et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0181610 A1 | 7/2010 | Kim et al. | |
| 2010/0207195 A1 | 8/2010 | Fukuzumi et al. | |
| 2010/0213527 A1 | 8/2010 | Shim et al. | |
| 2010/0320528 A1 | 12/2010 | Jeong et al. | |
| 2011/0076819 A1 | 3/2011 | Kim et al. | |
| 2011/0095380 A1 * | 4/2011 | Matsuda | H01L 21/28518 257/412 |
| 2011/0133606 A1 | 6/2011 | Yoshida et al. | |
| 2011/0266606 A1 | 11/2011 | Park et al. | |
| 2011/0303965 A1 * | 12/2011 | Kim | H01L 21/28273 257/321 |
| 2011/0303971 A1 | 12/2011 | Lee et al. | |
| 2012/0001247 A1 | 1/2012 | Alsmeier | |
| 2012/0001249 A1 | 1/2012 | Alsmeier | |
| 2012/0001250 A1 * | 1/2012 | Alsmeier | H01L 27/11551 257/319 |
| 2012/0012920 A1 | 1/2012 | Shin et al. | |
| 2012/0012921 A1 | 1/2012 | Liu | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2013/0314975 A1 * | 11/2013 | Katayama | H01L 27/101 365/148 |
| 2014/0008714 A1 | 1/2014 | Makala et al. | |
| 2014/0203346 A1 | 7/2014 | Lee | |
| 2014/0225181 A1 | 8/2014 | Makala et al. | |
| 2014/0273373 A1 | 9/2014 | Makala et al. | |
| 2014/0353738 A1 | 12/2014 | Makala et al. | |
| 2015/0060977 A1 | 3/2015 | Lee et al. | |
| 2015/0072488 A1 | 3/2015 | Chien et al. | |
| 2015/0179662 A1 | 6/2015 | Makala et al. | |
| 2015/0243675 A1 | 8/2015 | Lim et al. | |
| 2016/0093634 A1 * | 3/2016 | Jang | H01L 27/11582 257/324 |
| 2016/0307908 A1 | 10/2016 | Sharangpani et al. | |

(56) References Cited

U.S. PATENT DOCUMENTS

2017/0092733 A1 3/2017 Makala et al.
2017/0125538 A1 5/2017 Sharangpani et al.

OTHER PUBLICATIONS

Reid, J. S. et al., "Evaluation of Amorphous (Mo, Ta, W)—Si—N Diffusion Barriers for <Si>|Cu Metallizations," Thin Solid Films, vol. 236, pp. 319-324, (1993).
Endoh et al., "Novel Ultra High Density Memory with a Stacked-Surrounding Gate Transistor (S-SGT) Structured Cell," IEDM Proc. (2001) pp. 33-36.
Gueye, M. el al., "Silicon Deposition From Disilane: Experimental Study and Modeling," Journal de Physique IV Colloque, vol. 2, pp. C2-63 to C2-70, (1991).
Nakayama, Y. et al., "Deposition Mechanism of a-Si: H Film in Distance-Hydrogen Plasma," Japanese Journal of Applied Physics, vol. 23, No. 7, pp. L470-L472, (1984).
Toutsas, A. et al., "Deposition and Crystallization of a-Si Low Pressure Chemically Vapor Deposited Films Obtained by Low-Temperature Pyrolysis of Disilane," J. Electrochem., Soc., vol. 140, No. 3, pp. 871-877, (1993).
Invitation to Pay Additional Fees and, Where Applicable, Protest Fee, and Communication Relating to the Results of the Partial International Search for International Application No. PCT/US2016/049496, dated Nov. 21, 2016, 9 pages.
International Search Report and Written Opinion of the International Searching Authority for International Application No. PCT/US2016/049496, dated Jan. 25, 2017, 17 pages.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Kimura, M. "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
International Search Report, International Application No. PCT/US2013/035567, dated Sep. 30, 2013, 6pgs.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Invitation to Pay Additional Fees and Partial International Search Report, PCT/US2011/042566, dated Sep. 28, 2011.
Au et al., "Filling Narrow Trenches by Iodine-Catalyzed CVD of Copper and Manganese on Manganese Nitride Barrier/Adhesion Layers," Journal of the Electrochemical Society, 158(5) (2011).
Kim et al., "Direct Copper Electroless Deposition on a Tungsten Barrier Layer for Ultralarge Scale Integration," Journal of the Electrochemical Society, vol. 152, Issue 2, 2005.
European Office Communication Article 94(3) EPC for Corresponding EP 11745848.9, dated May 12, 2015.
International Search Report and Written Opinion of the International Searching Authority for International Application No. PCT/US2016/036349, dated Sep. 14, 2016, 15 pages.
International Preliminary Report on Patentability from the International Bureau for International Patent Application No. PCT/US2016/049496, dated May 11, 2018, 12 pages.

* cited by examiner

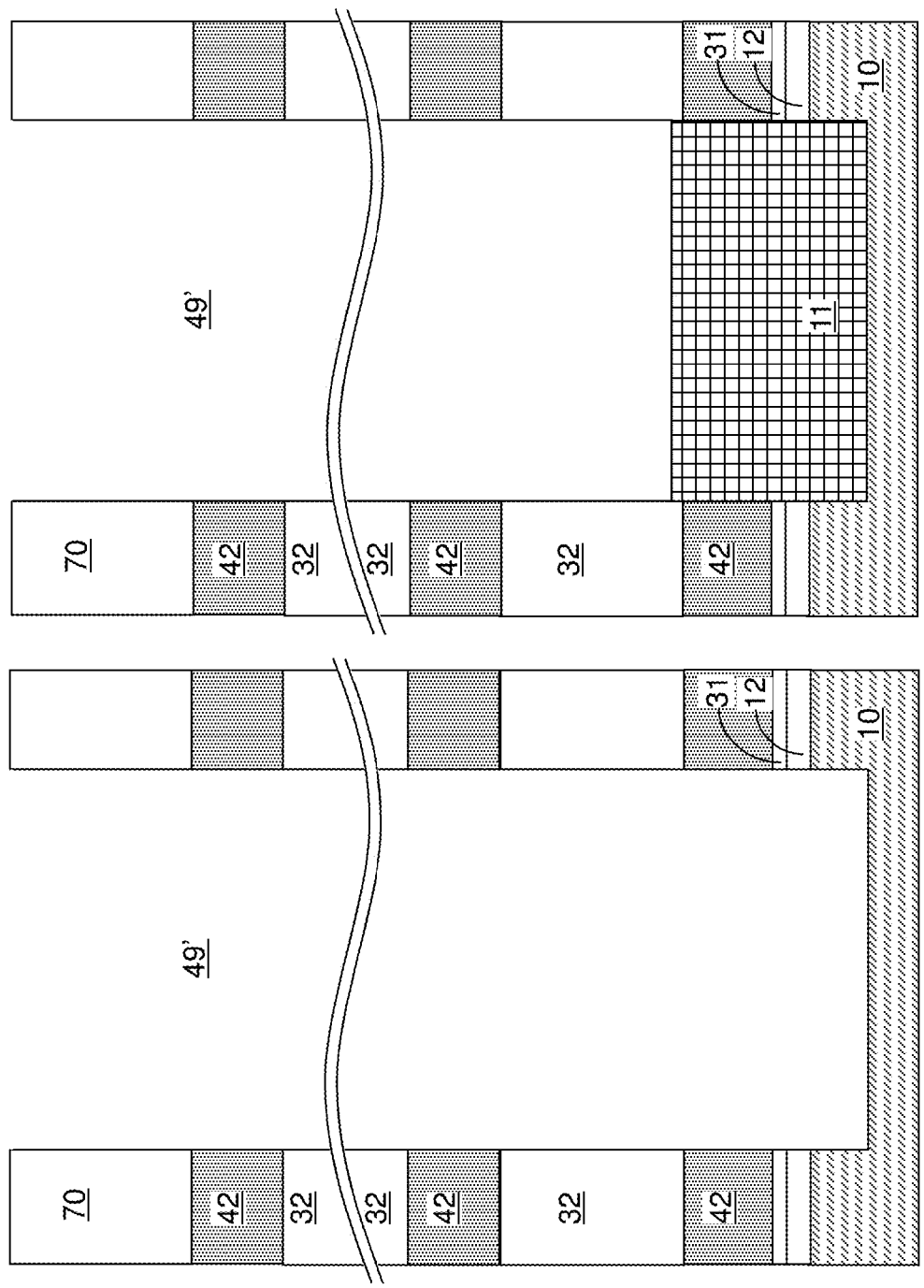

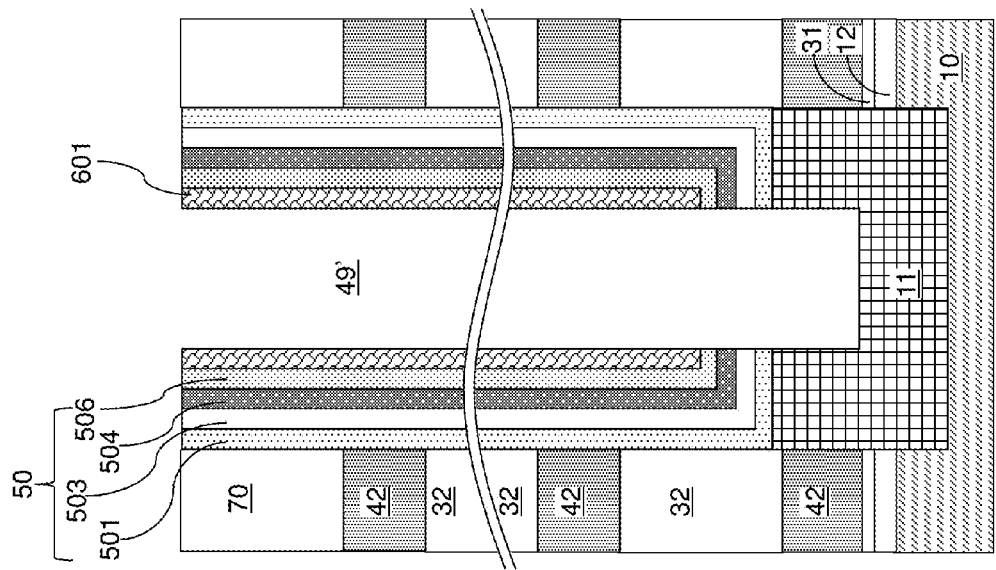
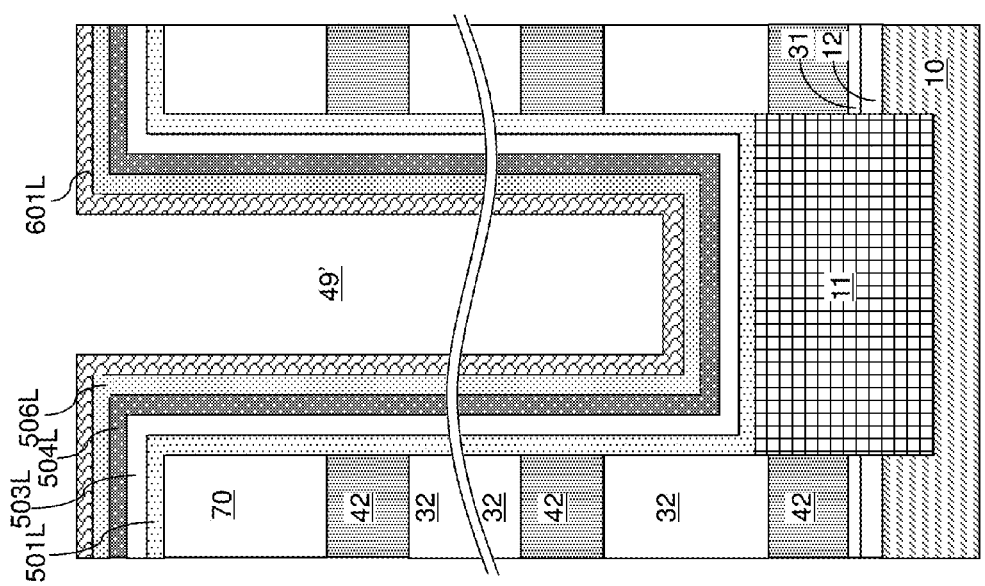

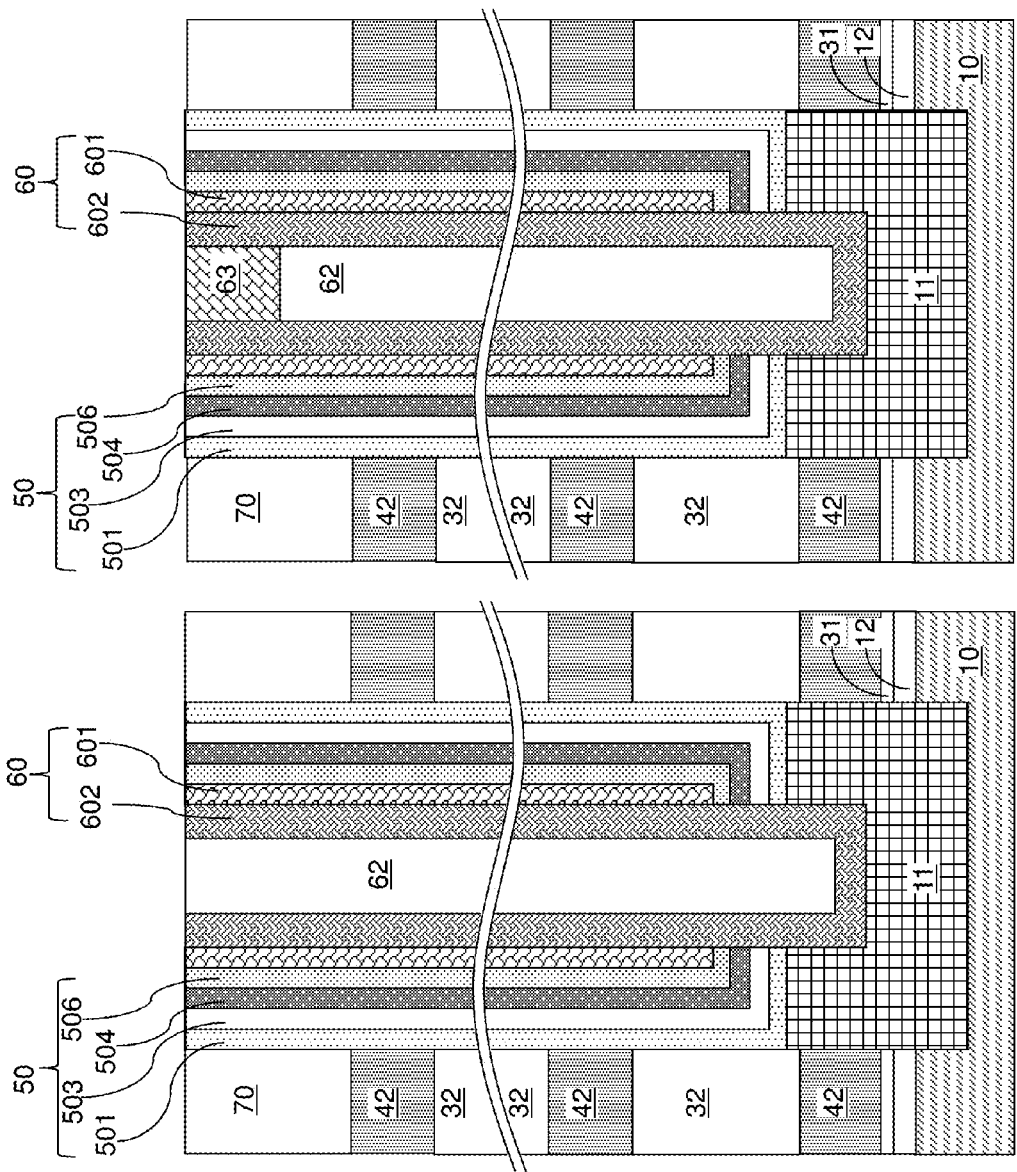

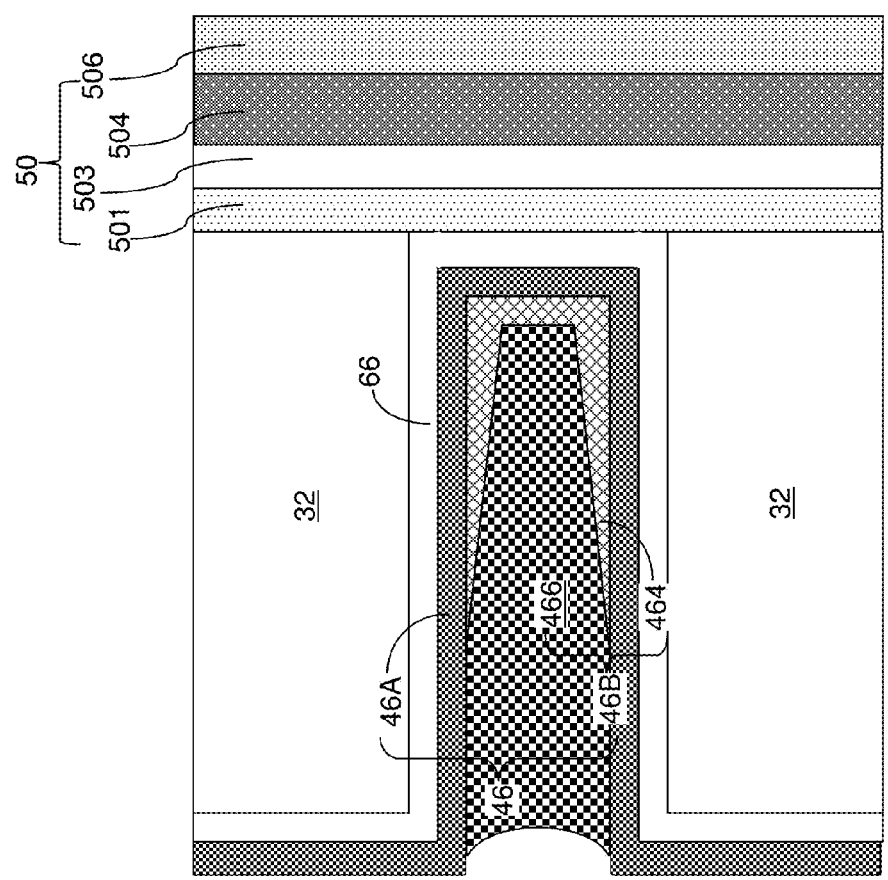

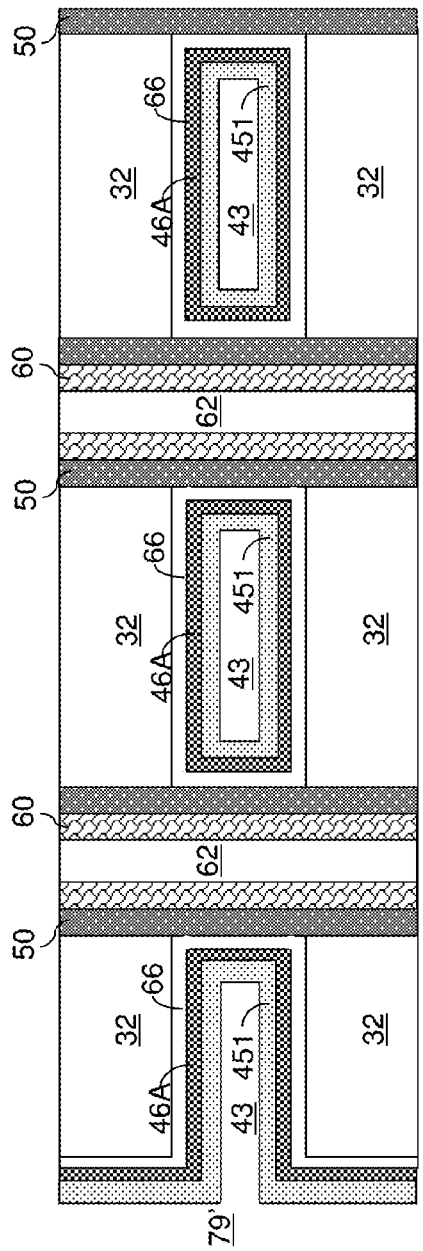
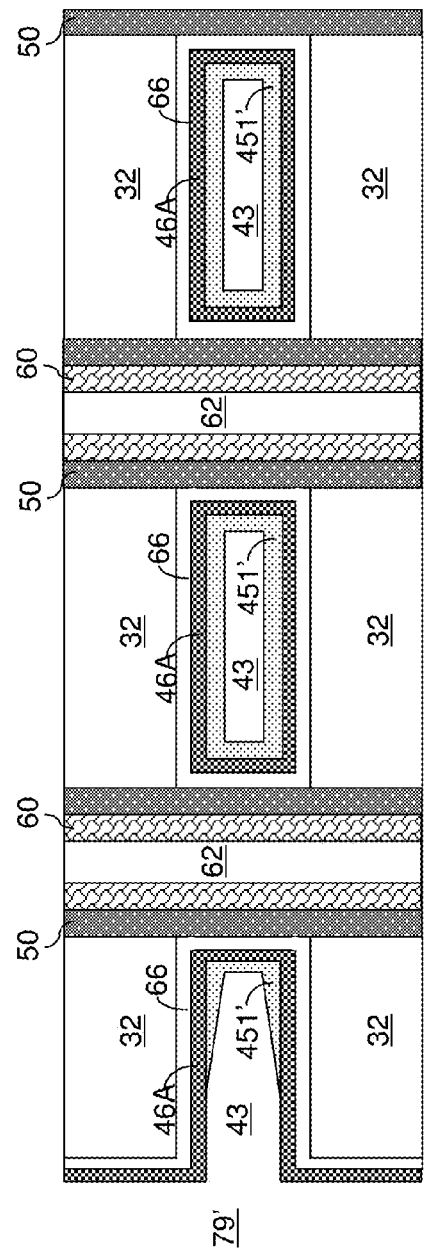
FIG. 17A
FIG. 17B

THREE-DIMENSIONAL MEMORY DEVICE CONTAINING COMPOSITE WORD LINES INCLUDING A METAL SILICIDE AND AN ELEMENTAL METAL AND METHOD OF MAKING THEREOF

CROSS REFERENCE TO RELATED APPLICATION

This application is a continuation-in-part (CIP) application of PCT Application PCT/US16/49496 filed on Aug. 30, 2016, which claims the benefit of priority from U.S. Provisional Application Ser. No. 62/247,839, filed Oct. 29, 2015 and which is a continuation of U.S. Non-Provisional application Ser. No. 15/086,702, filed Mar. 31, 2016, the entire contents of the foregoing applications are incorporated herein by reference.

FIELD

The present disclosure relates generally to the field of semiconductor devices and specifically to metal word lines of three-dimensional semiconductor devices, such as vertical NAND strings, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a semiconductor device comprises forming an alternating stack of insulating layers and sacrificial material layers over a substrate, forming a plurality of memory openings through the stack, forming memory stack structures in the plurality of memory openings, each of the memory stack structures comprising, from outside to inside, a memory material layer, a tunneling dielectric layer, and a semiconductor channel, forming a backside via trench through the alternating stack, forming backside recesses by removing the sacrificial material layers selective to the insulating layers employing an etchant introduced through the backside via trench, depositing a silicon-containing layer in the backside recesses, and forming a metal silicide layer and a metal portion in the backside recesses after depositing the silicon-containing layer.

According to another aspect of the present disclosure, a three-dimensional memory device is provided, which comprises an alternating stack of insulating layers and electrically conductive layers and located over a substrate, and a memory stack structure extending through the alternating stack and comprising, from outside to inside, a memory material layer, a tunneling dielectric layer, and a vertical semiconductor channel. Each of the electrically conductive layers comprises a metal silicide layer, and a metal portion contacting horizontal surfaces and an outer sidewall of the metal silicide layer.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

FIGS. 16A and 16B are sequential vertical cross-sectional views of the exemplary structure during formation of seventh exemplary electrically conductive layers according to a seventh embodiment of the present disclosure.

FIGS. 17A-17E are sequential vertical cross-sectional views of a region around a pair of memory stack structures during formation of the seventh exemplary electrically conductive layers according to the seventh embodiment of the present disclosure.

DETAILED DESCRIPTION

Figure 1:
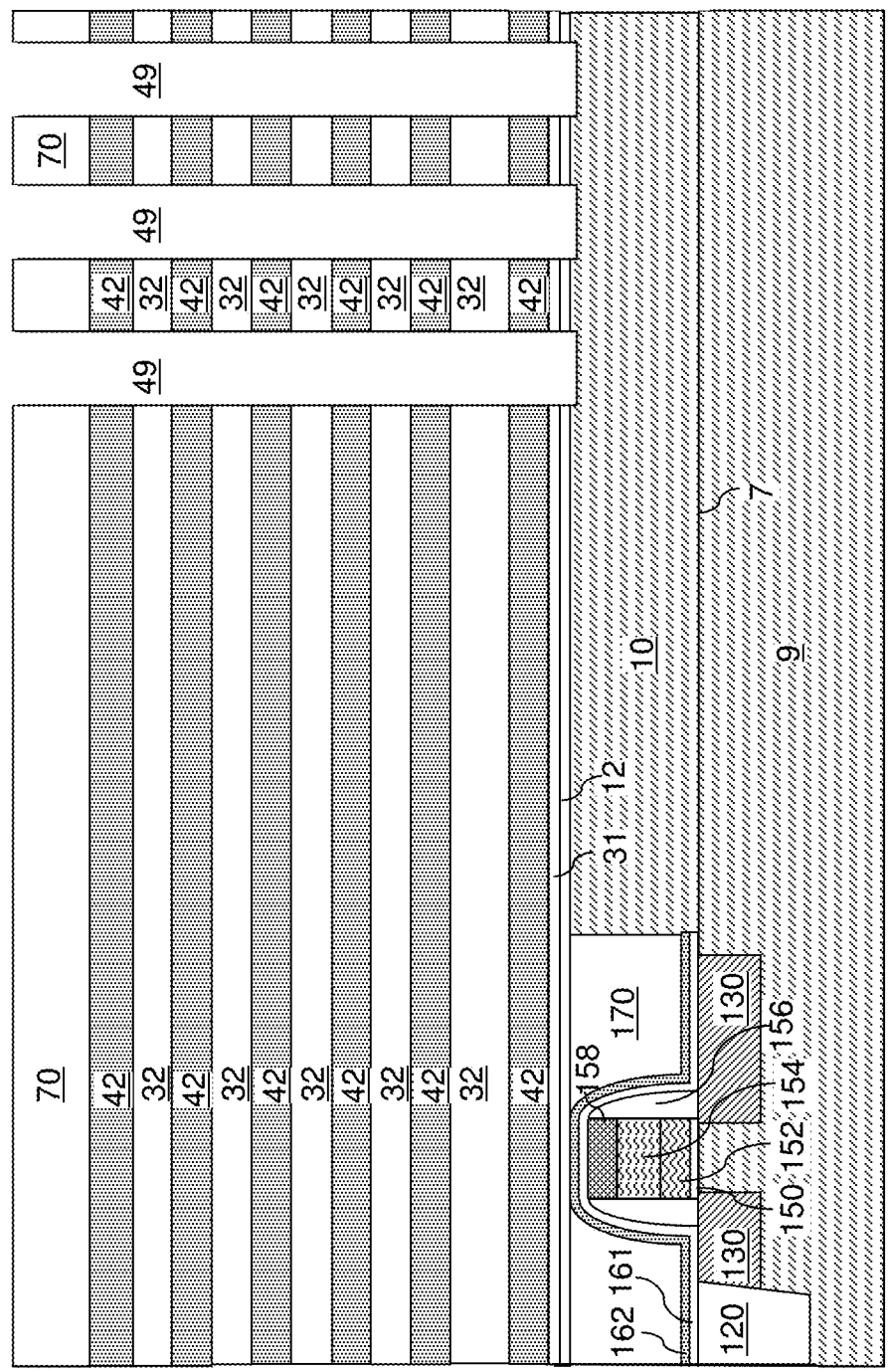
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The present inventors realized that fluorine present in metal line structures can diffuse during manufacture or operation of a semiconductor device to cause various performance and reliability issues such as fluorine-induced electrical shorts. For example, fluorine present in word lines of a three-dimensional memory device can diffuse to a dielectric material such as silicon oxide and cause voids, which can be filled with electromigrated or diffused materials to generate electrical shorts. Therefore, embodiments of the present disclosure provide at least one fluorine-free word line layer in the memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material (e.g., single crystal silicon wafer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor (e.g., silicon) surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional doped well layer 10 can be formed on the top surface of the substrate semiconductor layer 9 by deposition of a single crystalline semiconductor material, for example, single crystal silicon, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the doped well layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the doped well layer 10 can have a top surface that is coplanar with the top surface of the planarization dielectric layer 170.

Optionally, a dielectric pad layer 12 can be formed above the doped well layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes. Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the select gate electrodes.

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the doped well layer 10 within the substrate between the lower select gate electrodes. In one embodiment, an overetch into the doped well layer 10 may be optionally performed after the top surface of the doped well layer 10 is physically exposed at a bottom of each memory opening 49. The overetch may be performed prior to, or after, removal of the lithographic material stack. In other words, the recessed surfaces of the doped well layer 10 may be vertically offset from the undressed top surfaces of the doped well layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the doped well layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the doped well layer 10 collectively constitutes a substrate (9, 10), which can be a semiconductor substrate. Alternatively, the doped well layer 10 may be omitted, and the memory openings 49 can be extend to a top surface of or into the substrate semiconductor layer 9.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the dielectric cap layer 31, the dielectric pad layer 12, and optionally into an upper portion of the doped well layer 10. The recess depth of the bottom surface of each memory opening with respect to the top surface of the doped well layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the doped well layer 10. In one embodiment, the epitaxial channel portion 11 can be doped with electrical dopants of the same conductivity type as the doped well layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one optional blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506l, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a continuous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the optional second blocking dielectric 503, and the optional first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2E:
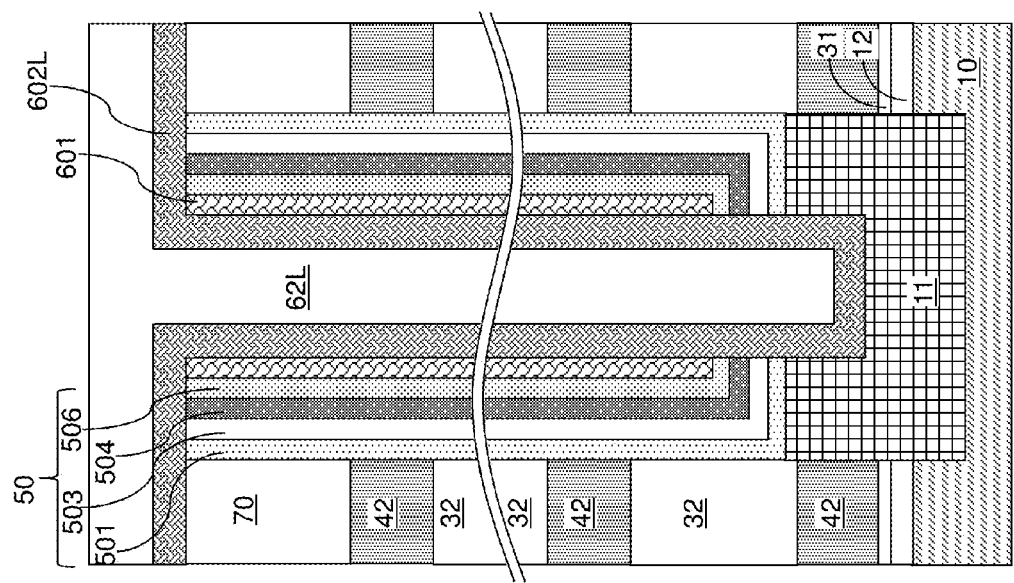

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2F:
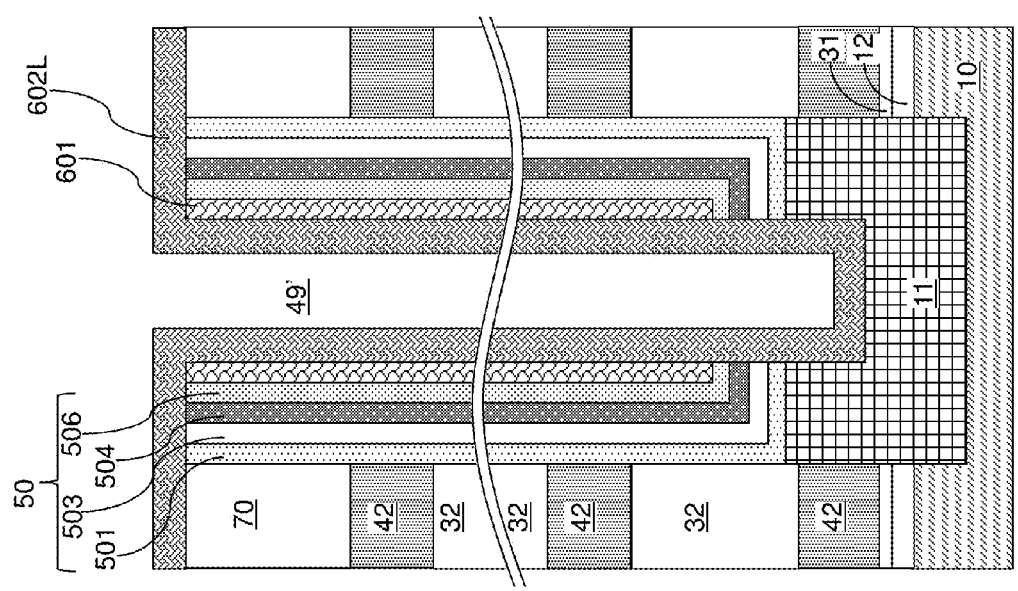

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a charge storage element 504, and laterally surrounds a portion of the semiconductor channel 60. Each adjoining set of an optional first blocking dielectric 501, an optional second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
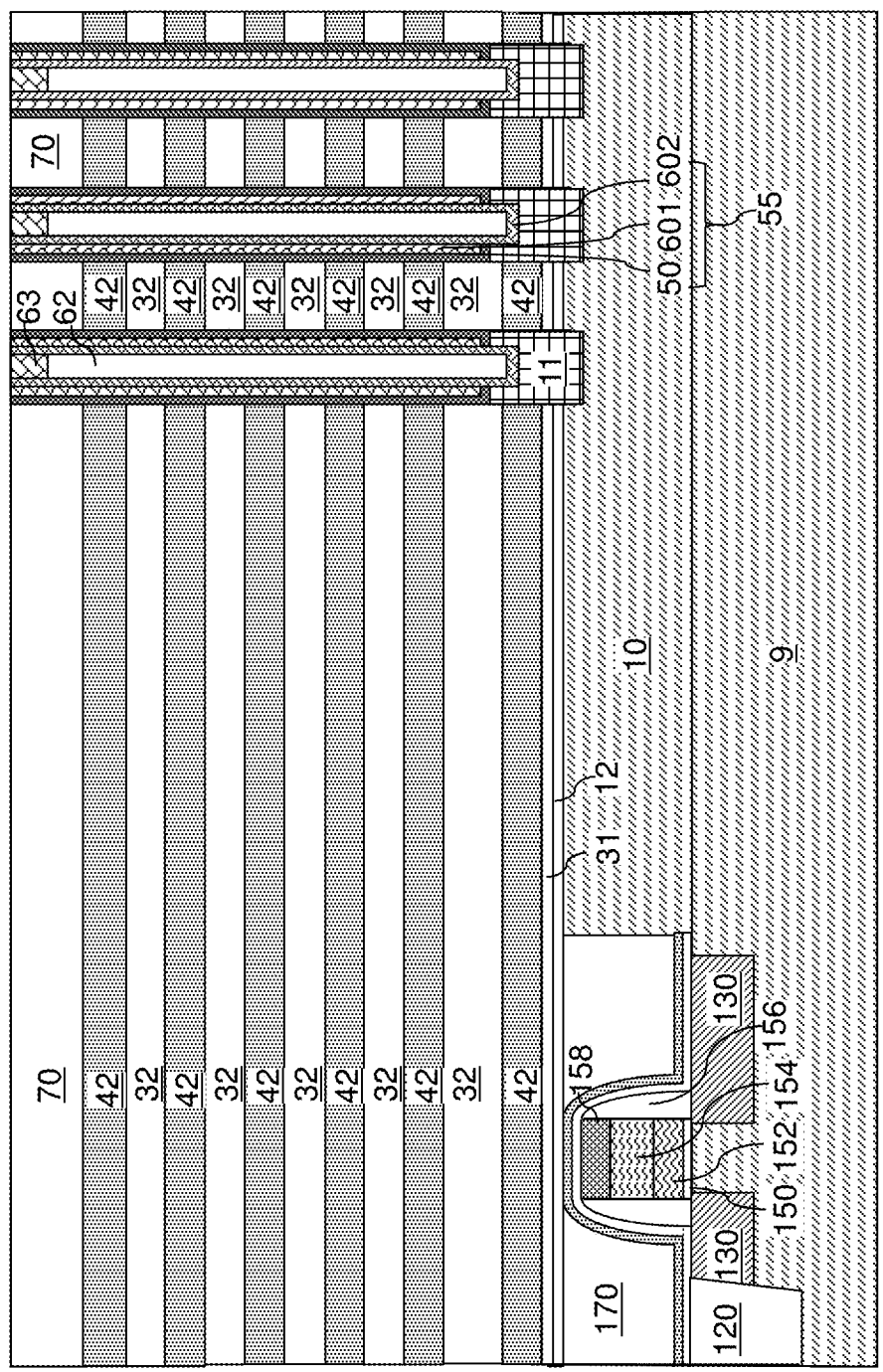
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2H. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a memory film 50 and semiconductor channel 60 vertically extending from a bottommost layer (e.g., the bottommost sacrificial material layer 42) of the stack to a topmost layer (e.g., the topmost sacrificial material layer 42) of the stack. The memory film 50 contacts a sidewall of the memory opening 49 and the semiconductor channel 60 contacts the epitaxial channel portion 11 (or the doped well layer 10 if channel portion 11 is omitted).

Figure 4:
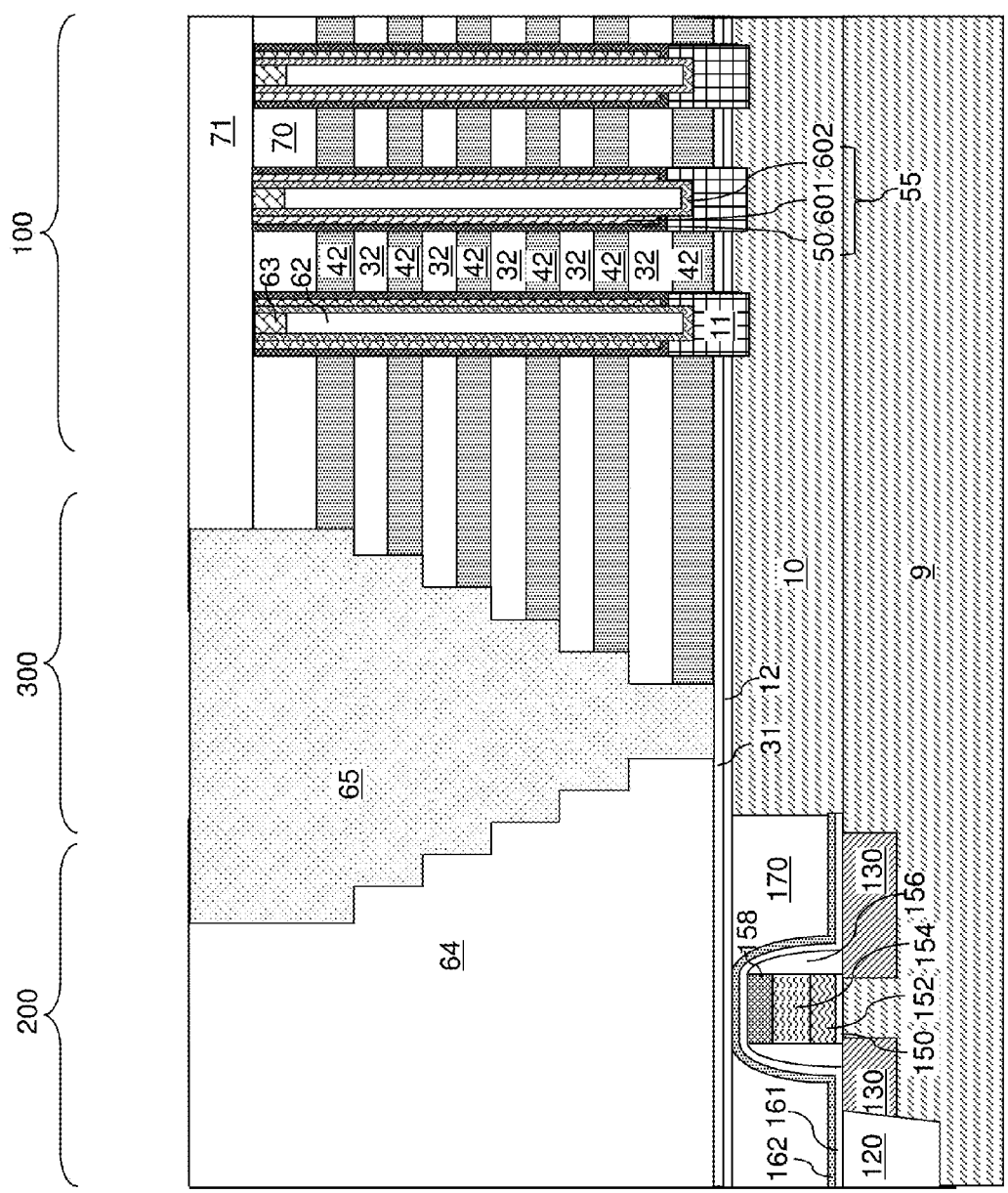
FIG. 4 is a vertical cross-sectional view of the exemplary structure after formation of a stepped terrace and a retro-stepped dielectric material portion according to an embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100. The device region 100 includes an array of memory stack structures 55 each of which contains a memory film 50 and a semiconductor channel 60. Subsequently, the trench can optionally be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes an optional dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity may be formed only in the exposed edge of the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. In an alternative method, the steps in the stack (32, 42) and the retro-stepped dielectric material portion 65 may be formed before forming the memory openings 49 and the memory stack structures 55 (e.g., prior to the steps shown in FIGS. 1-3).

Figure 5A:
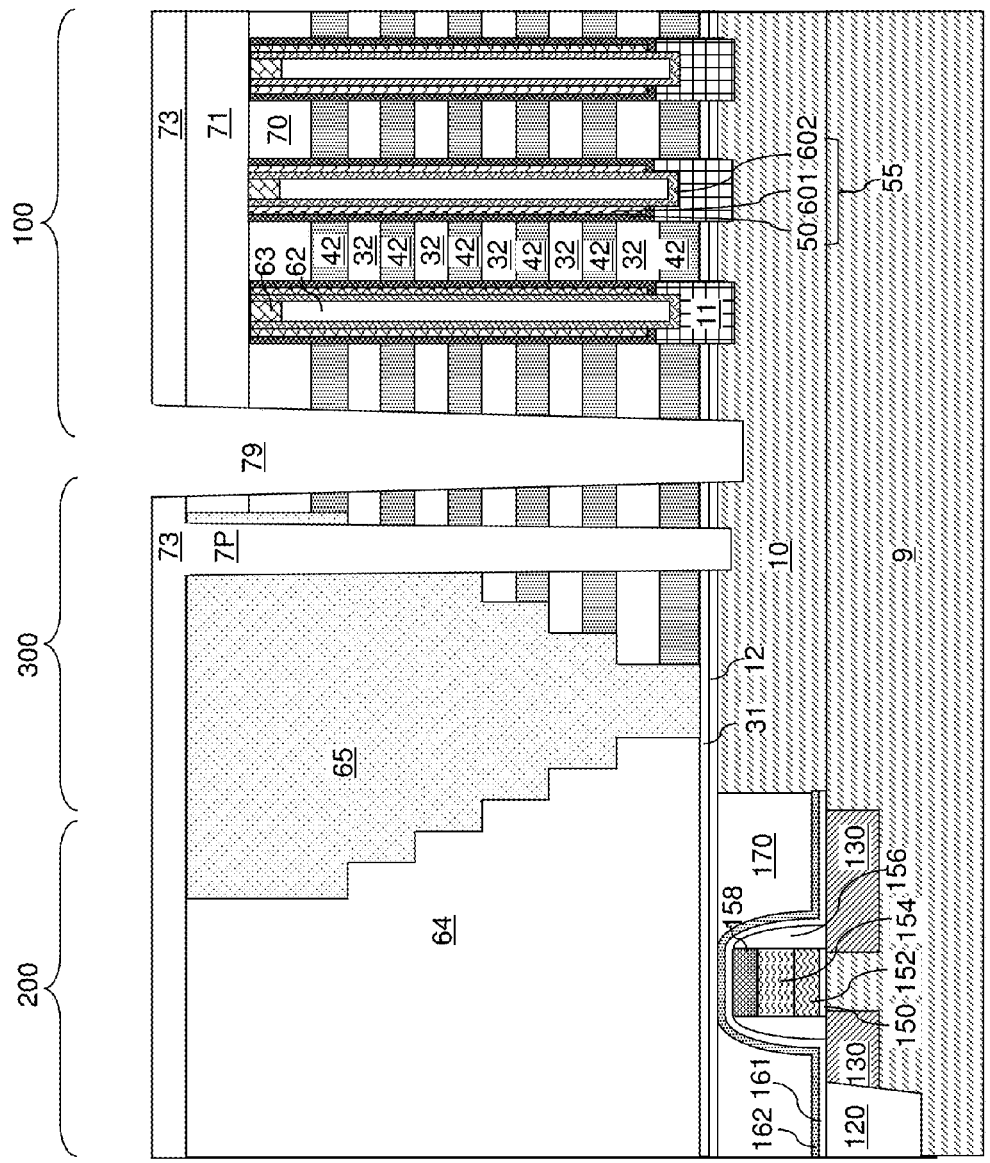
FIG. 5A is a vertical cross-sectional view of the exemplary structure after formation of a backside via trench according to an embodiment of the present disclosure.
Figure 5B:
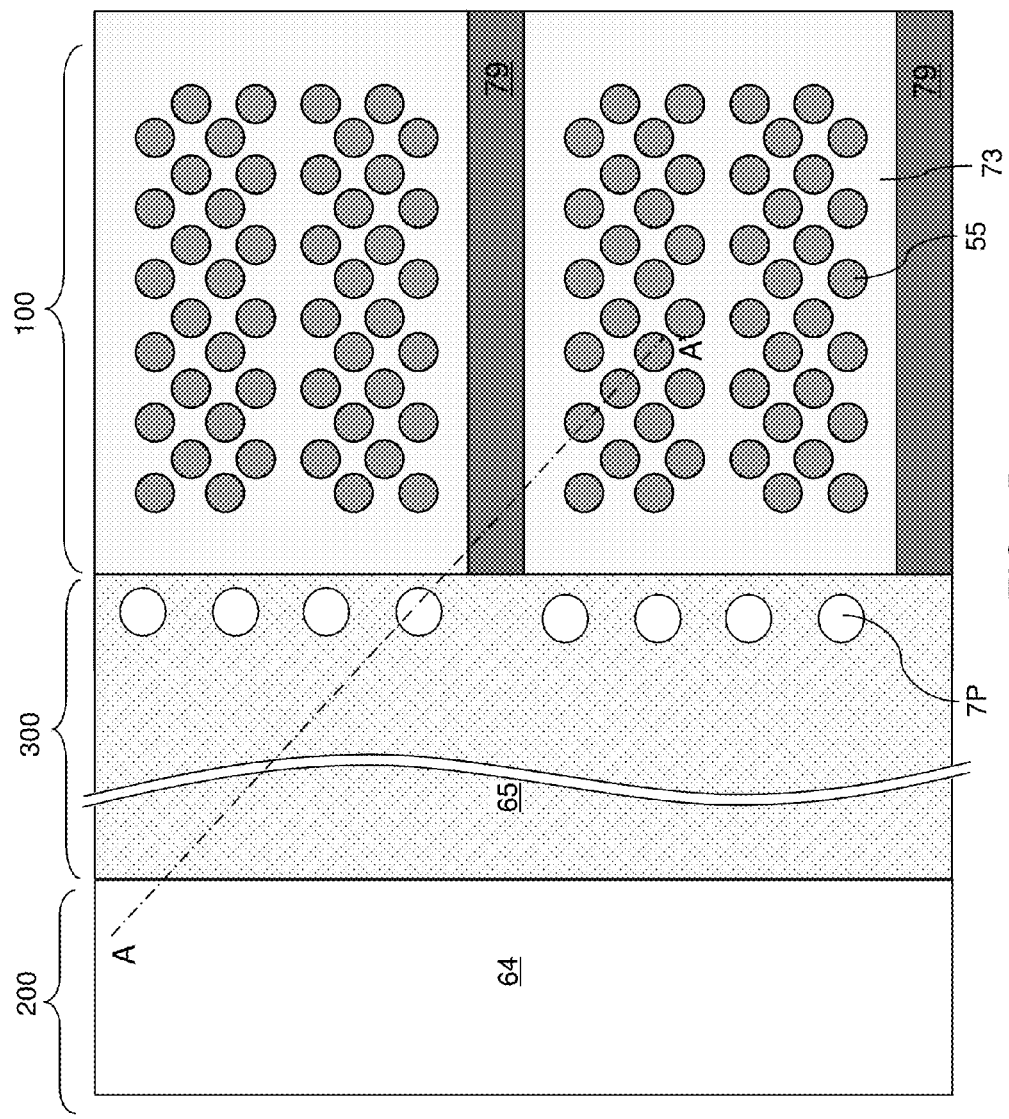
FIG. 5B is a partial see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single continuous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

A photoresist layer (not shown) can be applied over the alternating stack (32, 42) and/or the retro-stepped dielectric material portion 65, and optionally over the and lithographically patterned to form at least one backside via trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside via trench 79, which extends at least to the top surface of the substrate (9, 10). In one embodiment, the at least one backside via trench 79 can include a source contact opening in which a source contact via structure can be subsequently formed.

Figure 6:
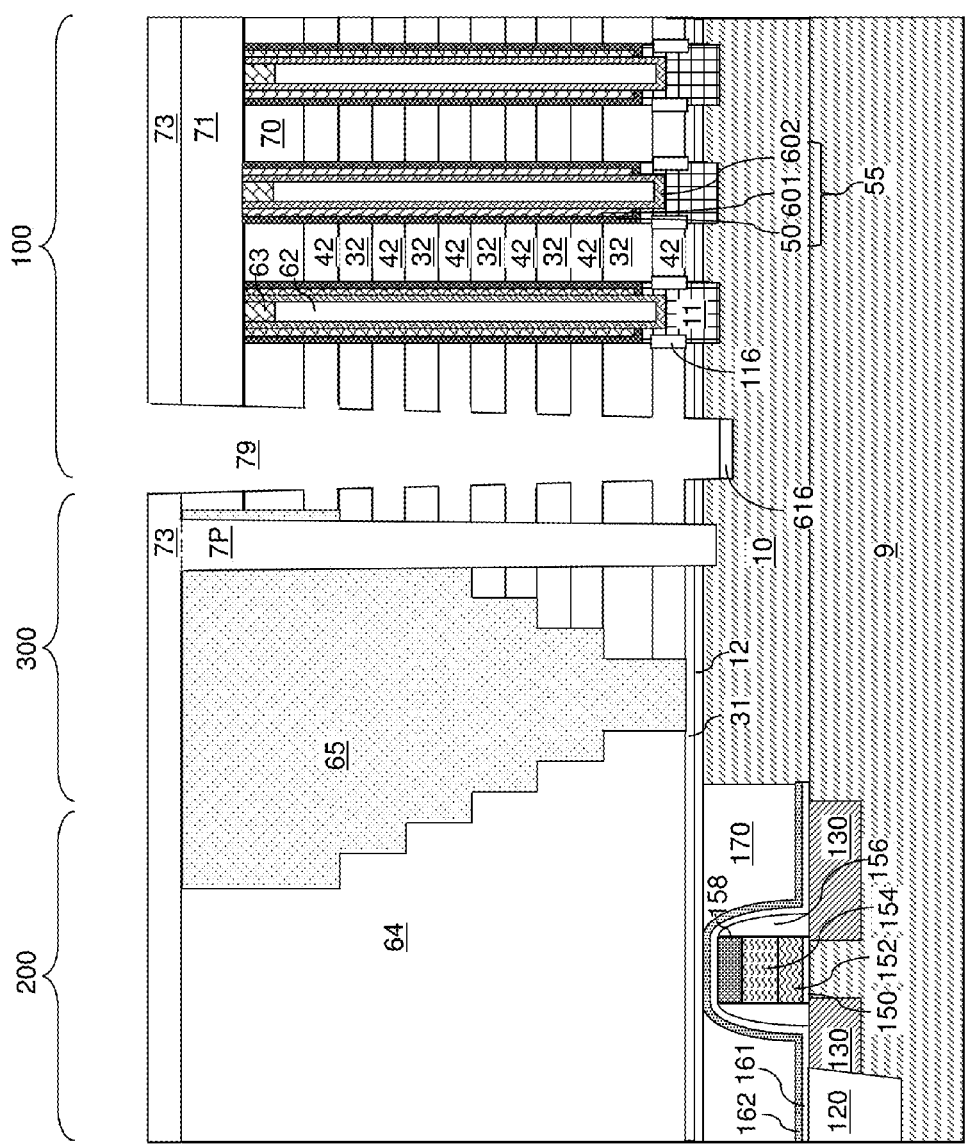
FIG. 6 is a vertical cross-sectional view of the exemplary structure after formation of backside recesses according to an embodiment of the present disclosure.

Referring to FIG. 6, an etchant that selectively etches the second material of the sacrificial material layers 42 with respect to the first material of the insulating layers 32 can be introduced into the at least one backside via trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the doped well layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside via trench 79 can be modified so that the bottommost surface of the at least one backside via trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside via trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the doped well layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the doped well layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the doped well region 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the doped well layer 10.

Figure 7:
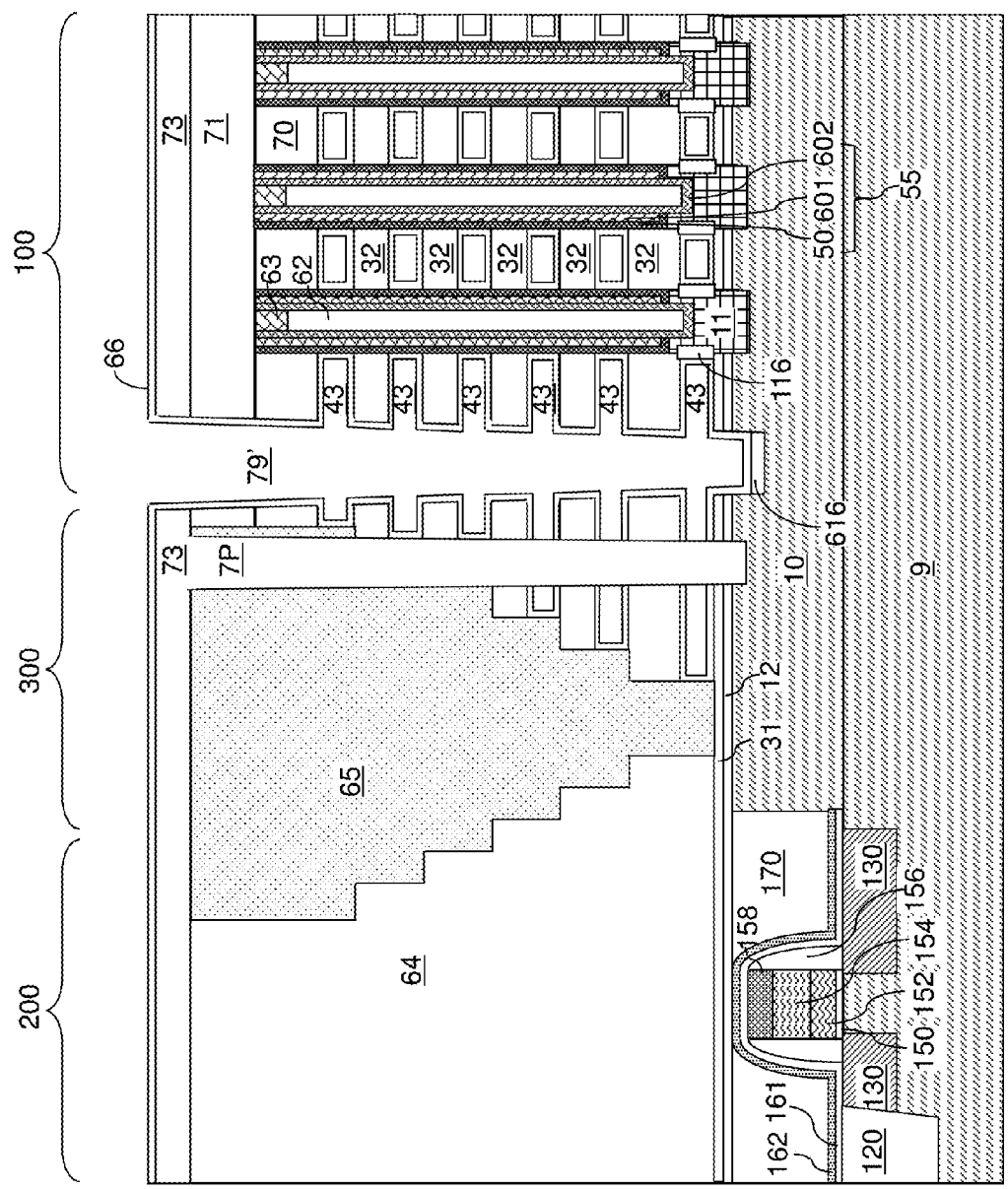
FIG. 7 is a vertical cross-sectional view of the exemplary structure after formation of a backside blocking dielectric layer according to an embodiment of the present disclosure.

Referring to FIG. 7, an optional backside blocking dielectric layer 66 can be optionally formed. If formed, the backside blocking dielectric layer 66 can be deposited on the physically exposed surfaces of the backside recesses 43, the backside via trench 79, and on the topmost layer of the exemplary structure (such as the second contact level dielectric layer 73. The backside blocking dielectric layer 66 comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The optional backside blocking dielectric layer 66 comprises a dielectric material such as a dielectric metal oxide, silicon oxide, silicon nitride, a nitrogen-including organosilicate glass, or a combination thereof. In one embodiment, the dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The optional backside blocking dielectric layer 66 can be formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the doped well layer 10 (if formed prior to formation of the backside blocking dielectric layer 66). A backside cavity 79' is present within the portion of each backside via trench 79 that is not filled with the backside blocking dielectric layer 66. The backside blocking dielectric layer 66 is an optional structure. While the present disclosure is described employing embodiments in which the optional backside blocking dielectric layer 66 is present, each embodiment described herein has a counterpart embodiment in which the optional backside blocking dielectric layer 66 is omitted. Such variations are expressly contemplated herein.

Figure 8:
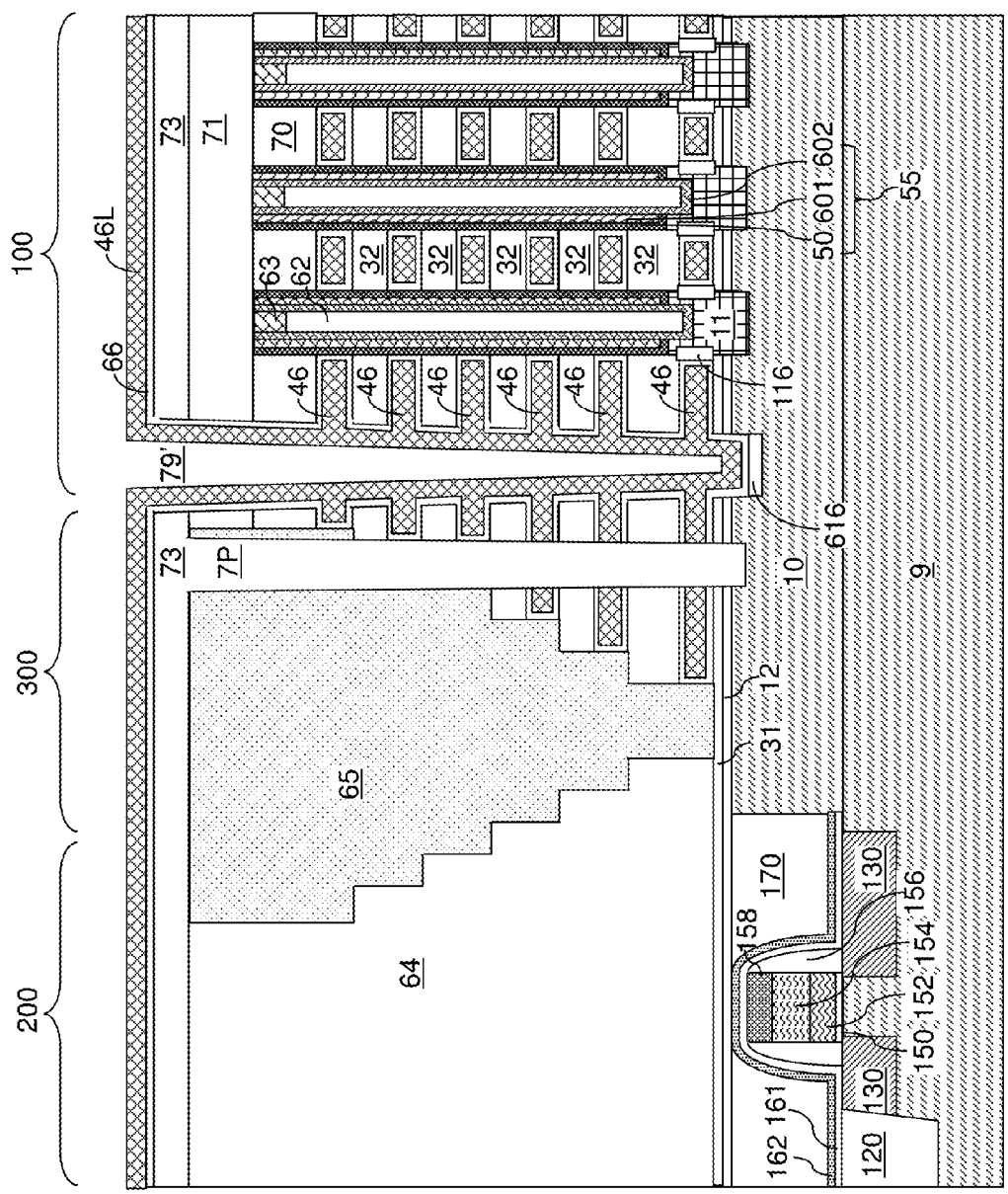
FIG. 8 is a vertical cross-sectional view of the backside recess region of the exemplary structure after formation of conductive material layers according to an embodiment of the present disclosure.

Referring to FIG. 8, at least one conductive material can be deposited in remaining volumes of the backside recesses 43, and in some embodiments, peripheral volumes of the backside via trench 79. Portions of the at least one conductive material deposited in the backside recesses 43 constitute electrically conductive layers 46. Depending on embodiments, additional portions of the at least one conductive material can be deposited in peripheral regions of the backside via cavity 79 and over the contact level dielectric layers (71, 73) to form a continuous conductive material layer 46L. In case the continuous conductive material layer 46L, an etch-back process can be performed to remove the continuous conductive material layer 46L from peripheral regions of the backside via cavity 79 and from above the contact level dielectric layers (71, 73) to provide a structure illustrated in FIG. 9. Alternatively, each electrically conductive layer 46 may be selectively deposited in the backside recesses 43 to form the structure of FIG. 9. In this case, the step shown in FIG. 8 may be omitted. Each electrically conductive layer 46 as provided at the processing step of FIG. 9 constitutes control gate electrodes for the memory stack structures 55. The electrically conductive layers 46 are formed at each level of the backside recesses 43 (i.e., at each level of the sacrificial material layers 42 of the alternating stack (32, 42) as originally provided). Each of the control gate electrodes comprises a portion of at least one tungsten layer.

Figure 9:
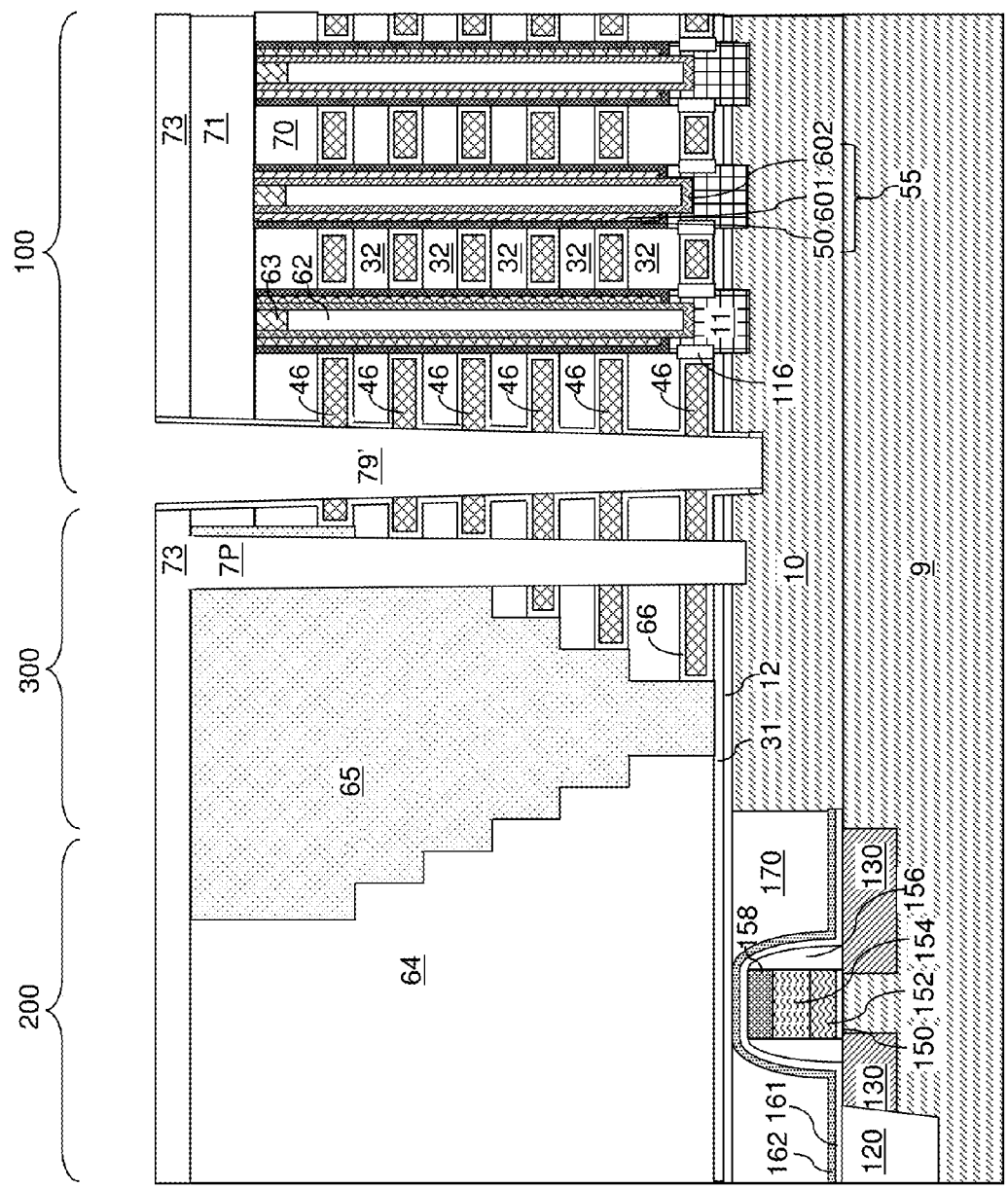
FIG. 9 is a vertical cross-sectional view of the exemplary structure after formation of electrically conductive layers by patterning the conductive material layers according to an embodiment of the present disclosure.

Various methods can be employed to form the electrically conductive layers 46 illustrated in FIGS. 8 and 9. Embodiments of the present disclosure for forming the electrically conductive layers 46 at the processing steps of FIGS. 8 and 9 are described below.

Figure 10A:
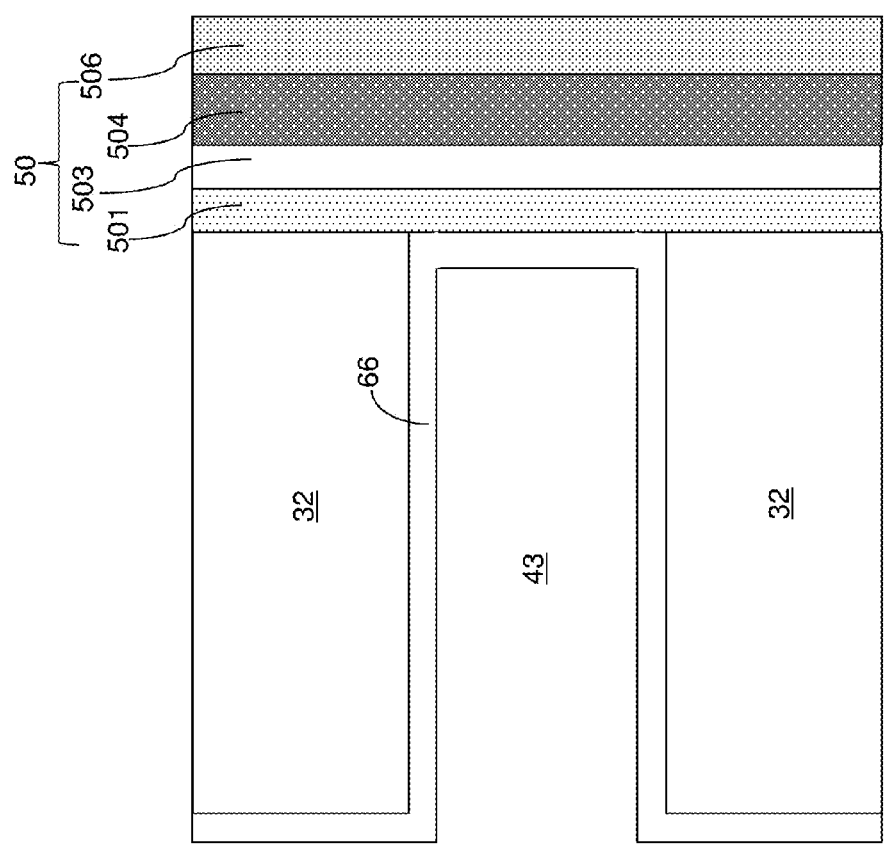
FIGS. 10A-10E are sequential vertical cross-sectional views of the exemplary structure during formation of first exemplary electrically conductive layers according to a first embodiment of the present disclosure.

FIGS. 10A-10E illustrate the process of formation of first exemplary electrically conductive layers according to a first embodiment of the present disclosure. Referring to FIG. 10A, a region including a backside recess 43 between a memory film 50 and a backside cavity 79' is illustrated after formation of the optional backside blocking dielectric layer 66, which corresponds to the processing step of FIG. 8.

Figure 10B:
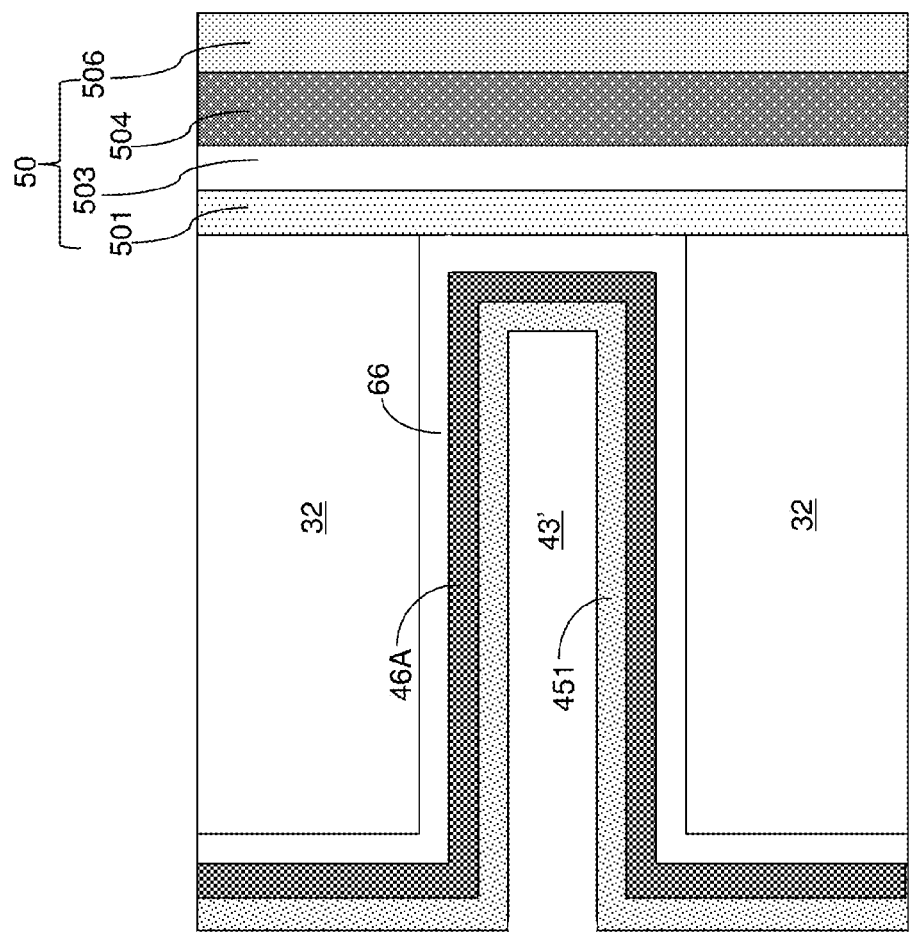

Referring to FIG. 10B, an optional conductive metal nitride layer 46A can be deposited in the backside recesses 43. The conductive metal nitride layer 46A includes a conductive metal nitride such as TiN, TaN, WN, or alloys or stacks thereof. The conductive metal nitride layer 46A can be formed by a conformal deposition process such as chemical vapor deposition or atomic layer deposition. The thickness of the optional conductive metal nitride layer 46A can be in a range from 1 nm to 4 nm, although lesser and greater thicknesses can also be employed.

A silicon nucleation layer 451 is deposited in the backside recesses 43. In one embodiment, the backside blocking dielectric layer 66 is present, the conductive metal nitride layer 46A is present, and the silicon nucleation layer 451 is deposited directly on the conductive metal nitride layer 46A. In another embodiment, the backside blocking dielectric layer 66 is present, the conductive metal nitride layer 46A is absent, and the silicon nucleation layer 451 is deposited directly on the backside blocking dielectric layer 66. In another embodiment, the backside blocking dielectric layer 66 is absent, the conductive metal nitride layer 46A is present, and the silicon nucleation layer 451 is deposited directly on the conductive metal nitride layer 46A. In another embodiment, the backside blocking dielectric layer 66 is absent, the conductive metal nitride layer 46A is absent, and the silicon nucleation layer 451 is deposited directly on the horizontal surfaces of the insulating layers 32 and portions of the outer sidewall of the memory film 50.

The silicon nucleation layer 451 includes undoped silicon or doped silicon. Thus, the silicon nucleation layer 451 can consist essentially of silicon atoms (in case undoped silicon is employed), or can consist essentially of silicon atoms and electrical dopant atoms, which may be p-type dopant atoms such as boron, or n-type dopant atoms such as P, As, and/or Sb. Alternatively, the nucleation layer 451 may comprise an alloy of silicon, such as silicon-germanium having at least 50 atomic percentage of silicon.

In one embodiment, the silicon nucleation layer 451 can be doped with electrical dopants, which can be p-type dopants or n-type dopants. The doping of the silicon nucleation layer 451 lowers the resistivity of the silicon nucleation layer 451. Preferably, the atomic concentration of p-type dopants or n-type dopants in the silicon nucleation layer 451 can be in a range from $1.0 \times 10^{20}/cm^3$ to $5.0 \times 10^{20}/cm^3$, although lesser and greater dopant concentrations can also be employed.

The silicon nucleation layer 451 can be formed by a conformal deposition process such as chemical vapor deposition or atomic layer deposition. For example, layer 451 may be formed using a disilane source. Disilane may be decomposed at a relatively low temperature of about 400 C.

or higher (e.g., 425 to 500 C., such as 450 to 475 C.) to deposit a silicon layer at a relatively high rate. Alternatively, other silicon deposition sources may also be used. The silicon nucleation layer 451 can include silicon atoms in an amorphous phase, i.e., can be an amorphous silicon layer. In one embodiment, the silicon nucleation layer 451 can be an amorphous silicon nucleation layer including at least two atomic monolayers of amorphous silicon. The thickness of the silicon nucleation layer 451 can be in a range from 1 to 15 nm, such as 3 nm to 10 nm, although lesser and greater thicknesses can also be employed. In case the silicon nucleation layer 451 is doped with electrical dopants, in-situ doping or ex-situ doping can be employed to introduce the electrical dopants into the silicon nucleation layer 451.

Figure 10C:
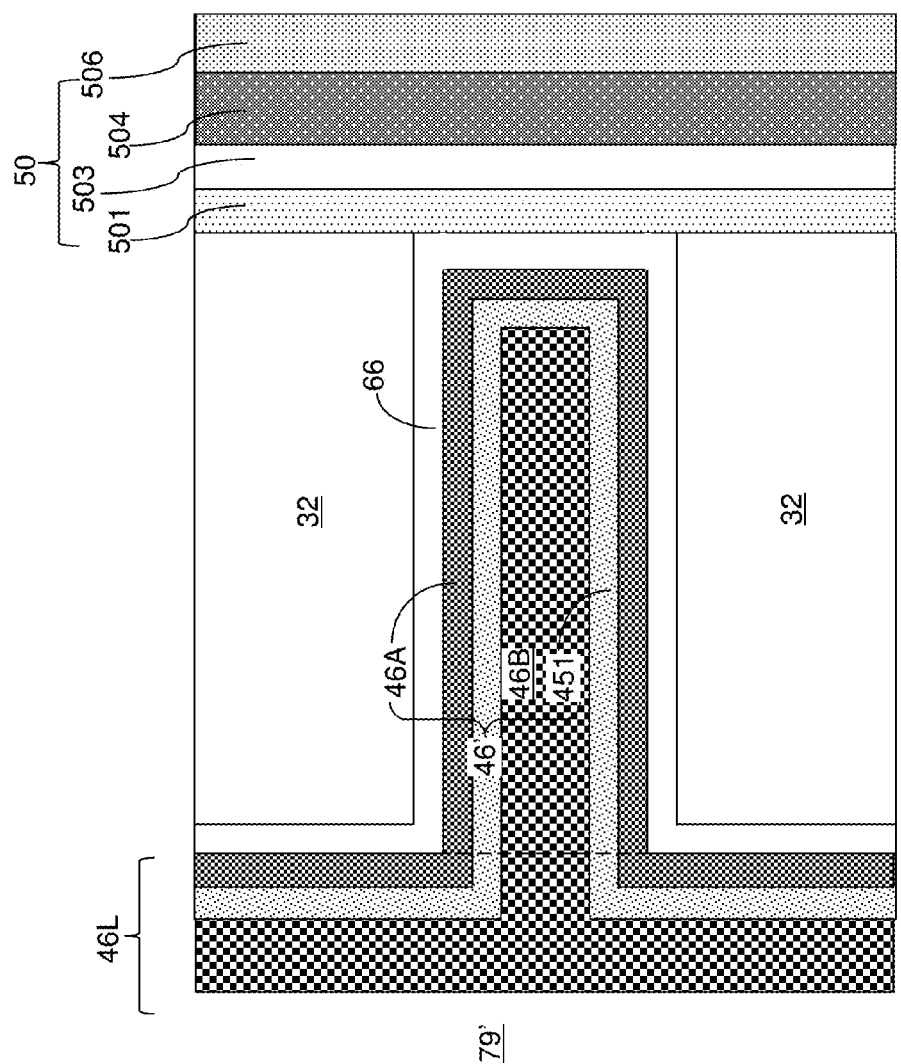

Referring to FIG. 10C, at least one tungsten layer 46B is deposited in the backside recesses 43 after deposition of the silicon nucleation layer 451. The silicon nucleation layer 451 provides a nucleation surface upon which the tungsten material of the at least one tungsten layer 46B nucleates. The at least one tungsten layer 46B may be deposited employing a fluorine-free precursor gas, or may be deposited employing a fluorine-containing precursor gas. The at least one tungsten layer 46B may consist of a single tungsten layer having a same composition, or can include two or more tungsten layers having different compositions of impurities (such as fluorine). The at least one tungsten layer 46B can be formed by at least one conformal deposition process, which may include a chemical vapor deposition process and/or an atomic layer deposition process.

In one embodiment, the at least one tungsten layer 46B can comprise a fluorine-free tungsten layer having a fluorine concentration less than 1.0 parts per million (p.p.m.) in atomic concentration. As used herein, an element is "fluorine-free" if the atomic concentration of fluorine is zero or at a trace level, i.e., below 1.0 p.p.m.

In this case, a portion, or all, of the at least one tungsten layer 46B can be formed employing at least one fluorine-free tungsten deposition process, i.e., at least one deposition process that deposits fluorine-free tungsten. In one embodiment, the deposition process can employ only fluorine-free materials for one or more reactants (precursor gases) and one or more additional optional agents (such as a reduction agent). The reduction agent can be a hydrogen-containing gas such as hydrogen, silane, diborane, or a combination thereof. The reduction agent can be a fluorine-free gas.

In one embodiment, the fluorine-free tungsten deposition process can be a chemical vapor deposition process or an atomic layer deposition process in which a fluorine-free tungsten precursor gas and a reduction agent gas are concurrently or alternately flowed into a process chamber in which the substrate is disposed. In one embodiment, the at least one fluorine-free tungsten deposition process comprises an atomic layer deposition process in which a fluorine-free tungsten precursor gas and a reduction gas are alternately flowed into a process chamber in which the substrate is disposed. In another embodiment, the at least one fluorine-free tungsten deposition process comprises a chemical vapor deposition process in which a fluorine-free tungsten precursor gas and a reduction gas are simultaneously flowed into a process chamber in which the substrate is disposed.

In one embodiment, the fluorine-free tungsten precursor gas can be selected from tungsten chloride precursor gases and organometallic precursor gases including a tungsten atom. For example, the fluorine-free tungsten deposition process can be an atomic layer deposition process or a chemical vapor deposition process employing, as a fluorine-free metal precursor gas (i.e., a fluorine-free tungsten precursor gas), a gas selected from $WCl_6$, $W(CH_3)_6$, tungsten carbonyl, $WCl_2(Nt-Bu)_2py_2$, $W(Nt-Bu)_2Cl\{(Ni—Pr)_2CNi—Pr_2\}$, $W(Nt-Bu)_2Cl\{(Ni—Pr)_2CNMe_2\}$, $W(Nt-Bu)_2Cl\{(Ni—Pr)_2CNEt_2\}$, $W(Nt-Bu)_2Cl\{(NCy)_2CNEt_2\}$, $W(Nt-Bu)_2NMe_2\{(Ni—Pr)_2CNi—Pr_2\}$, $W(Nt-Bu)_2(NMe_2)\{(Ni—Pr)_2CNMe_2\}$, $W(Nt-Bu)_2(N_3)\{(Ni—Pr)_2CNi—Pr_2\}$, $W(Nt-Bu)_2\{(Ni—Pr)_2CNMe_2\}$, $[W(Nt-Bu)_2Cl\{NC(NMe_2)_2\}]_2$, $W(Nt-Bu)_2(N_3)\{NC(NMe_2)_2\}_2$, and $[(W(Nt-Bu)_2(N_3)(\mu_2-N_3)py)]_2$. In one embodiment, the at least one tungsten layer 46B can consist of a single fluorine-free tungsten layer.

The portions of the optional conductive metal nitride layer 46A, the silicon nucleation layer 451, and the at least one tungsten layer 46B located at each level of the backside recesses 43 (i.e., at each level of the sacrificial material layers 42 prior to removal of the sacrificial material layers 42) constitutes an electrically conductive layer 46 illustrated in FIG. 8. The portions of the optional conductive metal nitride layer 46A, the silicon nucleation layer 451, and the at least one tungsten layer 46B located within the backside via cavity 79 and over the contact level dielectric layers (71, 73) constitute the continuous conductive material layer 46L illustrated in FIG. 8.

Figure 10D:
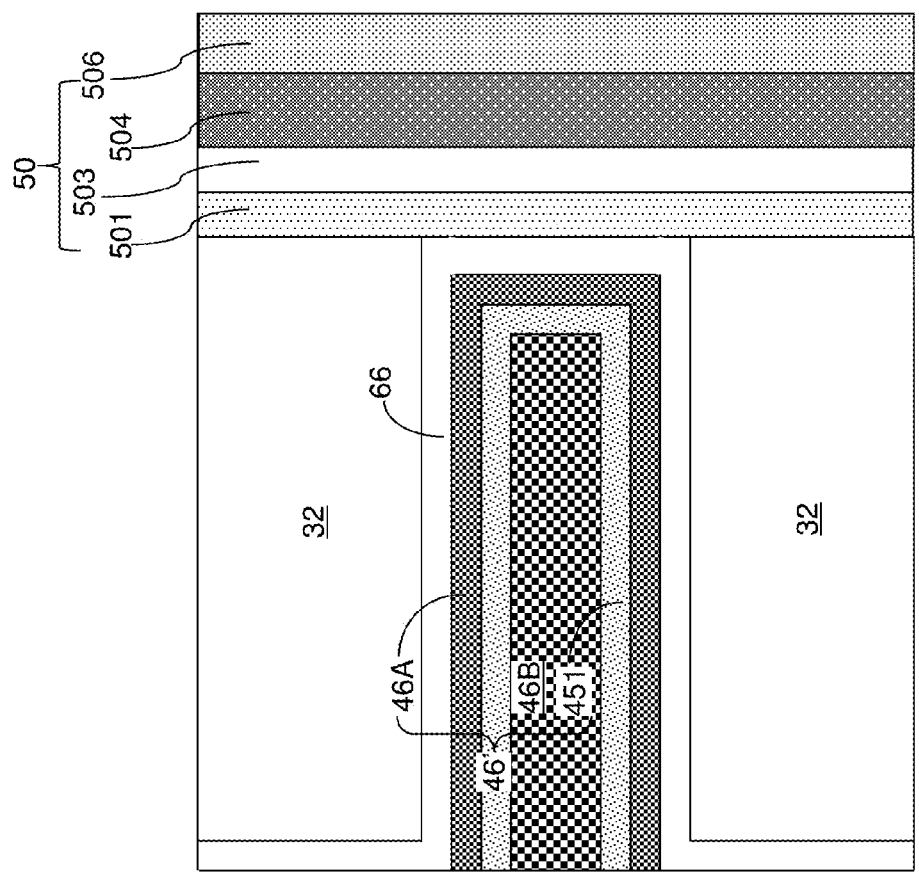

Upon removal of the continuous conductive material layer 46L from within the backside via cavity 79 and from above the contact level dielectric layers (71, 73), the structure illustrated in FIG. 10D can be formed. The silicon nucleation layer 451 is a silicon-containing-material layer, i.e., a layer of a silicon-containing material (a material that includes silicon atoms).

Figure 10E:
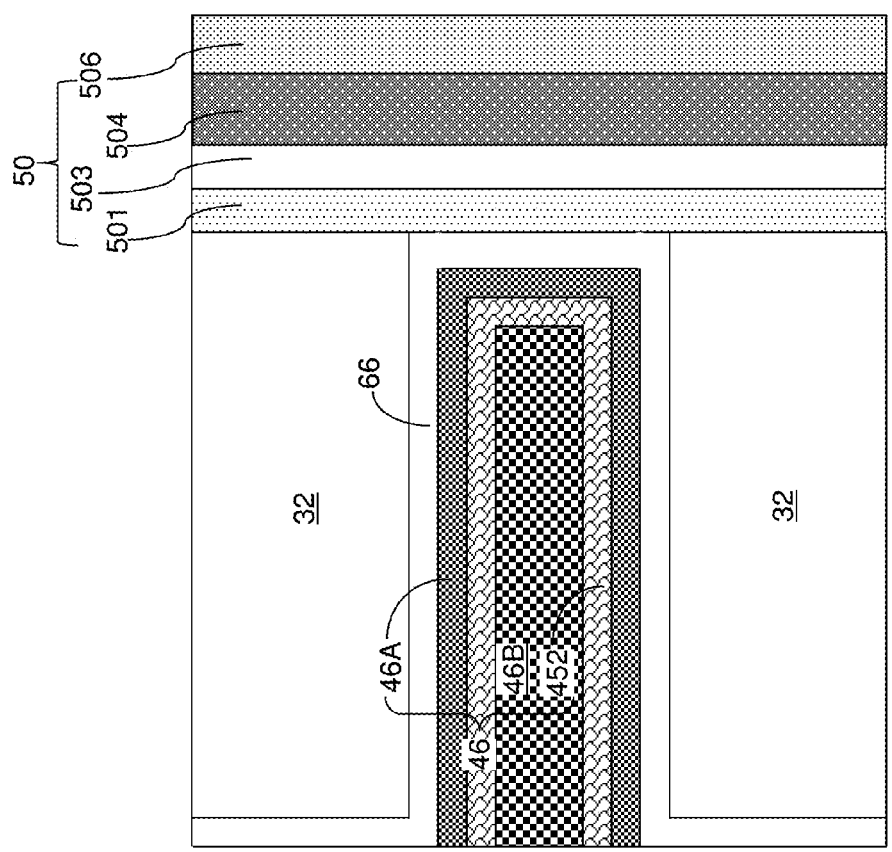

Referring to FIG. 10E, a thermal anneal at a temperature greater than 525 degrees Celsius can be performed, after, or prior to, removing the continuous conductive material layer 46L. In one embodiment, the temperature of the thermal anneal can be below a temperature range that induces formation of tungsten silicide. The silicon nucleation layer 451 including amorphous silicon can be converted into a polycrystalline silicon nucleation layer 452, which is a silicon nucleation layer having a polycrystalline phase. Thus, the polycrystalline silicon nucleation layer 452 can include undoped polysilicon or doped polysilicon or doped or undoped polycrystalline silicon-germanium. The polycrystalline silicon nucleation layer 452 is a silicon-containing-material layer.

Figure 10F:
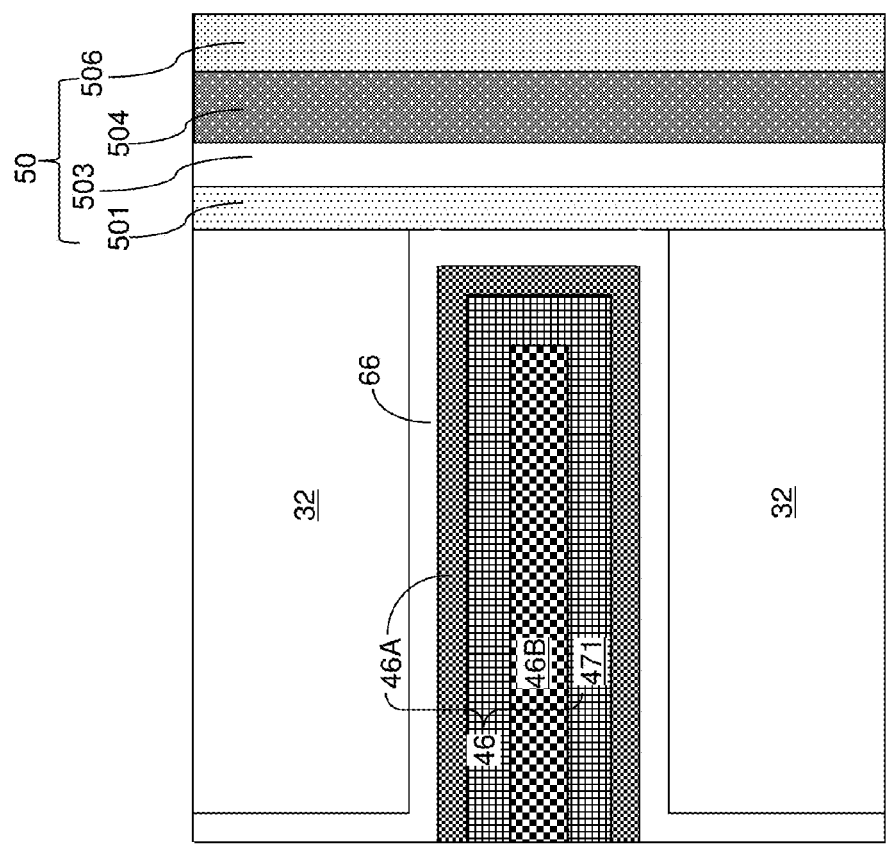
FIGS. 10F and 10G are variations of the first exemplary electrically conductive layers according to the first embodiment of the present disclosure.

Referring to FIG. 10F, a first variation of the first exemplary electrically conductive layer 46 is illustrated, which may be derived from the first exemplary electrically conductive layer 46 of FIG. 10C, 10D, or 10E by performing a thermal anneal at a temperature that induces formation of tungsten silicide by reaction of silicon in the silicon nucleation layer 451 (or the polycrystalline silicon nucleation layer 452) and the at least one tungsten layer 46B. The temperature and the duration of the anneal process is selected such that the entirety of the silicon nucleation layer 451 (or the polycrystalline silicon nucleation layer 452) reacts with the at least one tungsten layer 46B, and is converted into a tungsten silicide layer 471. The tungsten silicide layer 471 is a silicon-containing-material layer.

Figure 10G:
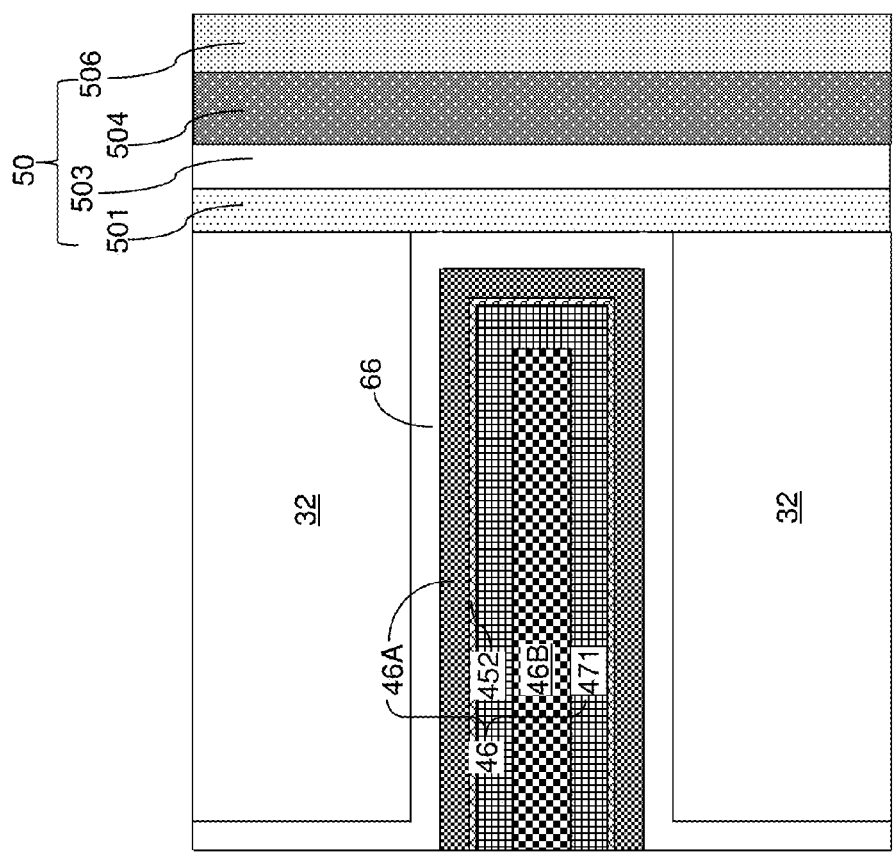

Referring to FIG. 10G, a second variation of the first exemplary electrically conductive layer 46 is illustrated, which may be derived from the first exemplary electrically conductive layer 46 of FIG. 10C, 10D, or 10E by performing a thermal anneal at a temperature that induces formation of tungsten silicide by reaction of silicon in the silicon nucleation layer 451 (or the polycrystalline silicon nucleation layer 452) and the at least one tungsten layer 46B. The temperature and the duration of the anneal process is selected such that only a portion of the silicon nucleation layer 451 (or the polycrystalline silicon nucleation layer 452) reacts with the at least one tungsten layer 46B, and is converted into a tungsten silicide layer 471, while leaving an unreacted portion of the silicon nucleation layer 451 (or the polycrystalline silicon nucleation layer 452) that becomes a polycrystalline silicon nucleation layer 452 contacting the tungsten silicide layer 471. The polycrystalline silicon nucleation layer 452 and the tungsten silicide layer 471 are silicon-containing-material layers.

Figure 11A:
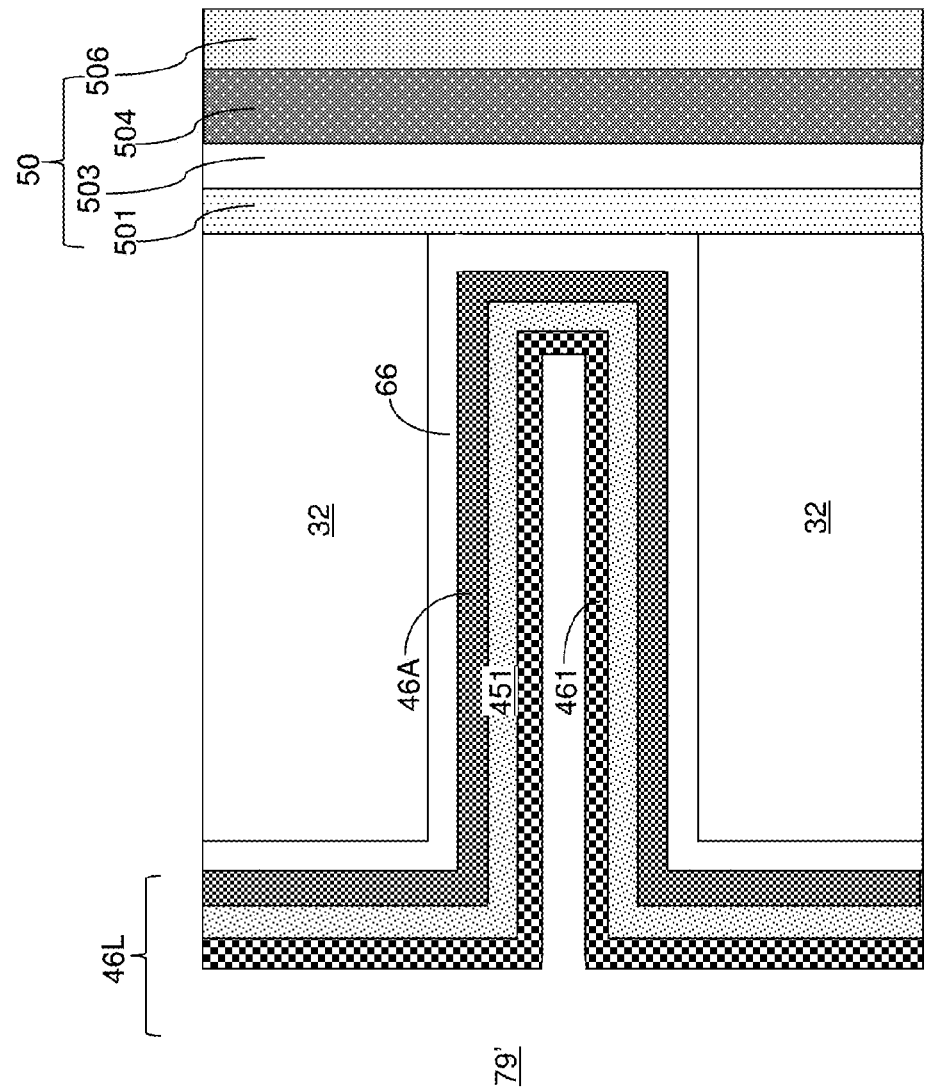
FIGS. 11A-11C are sequential vertical cross-sectional views of the exemplary structure during formation of second exemplary electrically conductive layers according to a second embodiment of the present disclosure.

Referring to FIG. 11A, second exemplary electrically conductive layers according to a second embodiment of the present disclosure can be formed by depositing multiple tungsten layers on the silicon nucleation layer 451. Specifically, a first tungsten layer 461 can be deposited directly on the silicon nucleation layer 451 in the structure illustrated in FIG. 10B. The first tungsten layer 461 can be a fluorine-free tungsten layer including fluorine atoms at an atomic concentration less than 1.0 p.p.m., such as less than 0.1 p.p.m. The first tungsten layer 461 can be deposited employing a fluorine-free precursor gas described above.

Figure 11B:
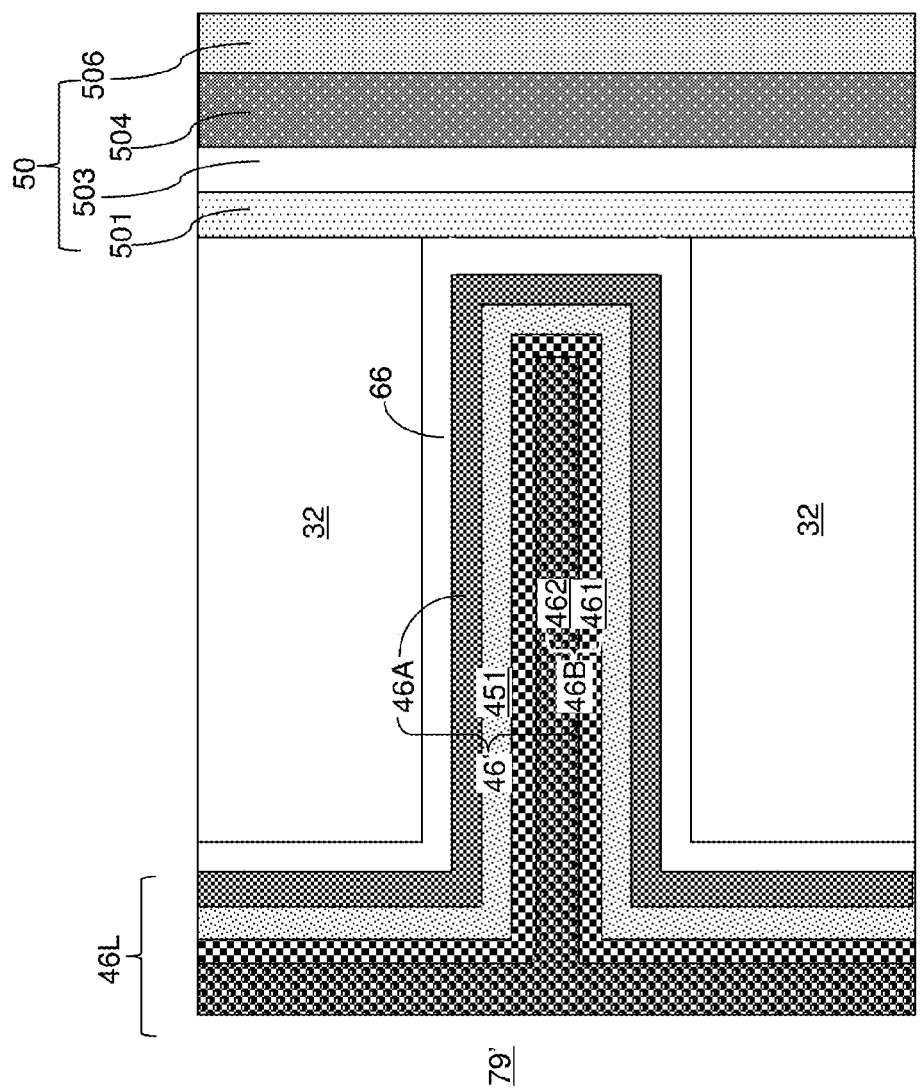

Referring to FIG. 11B, a second tungsten layer 462 can be deposited in remaining volumes of the backside recesses 43 by another conformal deposition. The second tungsten layer 462 can include fluorine at an atomic concentration greater than 3 p.p.m., and can be formed by a conformal tungsten deposition process employing a fluorine-containing tungsten precursor gas, such as $WF_6$, and a reduction agent, such as hydrogen. A continuous conductive material layer 46L is formed in the backside via trench 79 and over the contact level dielectric layers (71, 73), and an electrically conductive layer 46 is formed within each backside recess 43. In this case, the at least one tungsten layer 46B can comprise the first tungsten layer 461 having a fluorine concentration less than 1.0 parts per million, and a second tungsten layer 462 having a fluorine concentration greater than 3.0 parts per million and spaced from the memory stack structures by the first tungsten layer 461.

Figure 11C:
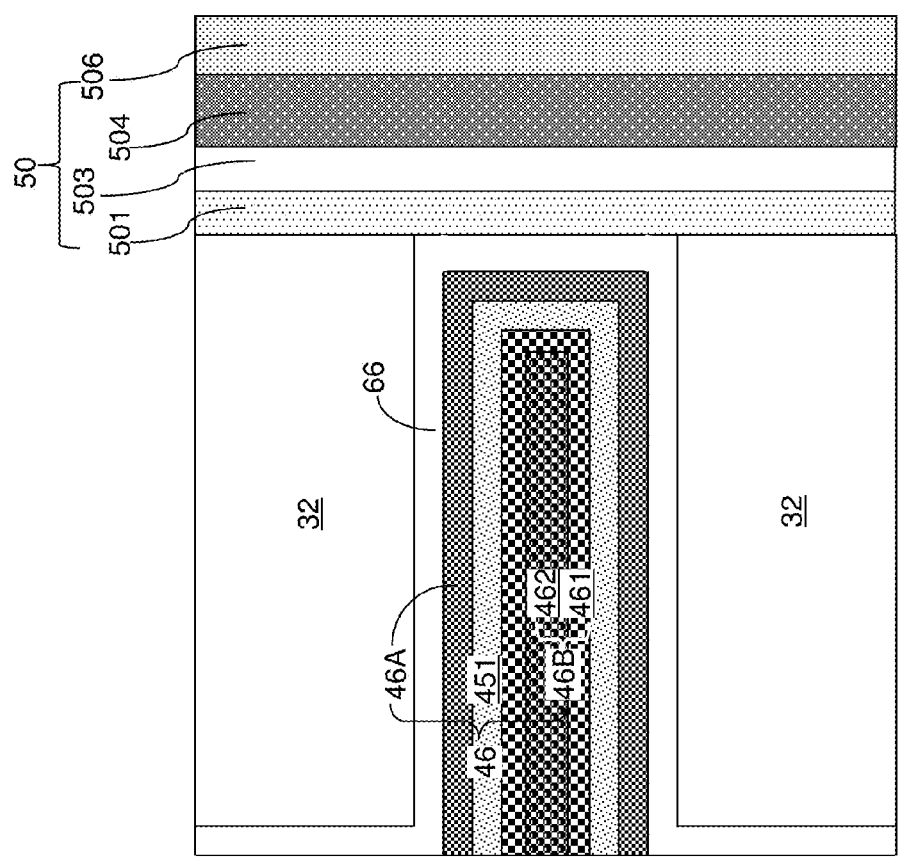

Referring to FIG. 11C, the continuous conductive material layer 46L can be removed from the periphery of the backside via trench 79 and from above the contact level dielectric layers (71, 73) by a recess etch, which may be an isotropic etch or an anisotropic etch. Optionally, the silicon nucleation layer 451 may be annealed to be converted into a polycrystalline silicon nucleation layer 452. The silicon nucleation layer 451 is a silicon-containing-material layer. Alternatively, a polycrystalline silicon nucleation layer 451 may be formed in lieu of the silicon nucleation layer 451 by a thermal anneal.

Figure 12A:
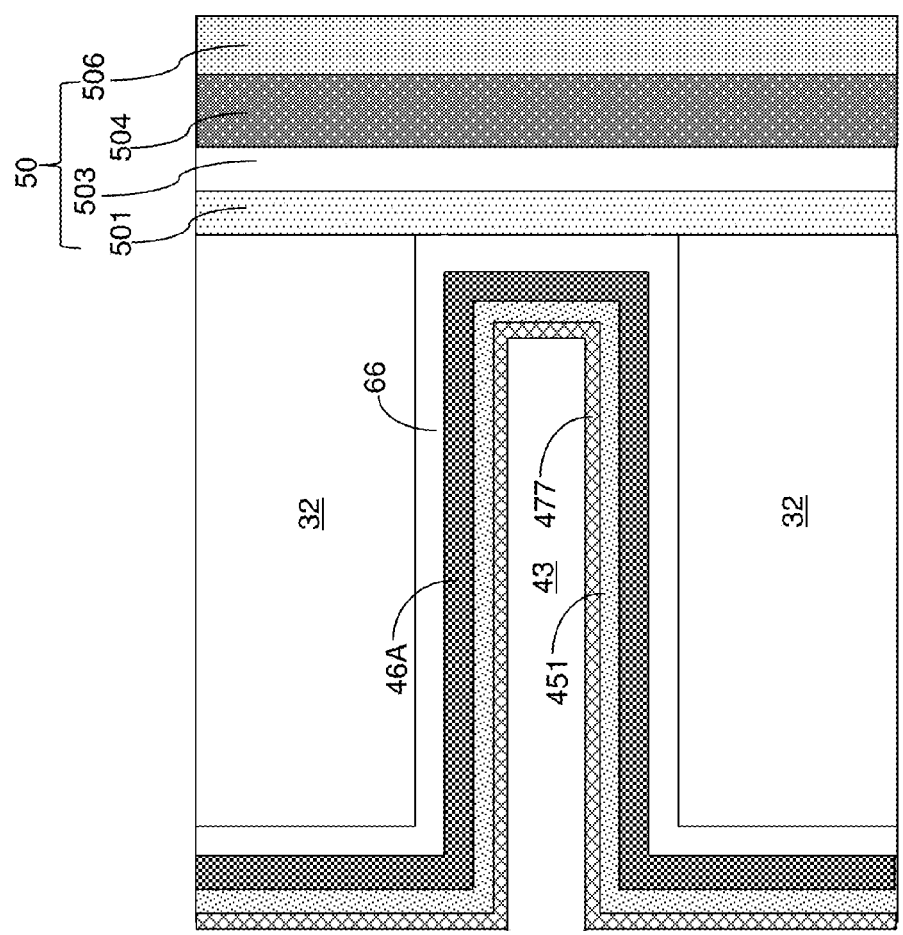
FIGS. 12A-12D are sequential vertical cross-sectional views of the exemplary structure during formation of third exemplary electrically conductive layers according to a third embodiment of the present disclosure.

Referring to FIG. 12A, third exemplary electrically conductive layers according to a third embodiment of the present disclosure can be formed by depositing a sacrificial tungsten layer 477 directly on the silicon nucleation layer 451. The sacrificial tungsten layer 477 can have a thickness in a range from 1 nm to 4 nm, although lesser and greater thicknesses can also be employed. The sacrificial tungsten layer 477 can be deposited by a conformal deposition process such as chemical vapor deposition or atomic layer deposition, and may comprise a fluorine-free tungsten layer as described above.

Figure 12B:
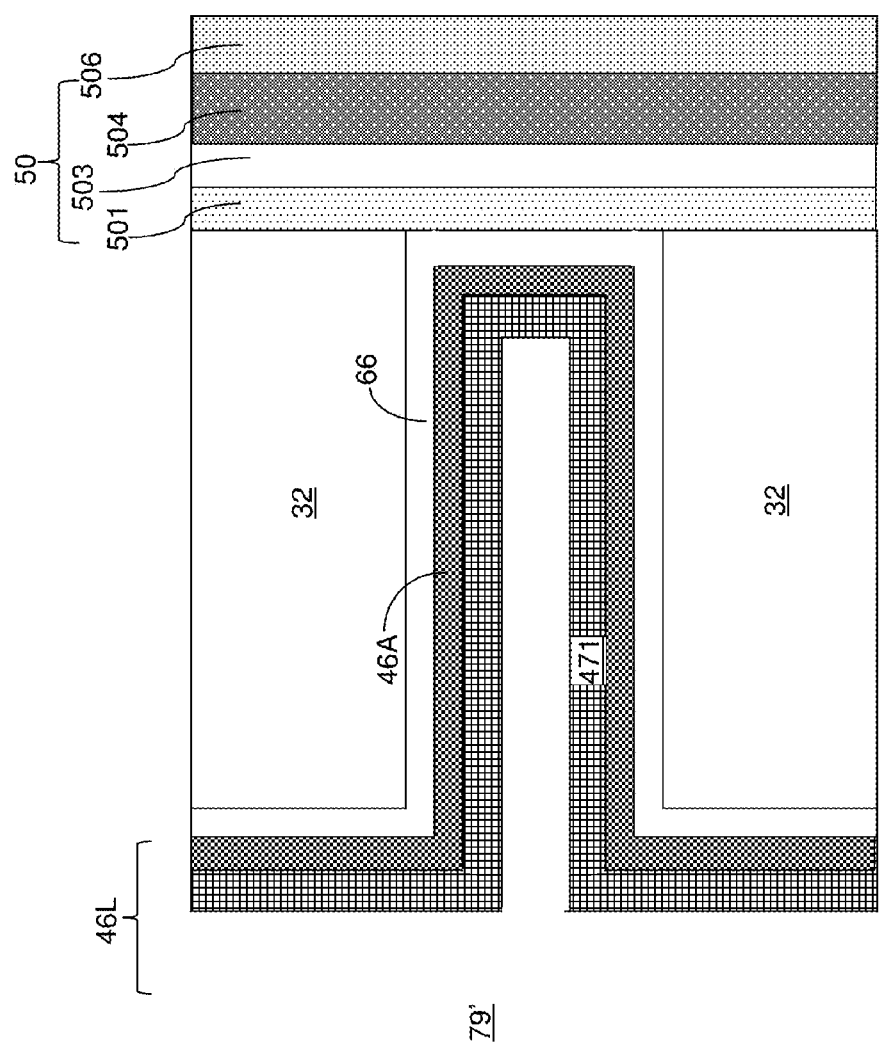

Referring to FIG. 12B, a tungsten silicide layer 471 can be formed by reacting the sacrificial tungsten layer 477 and the silicon nucleation layer 451 to form tungsten silicide. Reaction between the sacrificial tungsten layer 477 and the silicon nucleation layer 451 can be induced by an anneal at an elevated temperature in a range from 700 degrees Celsius and 900 degrees Celsius, although lower and higher temperatures can also be employed. The duration of the anneal process may be selected to induce complete or partial silicidation of the silicon nucleation layer 451 and complete or partial silicidation of the sacrificial tungsten layer 477.

Figure 12C:
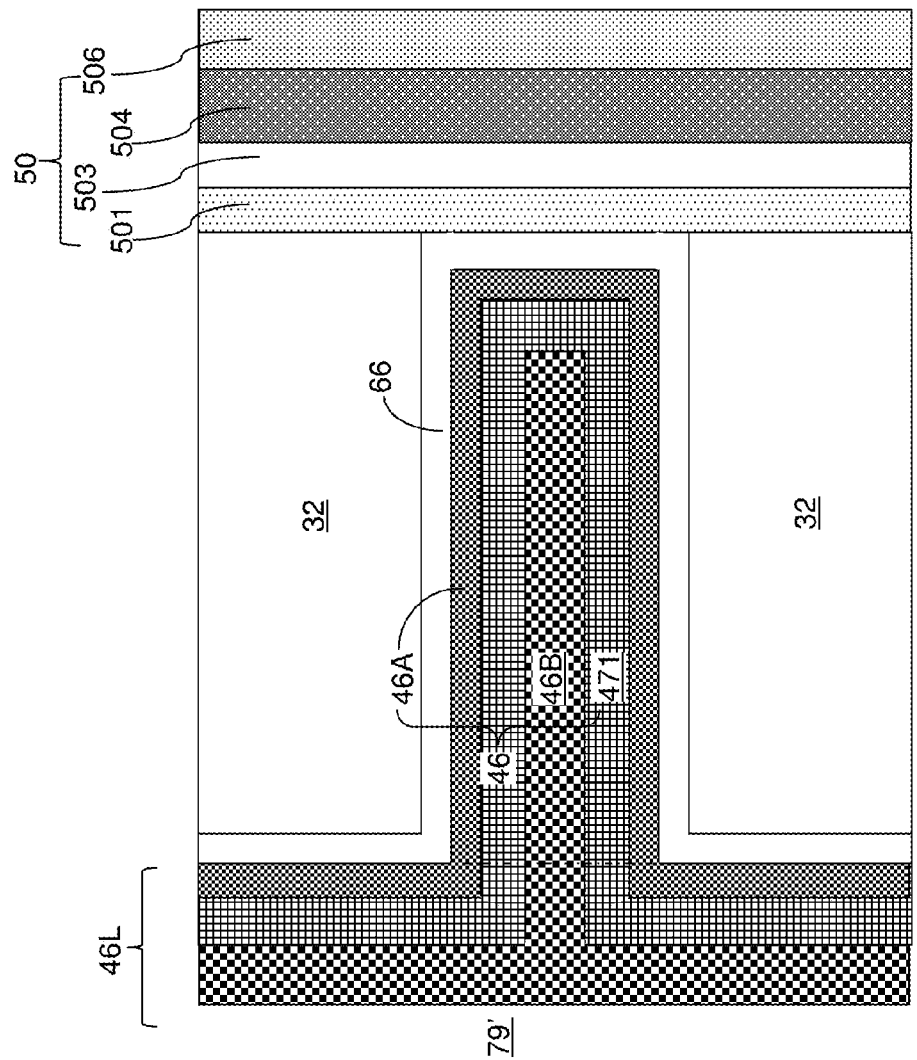

Referring to FIG. 12C, at least one tungsten layer 46B can be deposited directly on the tungsten silicide layer 471 (or on a remaining portion of the sacrificial tungsten layer 477 if a rear portion of layer 477 is not silicided). The tungsten silicide layer 471 provides a nucleation surface upon which the tungsten material of the at least one tungsten layer 46B nucleates. The at least one tungsten layer 46B can be deposited employing any of the processes that can be employed at the processing step of FIG. 10C. For example, the at least one tungsten layer 46B can include fluorine at an atomic concentration greater than 3 p.p.m., and can be formed by a conformal tungsten deposition process employing a fluorine-containing tungsten precursor gas, such as $WF_6$, and a reduction agent, such as hydrogen.

Figure 12D:
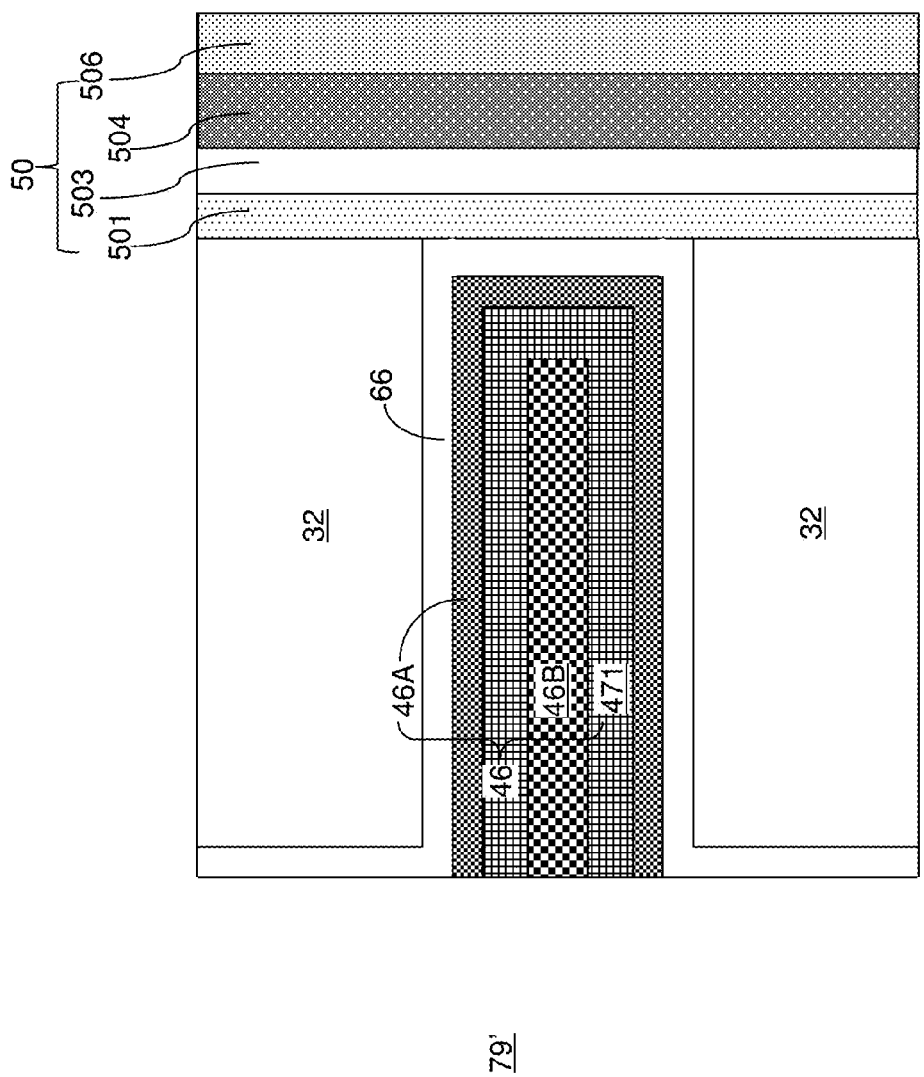

Upon removal of the continuous conductive material layer 46L from within the backside via cavity 79 and from above the contact level dielectric layers (71, 73), the structure illustrated in FIG. 12D can be formed. The tungsten silicide layer 471 is a silicon-containing-material layer.

Figure 13A:
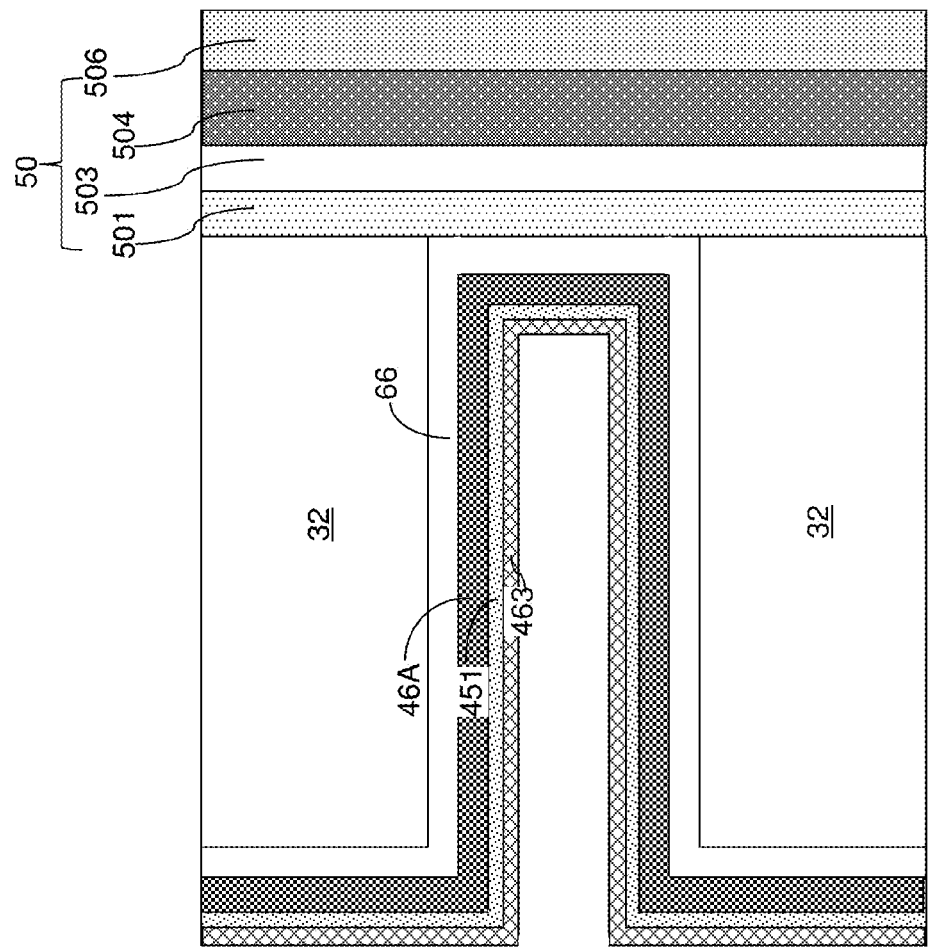
FIGS. 13A-13C are sequential vertical cross-sectional views of the exemplary structure during formation of fourth exemplary electrically conductive layers according to a fourth embodiment of the present disclosure.

Referring to FIG. 13A, fourth exemplary electrically conductive layers according to a fourth embodiment of the present disclosure can be derived from the structure illustrated in FIG. 12A by exposing the surfaces of the silicon nucleation layer 451 to a tungsten-containing precursor gas such as $WF_6$ without including the reduction agent, such as hydrogen. Exposure to the tungsten-containing precursor gas can be performed in a vacuum chamber at a partial pressure of the tungsten-containing precursor gas in a range from 0.1 mTorr to 10 mTorr, although lesser and greater partial pressures can also be employed.

Exposure of the silicon atoms of the silicon nucleation layer 451 to the tungsten-containing precursor gas without the reduction agent at least partially consumes silicon atoms at physically exposed surfaces of the silicon nucleation layer 451, and forms a tungsten nucleation layer 463. In an illustrative example, the tungsten-containing precursor gas can include $WF_6$, and the tungsten nucleation layer 463 can include tungsten and impurity atoms of fluorine at an atomic concentration greater than 3 p.p.m. (such as greater than 10 p.p.m. and/or greater than 30 p.p.m.). The tungsten nucleation layer 463 can have a thickness in a range from 0.4 nm to 3 nm, although lesser and greater thicknesses can also be employed. In one embodiment, the tungsten nucleation layer 463 is at least one monolayer thick.

If a partial conversion of the surface portion of the silicon nucleation layer 451 into the tungsten nucleation layer 463 is performed, a stack of a remaining portion of the silicon nucleation layer 451 and the tungsten nucleation layer 463 is formed. If a full conversion of the silicon nucleation layer 451 into the tungsten nucleation layer 463 is performed, the silicon nucleation layer 451 disappears and the tungsten nucleation layer 463 contacts the conductive metal nitride layer 46A, the backside blocking dielectric layer 66, or the insulating layers 32. While partial conversion of the silicon nucleation layer 451 is illustrated in various embodiments of the present disclosure, additional embodiments are expressly contemplated herein in which the entirety of the silicon nucleation layer 451 is consumed due to exposure of the silicon nucleation layer 451 to the tungsten-containing precursor gas. In each embodiment, at least one monolayer of tungsten is deposited as a nucleation layer.

Figure 13B:
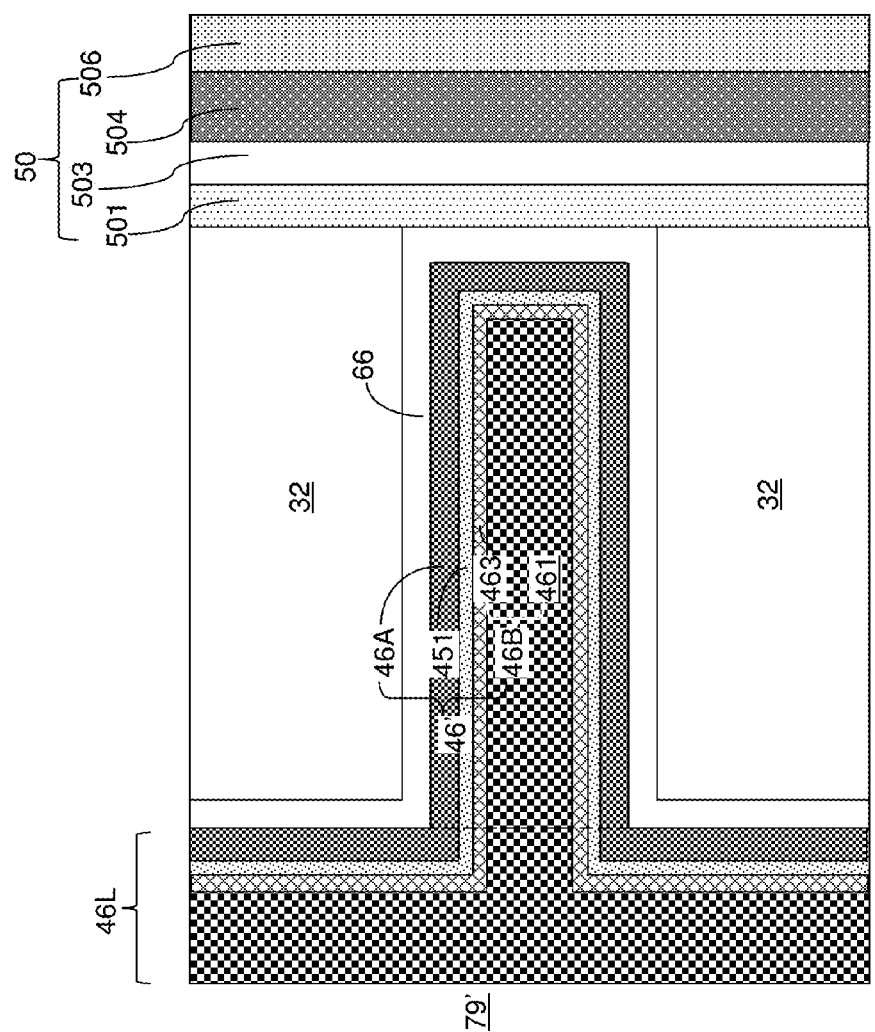

Referring to FIG. 13B, at least one tungsten layer can be subsequently deposited in remaining portions of the backside recesses 43. In one embodiment, the at least one tungsten layer can include a fluorine-free tungsten layer such as the first tungsten layer 461 deposited at the processing steps of FIG. 11B. The first tungsten layer 461 can be free of fluorine atoms, i.e., can include fluorine atoms at an atomic concentration less than 1 p.p.m., such as less than 0.1 p.p.m. The first tungsten layer 461 can be deposited employing a fluorine-free precursor gas described above. In one embodiment, the at least one tungsten layer can consist of the fluorine-free tungsten layer such as the first tungsten layer 461.

The portions of the optional conductive metal nitride layer 46A, the silicon nucleation layer 451 (if present), and the tungsten layers 46B (which includes the tungsten nucleation layer 463 and the first tungsten layer 461) located at each level of the backside recesses 43 (i.e., at each level of the sacrificial material layers 42 prior to removal of the sacrificial material layers 42) constitutes an electrically conductive layer 46 illustrated in FIG. 8. The portions of the optional conductive metal nitride layer 46A, the silicon nucleation layer 451 (if present), and the tungsten layers 46B located within the backside via cavity 79 and over the contact level dielectric layers (71, 73) constitute the continuous conductive material layer 46L illustrated in FIG. 8. If the entirety of the silicon nucleation layer 451 is removed by exposure of the silicon nucleation layer 451 to the tungsten-containing precursor gas, then the silicon nucleation layer 451 is absent in the structure of FIG. 13B.

Figure 13C:
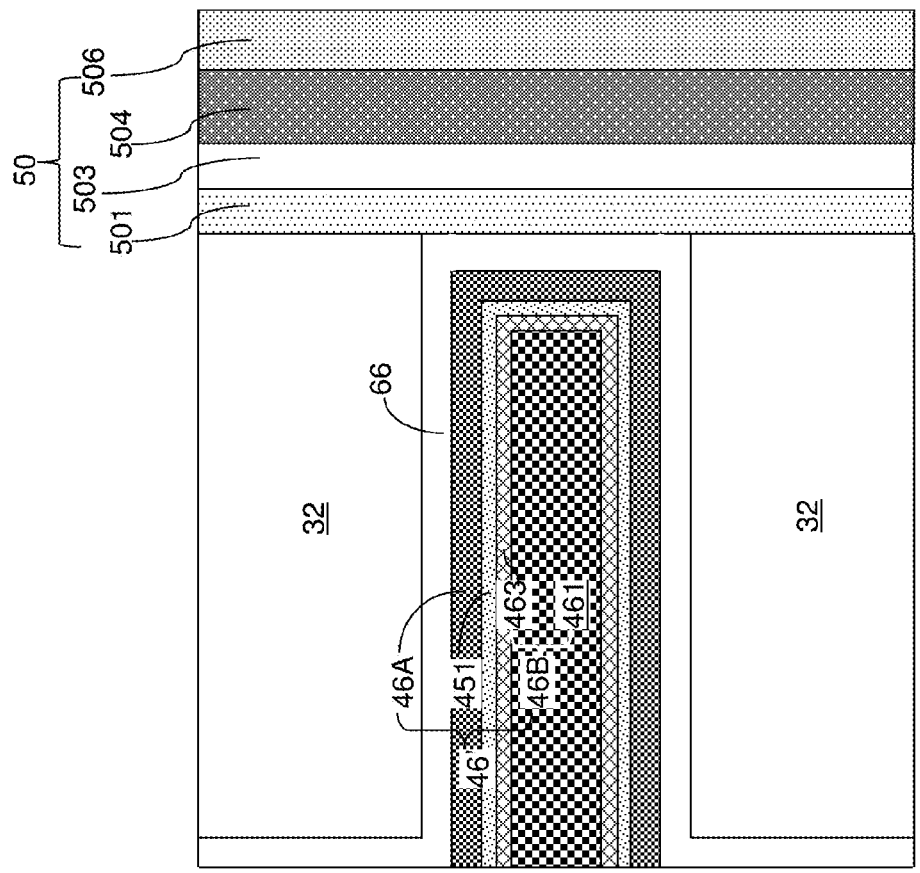

Upon removal of the continuous conductive material layer 46L from within the backside via cavity 79 and from above the contact level dielectric layers (71, 73), the structure illustrated in FIG. 13C can be formed. The silicon nucleation layer 451 is a silicon-containing-material layer.

Figure 14A:
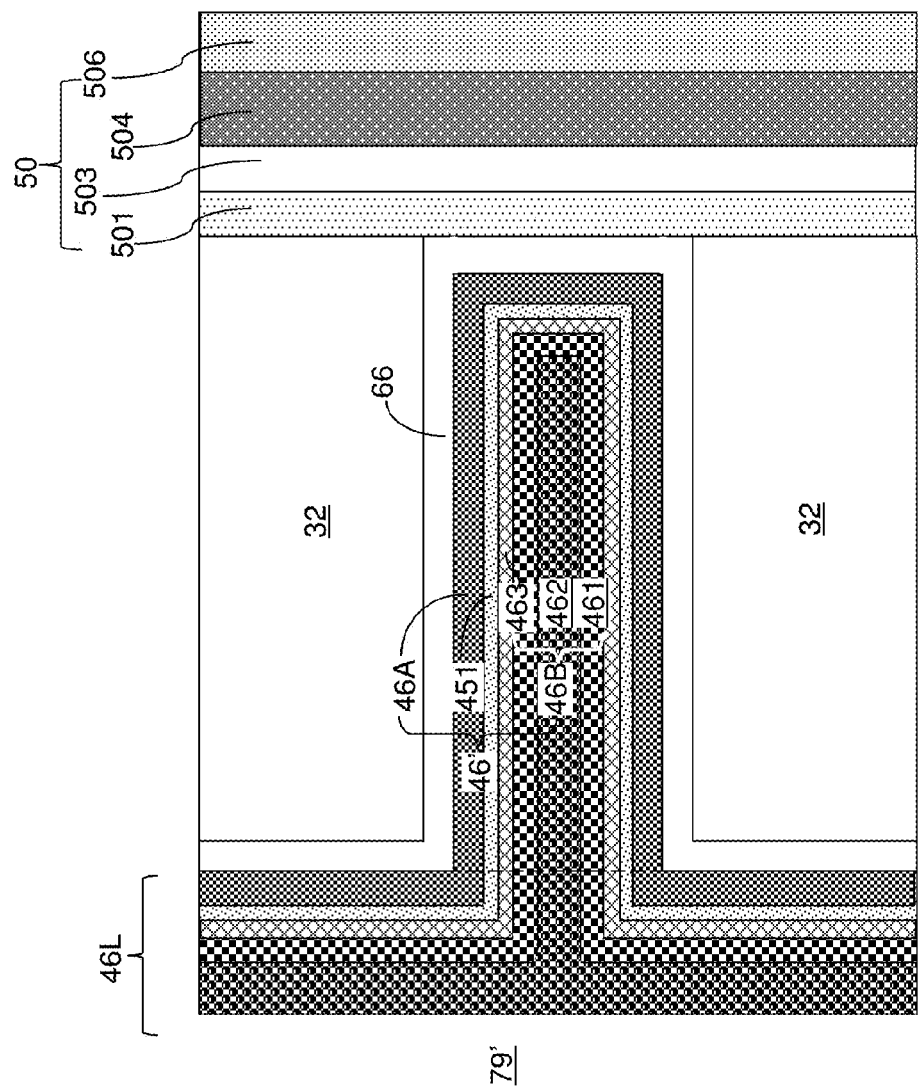
FIGS. 14A and 14B are sequential vertical cross-sectional views of the exemplary structure during formation of fifth exemplary electrically conductive layers according to a fifth embodiment of the present disclosure.

Referring to FIG. 14A, fifth exemplary electrically conductive layers according to a fifth embodiment of the present disclosure can be derived from the structure illustrated in FIG. 13A by forming a combination of two tungsten layers, a first tungsten layer 461 and a second tungsten layer 462, can be formed instead of a single first tungsten layer 461 illustrated in FIG. 13B. The first tungsten layer 461 can be the same as the first tungsten layer 461 of FIG. 11A. The second tungsten layer 462 can be the same as the second tungsten layer 462 of FIG. 11B.

The portions of the optional conductive metal nitride layer 46A, the silicon nucleation layer 451 (if present), and the tungsten layers 46B (which includes the tungsten nucleation layer 463, the first tungsten layer 461, and the second tungsten layer 462) located at each level of the backside recesses 43 (i.e., at each level of the sacrificial material layers 42 prior to removal of the sacrificial material layers 42) constitutes an electrically conductive layer 46 illustrated in FIG. 8. The portions of the optional conductive metal nitride layer 46A, the silicon nucleation layer 451 (if present), and the at least one tungsten layer 46B located within the backside via cavity 79 and over the contact level dielectric layers (71, 73) constitute the continuous conductive material layer 46L illustrated in FIG. 8. If the entirety of the silicon nucleation layer 451 is removed by exposure of the silicon nucleation layer 451 to the tungsten-containing precursor gas, then the silicon nucleation layer 451 is absent in the structure of FIG. 14B.

Figure 14B:
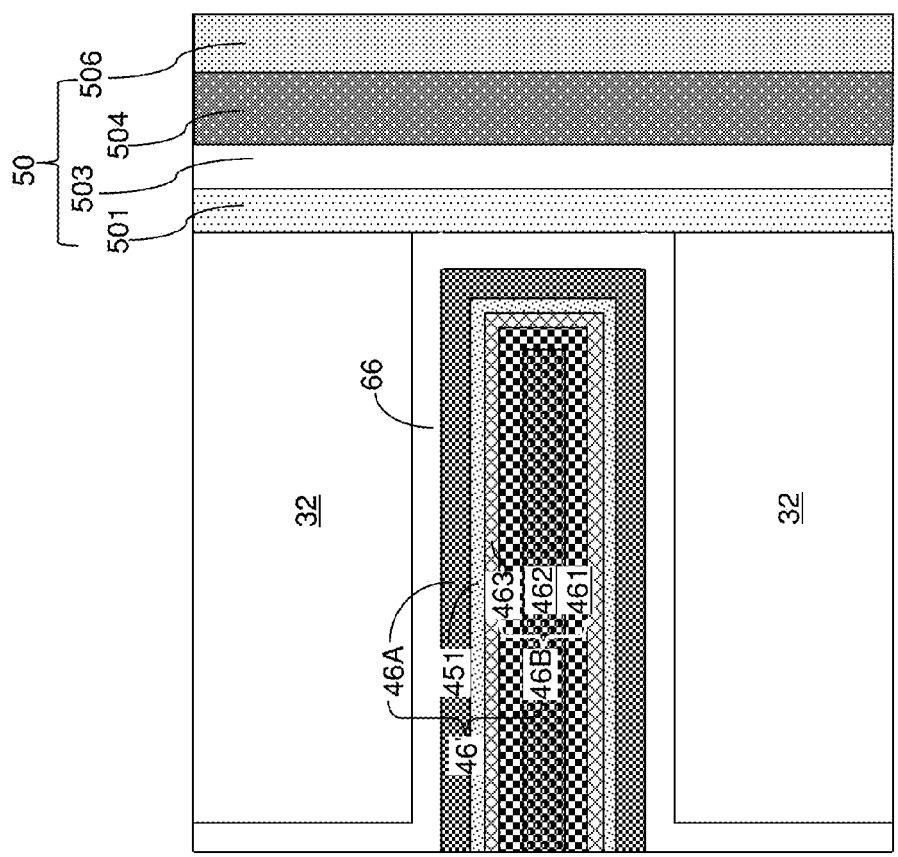

Upon removal of the continuous conductive material layer 46L from within the backside via cavity 79 and from above the contact level dielectric layers (71, 73), the structure illustrated in FIG. 14B can be formed. The silicon nucleation layer 451 is a silicon-containing-material layer.

Figure 15A:
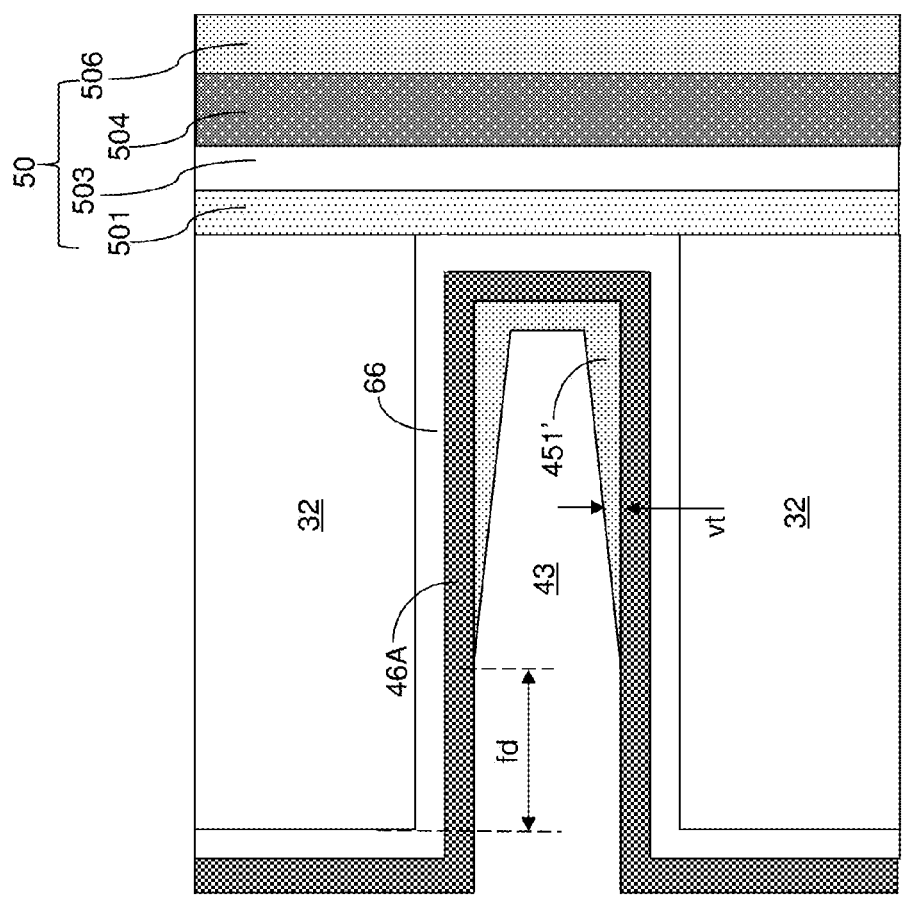
FIGS. 15A-15D are sequential vertical cross-sectional views of the exemplary structure during formation of sixth exemplary electrically conductive layers according to a sixth embodiment of the present disclosure.

Referring to FIG. 15A, sixth exemplary electrically conductive layers according to a sixth embodiment of the present disclosure can be derived from the structure of FIG. 10B. In this embodiment, the tungsten layers are selectively deposited in the backside recesses 43 (i.e., to form the structure of FIG. 9 and skipping the step shown in FIG. 8). The silicon nucleation layer 451 may be deposited as a conformal amorphous silicon layer, and may include at least two atomic monolayers of amorphous silicon. As discussed above, the backside blocking dielectric layer 66 may, or may not, be present. The conductive metal nitride layer 46A may, or may not, be present. Thus, the silicon nitride layer 451 as provided after the processing steps of FIG. 10B may be formed directly on the insulating layers 32 and the memory film, the backside blocking dielectric layer 66, or the conductive metal nitride layer 46A.

The silicon nucleation layer 451 is anisotropically etched at the processing steps of FIG. 15A. The etchant can be provided through the backside cavity 79' in a depletive process condition, i.e., a process condition in which depletion of the etchant gas limits etching of the material of the silicon nucleation layer 451. Thus, less supply of the etchant is available for the etch process with a greater lateral distance of the region of the silicon nucleation layer 451 from the backside via trench 79. The remaining portions of the silicon nucleation layer 451 constitute a variable thickness silicon layer 451' having a variable thickness vt that increases with a lateral distance from the backside via trench 79. In one embodiment, the portion of the silicon nucleation layer 451 adjacent to the backside via trench 79 may be completely removed, and the variable thickness silicon layer is laterally spaced from a most proximal sidewall of the backside via trench 79 by a finite distance fd.

Figure 15B:
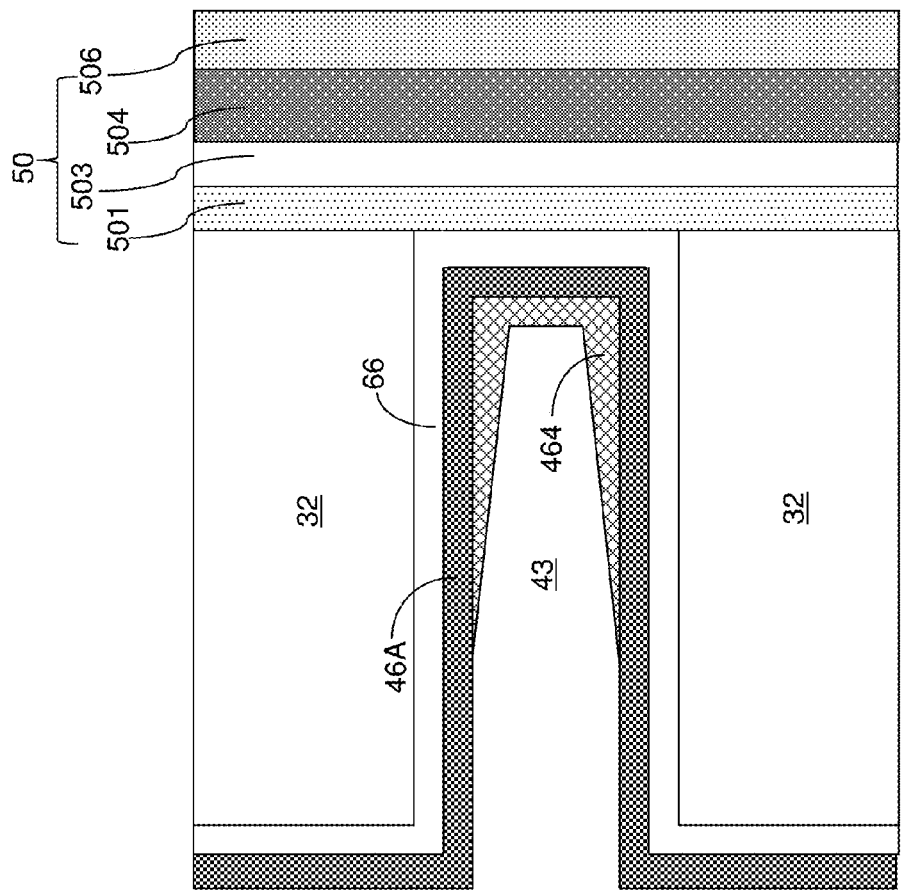

Referring to FIG. 15B, at least a portion of the variable thickness silicon layer 451' can be converted into a variable thickness tungsten layer 464 by exposing the outer surfaces of the variable thickness silicon layer 451' to a tungsten-containing precursor gas such as $WF_6$. Exposure to the tungsten-containing precursor gas can be performed in a vacuum chamber at a partial pressure of the tungsten-containing precursor gas in a range from 0.1 mTorr to 10 mTorr, although lesser and greater partial pressures can also be employed.

Exposure of the silicon atoms of the variable thickness silicon layer 451' to the tungsten-containing precursor gas at least partially consumes silicon atoms at physically exposed surfaces of the variable thickness silicon layer 451', and forms a tungsten nucleation layer 464. In an illustrative example, the tungsten-containing precursor gas can include $WF_6$, and the variable thickness tungsten layer 464 can include tungsten and impurity atoms of fluorine at an atomic concentration greater than 3 p.p.m. (such as greater than 10 p.p.m. and/or greater than 30 p.p.m.). The variable thickness tungsten layer 464 can have a variable thickness that varies from 0 nm to a maximum thickness in a range from 0.4 nm to 3 nm, although lesser and greater maximum thicknesses can also be employed. The variable thickness tungsten layer 464 can be formed by replacement of the variable thickness silicon layer 451' with tungsten atoms through exposure to the tungsten-containing precursor gas.

Figure 15C:
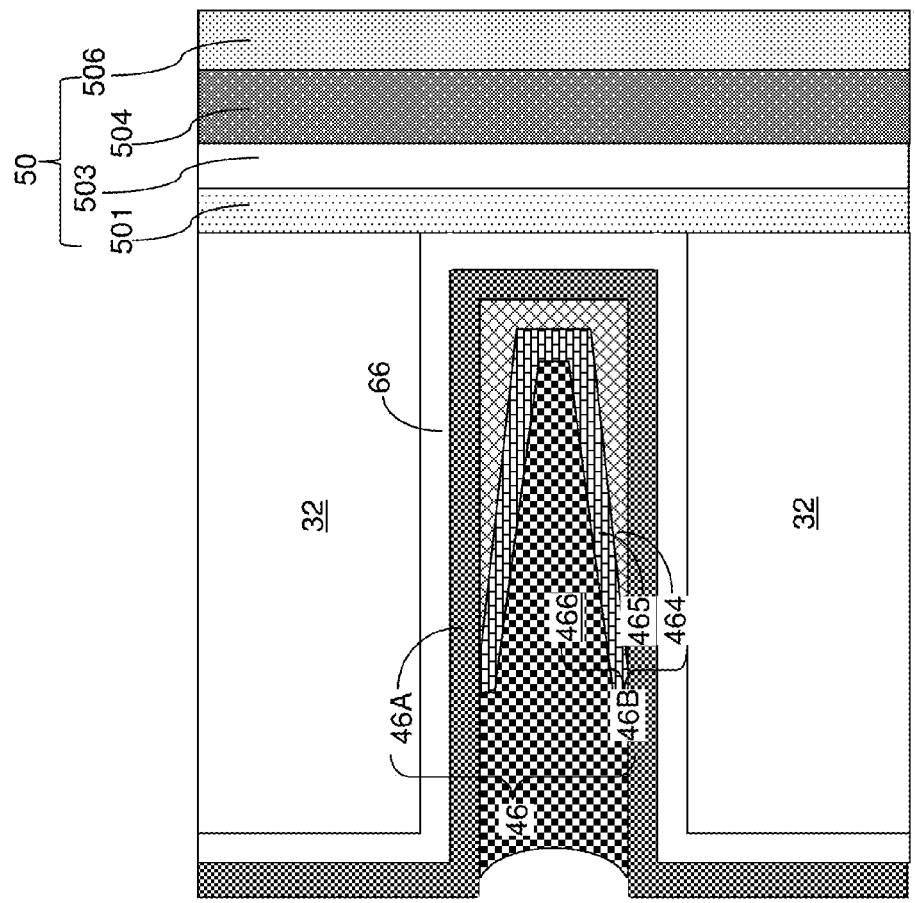

Referring to FIG. 15C, additional tungsten layers (465, 466) can be deposited by at least one selective deposition process that deposits additional tungsten only on pre-existing tungsten surfaces and in remaining volumes of the backside recesses 43. In one embodiment, the additional tungsten layers (465, 466) can include a first tungsten layer 465, which can be a fluorine-free tungsten layer. The first tungsten layer 465 may be deposited employing any of the deposition methods for depositing fluorine-free tungsten described above. The thickness of the first tungsten layer 465 can be in a range from 2 nm to 5 nm, although lesser and greater thicknesses can also be employed. Subsequently, a second tungsten layer 466 can be deposited. The second tungsten layer 466 may, or may not, include fluorine, and may be deposited by any of the tungsten deposition methods described above. Tungsten does not nucleate directly on surfaces of conductive metallic material surfaces (such as surfaces of TiN) or dielectric surfaces (such as surfaces of the backside blocking dielectric layer 66 or the insulating layers 32). Thus, growth region of the additional tungsten layer (465, 466) is limited to pre-existing tungsten surfaces, and therefore, the tungsten layers 46B can be limited to levels of the backside recesses 43 (which are levels of the sacrificial material layers 42).

Figure 15D:
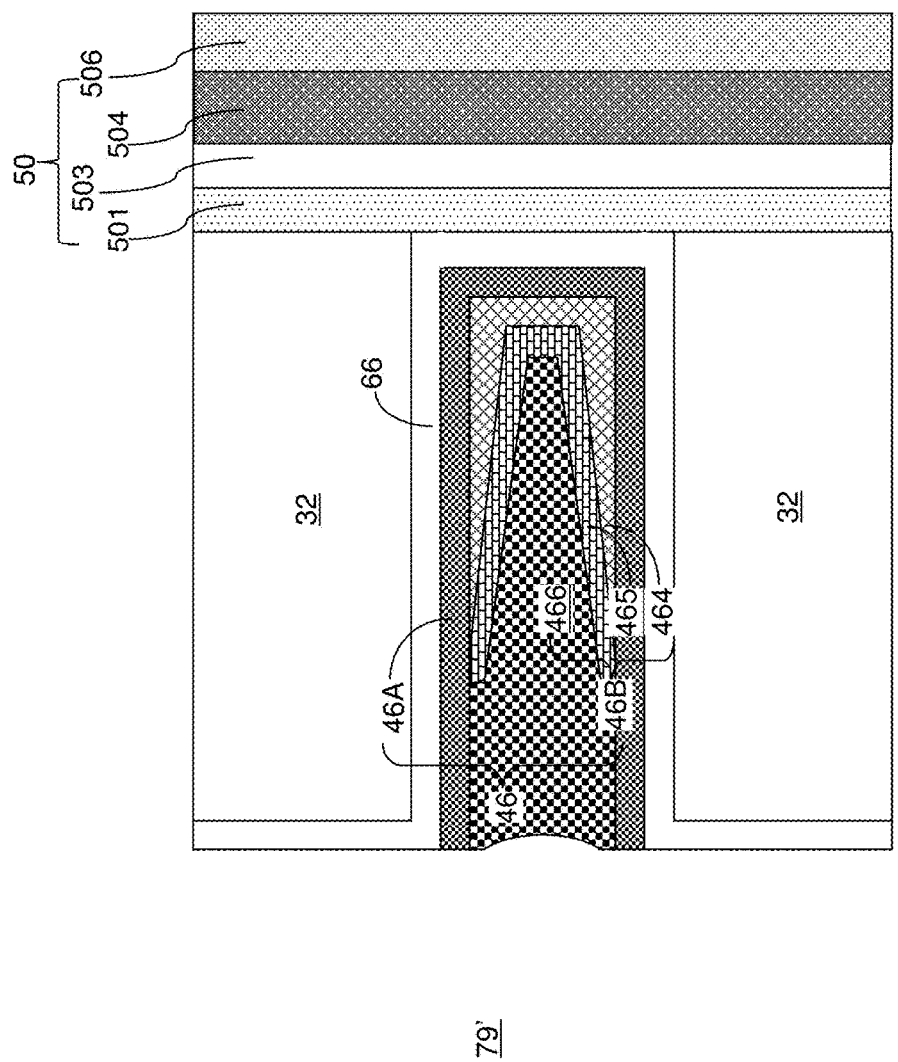

Referring to FIG. 15D, the portions of the conductive metal nitride layer 46A located at the periphery of the backside via trench 79 can be removed by a recess etch, which can be an isotropic etch or an anisotropic etch. Each continuous set of a conductive metal nitride layer 46A, a variable thickness tungsten layer 464, a first tungsten layer 465, and a second tungsten layer 466 constitutes an electrically conductive layer 46. Thus, each electrically conductive layer 46 can include a first tungsten layer 465 having a fluorine concentration less than 1.0 parts per million, and a second tungsten layer 466 having a fluorine concentration greater than 3.0 parts per million and spaced from the memory stack structures 55 by the first tungsten layer 465. If desired, layer 465 may be omitted, as will be described with respect to the seventh exemplary embodiment below.

Figure 16B:
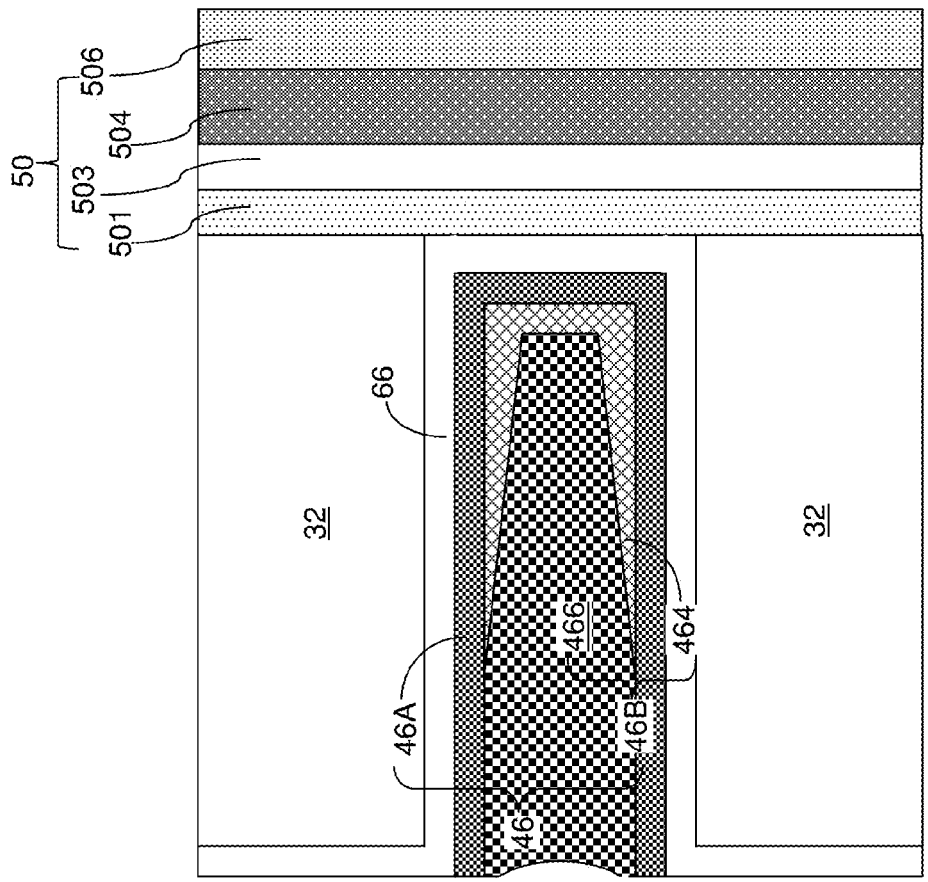

FIGS. 16A and 16B and 17A-17E illustrate formation of seventh exemplary electrically conductive layers according to a seventh embodiment of the present disclosure. FIGS. 16A and 16B provide magnified views, and FIGS. 17A-17E provide vertical cross-sectional views over a larger area.

Referring to FIG. 17A, the structure of FIG. 10B can be employed for the seventh embodiment.

Referring to FIG. 17B, the processing steps of FIG. 15A can be performed to form the variable thickness silicon layer 451'. The variable thickness silicon layer 451' includes a variable thickness region which is located in proximity to a backside cavity 79' and in which the thickness of the variable thickness silicon layer 451' changes. The variable thickness silicon layer 451' can also include a uniform thickness region which is located between memory openings including memory stack structures 55 and having a uniform thickness, which can be the maximum thickness of the variable thickness silicon layer 451'. In other words, by using a more aggressive sidewall silicon etch, will remove the silicon layer 451' between the backside via trench 79' and the outer row of memory stack structures 55 located adjacent to the backside via trench 79'. However, the silicon layer 451' inside the outer row of the memory stack structures 55 may not be etched.

Figure 17C:
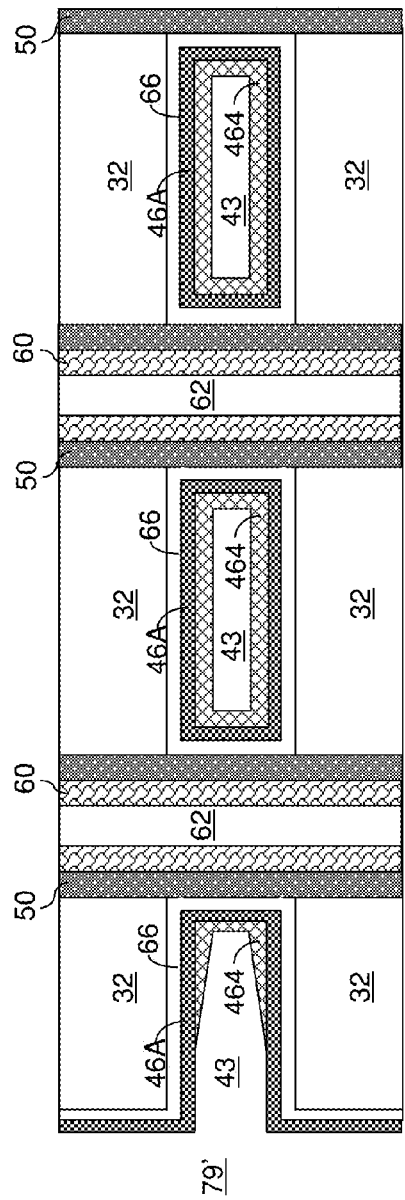

Referring to FIG. 17C, the processing steps of FIG. 15B can be performed to form a variable thickness tungsten nucleation layer 464. Layer 464 is not present in the backside via trenches 43 adjacent to the trench 79' and has a variable thickness vt adjacent to the outer row of memory stack structures. However, layer 464 may have a uniform thickness and be present on all sidewalls of the backside recesses inside the outer row of the memory stack structures 55.

Figure 17D:
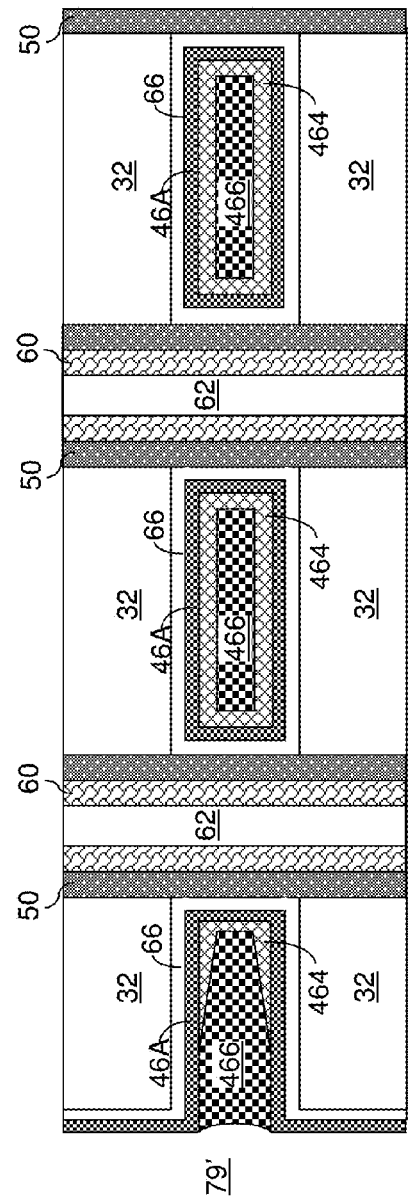

Referring to FIGS. 16A and 17D, at least one tungsten layer 466 can be selectively deposited, which may, or may not, be fluorine free. In one embodiment, the at least one tungsten layer 466 can be deposited by chemical vapor deposition process, or other tungsten deposition methods such as a low fluorine tungsten deposition process. Due to the selective nature of tungsten CVD deposition, tungsten growth will not be initiated where layer 464 is not present. Thus, layer 464 may grow inside out to initially fill the backside recess 43 space adjacent to the outer row of memory stack structures 55 and inside the outer row of the memory stack structures 55 before growing outward toward the trench 79'. This ensures that the inner parts of the backside recesses 43 are filled first without forming voids.

Figure 17E:
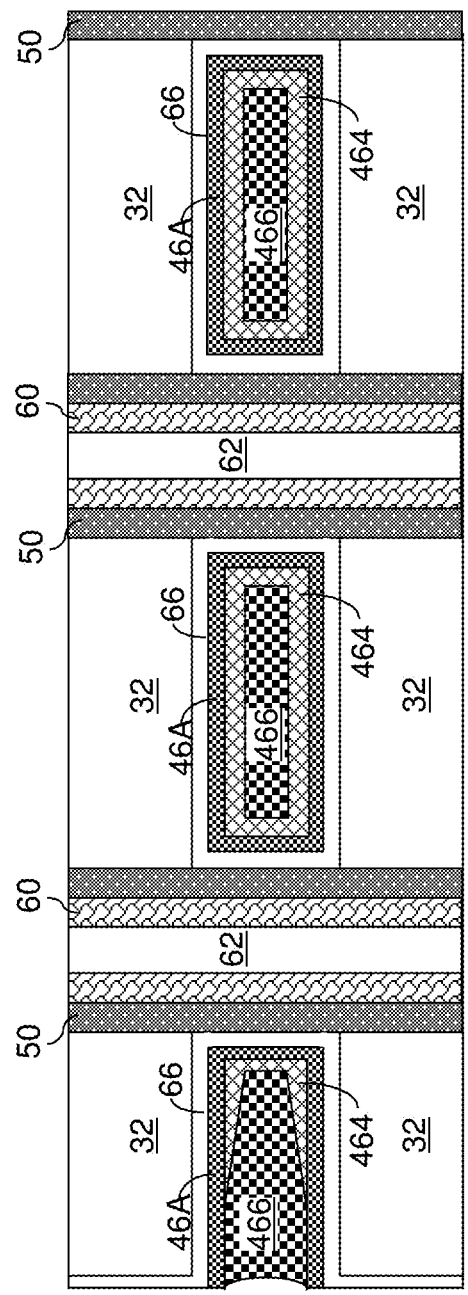

Referring to FIGS. 16B and 17E, the portions of the conductive metal nitride layer 46A located at the periphery of the backside via trench 79 can be removed by a recess etch, which can be an isotropic etch or an anisotropic etch. Each contiguous set of a conductive metal nitride layer 46A, a variable thickness tungsten layer 464, and a tungsten layer 466 constitutes an electrically conductive layer 46.

Figure 17F:
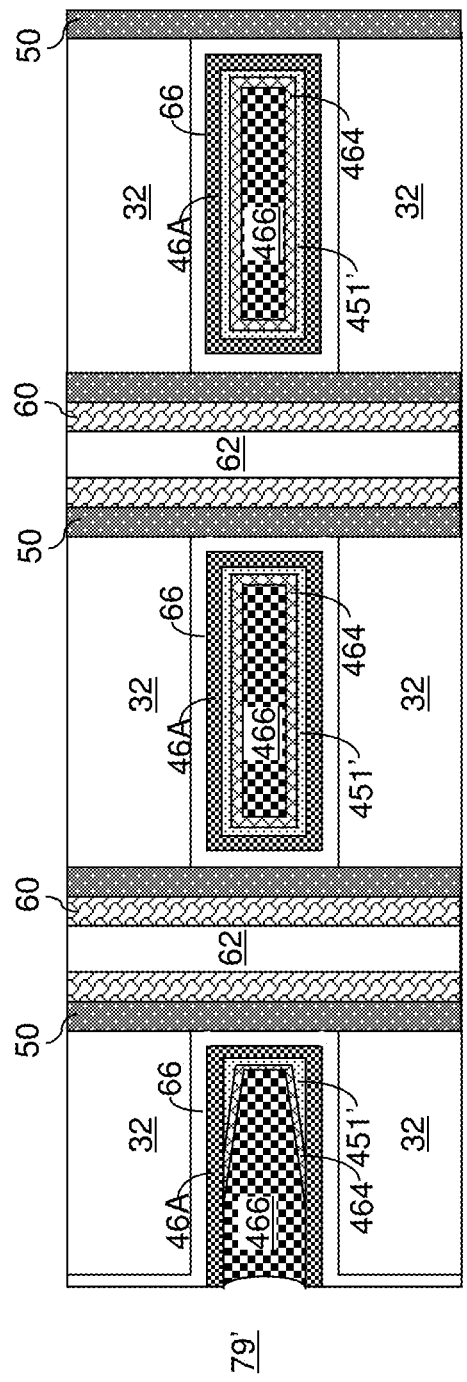
FIG. 17F is a vertical cross-sectional view of a region around a pair of memory stack structures after formation of a variation of the seventh exemplary electrically conductive layers according to the seventh embodiment of the present disclosure.

Referring to FIG. 17F, a variation of the seventh exemplary electrically conductive layer is illustrated, which can be derived from the seventh exemplary electrically conductive layer by employing a partial conversion of the variable thickness silicon layer 451' into a tungsten nucleation layer 464. Thus, each electrically conductive layer 46 includes a conductive metal nitride layer 46A, a variable thickness silicon layer 451', a tungsten nucleation layer 464, and a tungsten layer 466.

Figure 18:
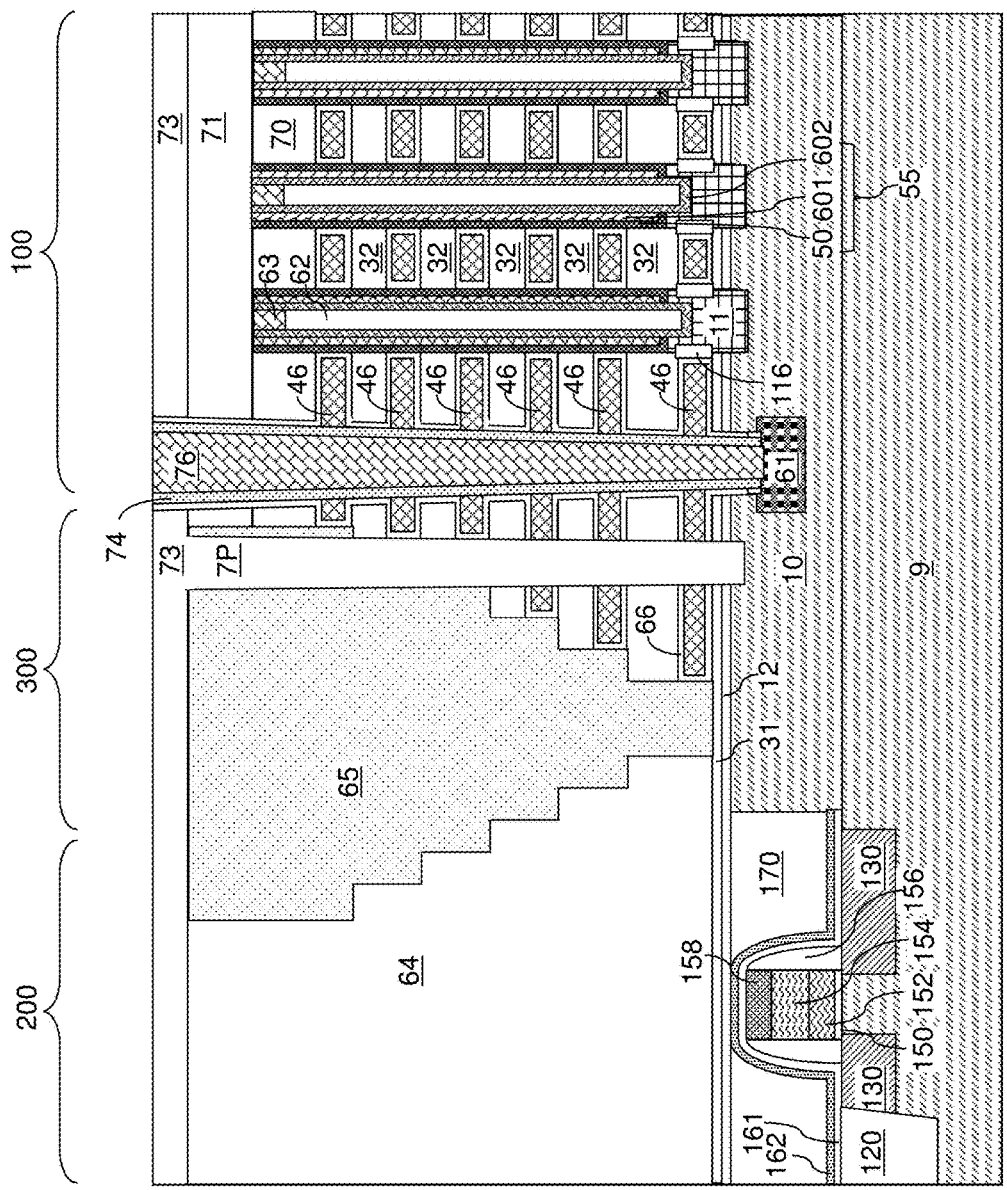
FIG. 18 is a vertical cross-sectional view of the exemplary structure after formation of a backside contact via structure according to an embodiment of the present disclosure.

Referring to FIG. 18, a source region 61 can be formed by implanting electrical dopants through each backside via trench 79 into a semiconductor portion located on, or within, the substrate (9, 10). For example, a source region 61 may be formed by implantation of dopant atoms into a portion of the doped well layer 10 through each backside via trench 79. Alternatively, a semiconductor portion can be formed on the substrate (9, 10) by deposition of a semiconductor material, for example, by selective epitaxy, and by implantation of electrical dopants into the deposited semiconductor portion.

An insulating spacer 74 can be formed at the periphery of each backside via trench 79 by deposition of a conformal insulating layer and an anisotropic etch that removes horizontal portions of the conformal insulating layer. A conductive material is deposited within the backside cavity 79' within the insulating spacer to form a backside contact via structure 76, which can be a source contact via structure.

Figure 19:
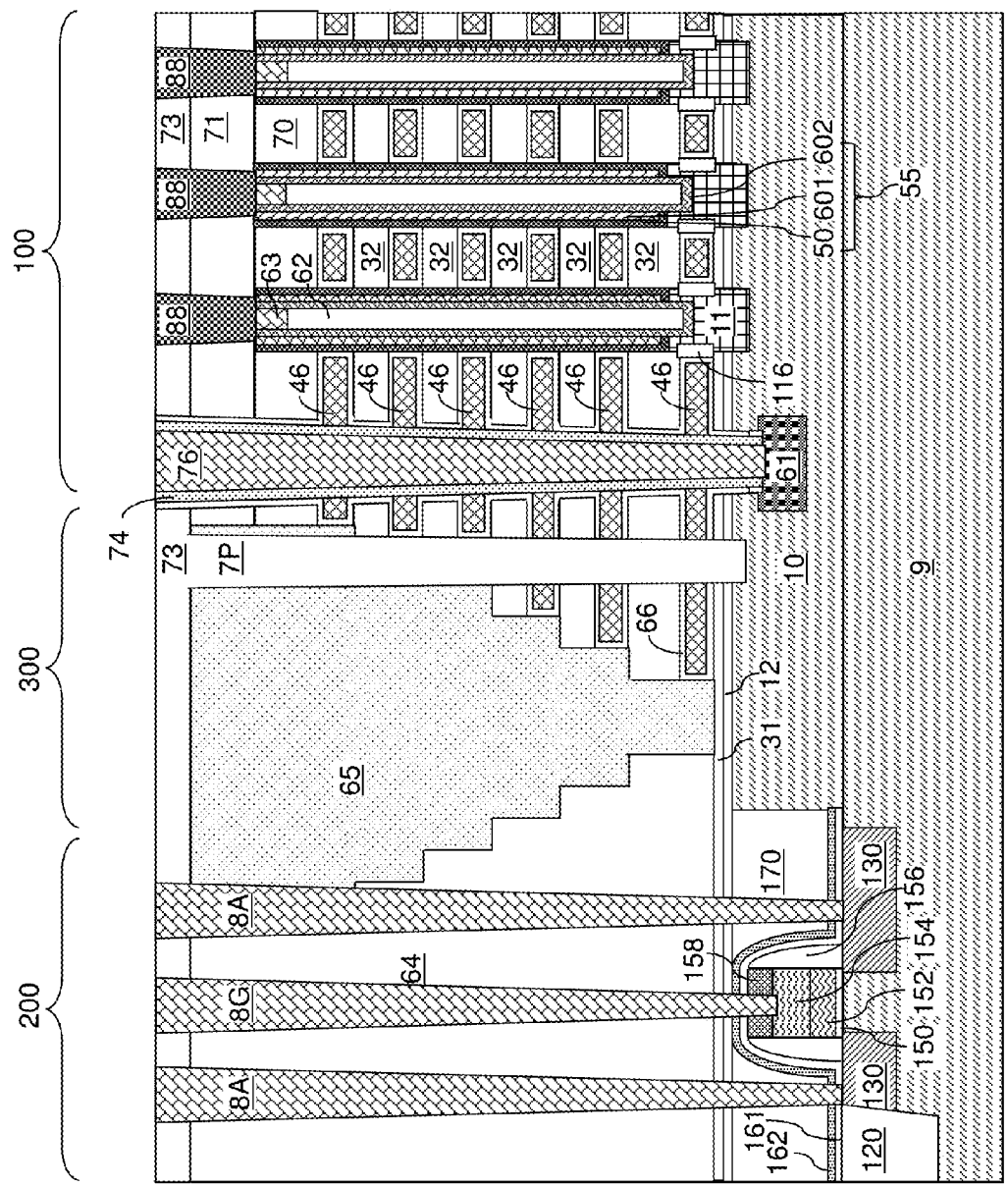
FIG. 19 is a vertical cross-sectional view of the exemplary structure after formation of additional contact via structures according to an embodiment of the present disclosure.

Referring to FIG. 19, memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining continuous portion of the at least one conductive material constitutes a memory contact via structure 88, which contacts a top surface of an underlying drain region 63. The photoresist layer can be subsequently removed, for example, by ashing.

Various additional contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A.

FIGS. 20A-20E illustrate a region between a memory stack structure 55 and a backside via trench 79 during formation of an eighth exemplary electrically conductive layer according to an eighth embodiment of the present disclosure.

Figure 20A:
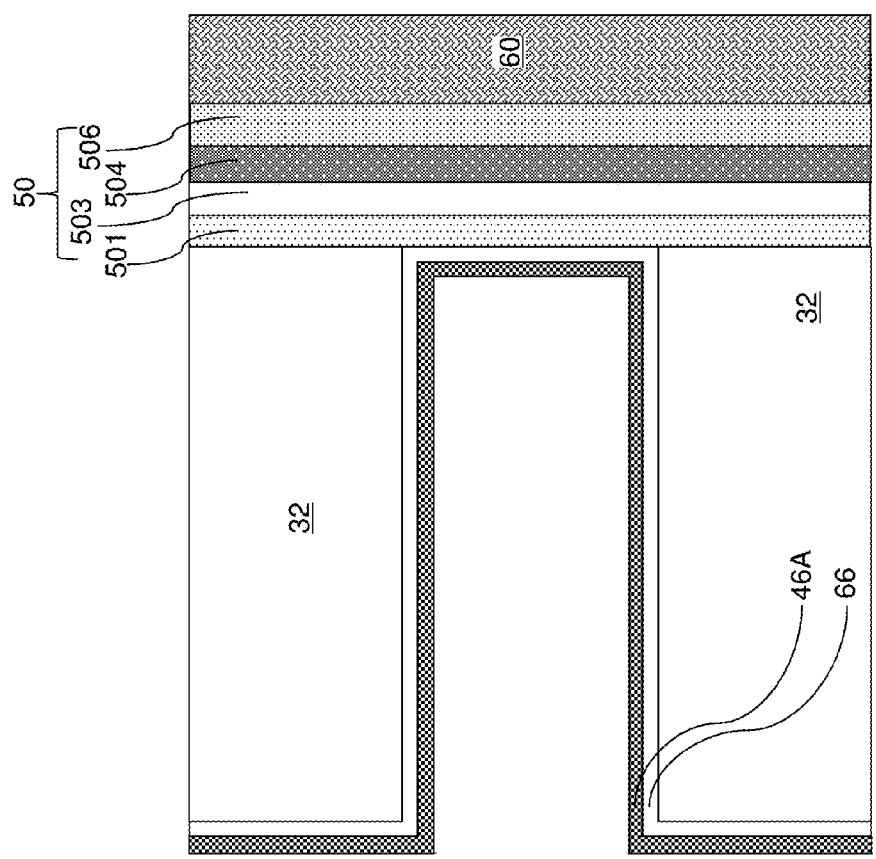
FIGS. 20A-20E are sequential vertical cross-sectional views of a region between a memory stack structure and a backside via trench during formation of an eighth exemplary electrically conductive layer according to an eighth embodiment of the present disclosure.

Referring to FIG. 20A, the exemplary structure illustrated in FIG. 10A can be employed to form the eighth exemplary electrically conductive layer. Specifically, the conductive metal nitride layer 46A can be formed on the backside blocking dielectric layer 66 employing a processing step of FIG. 10B. The conductive metal nitride layer 46A includes a conductive metal nitride such as TiN, TaN, WN, or alloys or stacks thereof. The conductive metal nitride layer 46A can be formed by a conformal deposition process such as chemical vapor deposition or atomic layer deposition. The thickness of the conductive metal nitride layer 46A can be in a range from 1 nm to 4 nm, although lesser and greater thicknesses can also be employed.

Figure 20B:
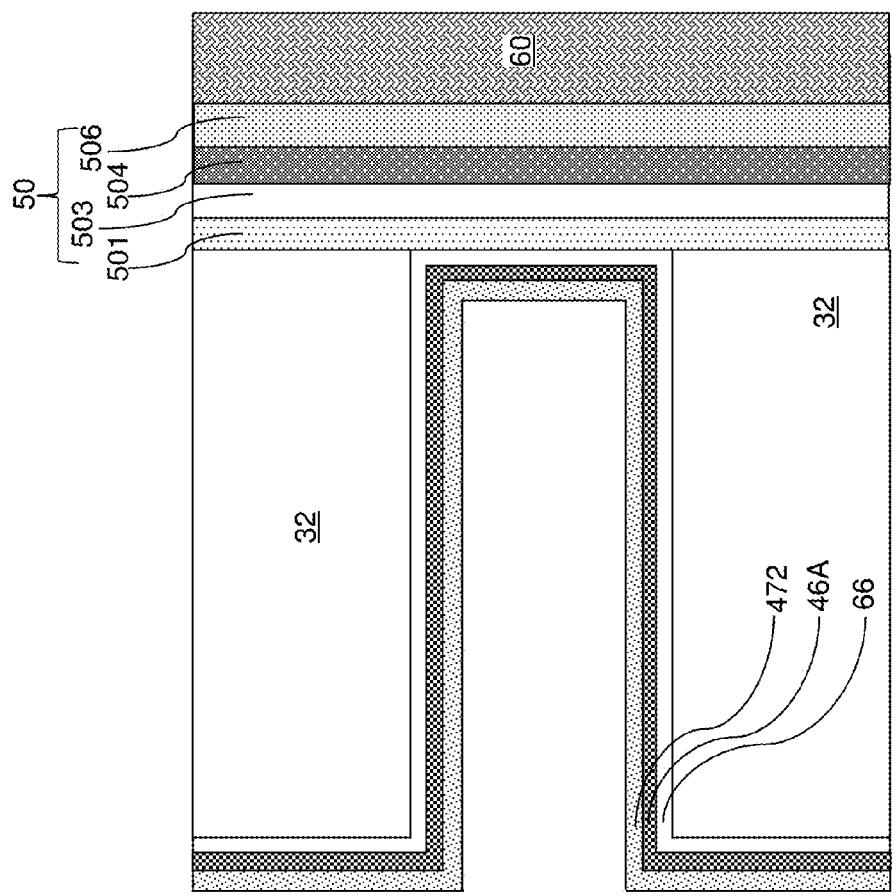

Referring to FIG. 20B, a silicon-containing layer 472 can be deposited on the conductive metal nitride layer 46A in each of the backside recesses and at a periphery of each backside via trench 79 by a conformal deposition process. The silicon-containing layer 472 includes silicon at an atomic concentration of at least 60%. In one embodiment, the silicon-containing layer 472 can consist essentially of an intrinsic silicon-containing semiconductor material or a doped silicon-containing semiconductor material. In one embodiment, the silicon-containing layer 472 can include undoped or doped amorphous silicon.

In one embodiment, the silicon-containing layer 472 can consist essentially of silicon atoms (in case undoped silicon is employed), or can consist essentially of silicon atoms and electrical dopant atoms, which may be p-type dopant atoms such as boron, or n-type dopant atoms such as P, As, and/or Sb, and/or non-electrical dopant atoms, such as nitrogen, and/or carbon. Alternatively, the silicon-containing layer 472 may consist essentially of an alloy of silicon, such as silicon-germanium having at least 60 atomic percentage of silicon. In one embodiment, the silicon-containing layer 472 can be doped with at least one element the can reduce the grain size of a silicide material to be derived from the silicon-containing layer 472. In an illustrative example, the silicon-containing layer 472 can be doped with at least one element selected from carbon and nitrogen at an atomic concentration in a range from 1% to 40%. In one embodiment, the atomic concentration of carbon can be in a range from 0% to 20%, such as from 3% to 18% and/or from 5% to 15%, and the atomic concentration of nitrogen can be in a range from 0% to 20%, such as from 3% to 18% and/or from 5% to 15%.

The silicon-containing layer 472 can be formed by a conformal deposition process such as chemical vapor deposition or atomic layer deposition. For example, the silicon-containing layer 472 may be formed using silane, disilane, or dichlorosilane. For example, disilane may be decomposed at a relatively low temperature of about 400 degrees Celsius or higher. In one embodiment, the silicon-containing layer 472 can include silicon atoms in an amorphous phase, i.e., can be an amorphous silicon-containing layer. Each of the electrical and/or non-electrical dopants in the silicon-containing layer 472 can be incorporated into the silicon-containing layer 472 by in-situ doping by flowing at least one dopant gas during the deposition process, or by ex-situ doping, for example, by at least one plasma doping process and/or at least one gas phase doping process. The thickness of the silicon-containing layer 472 can be in a range from 1 to 15 nm, such as 3 nm to 10 nm, although lesser and greater thicknesses can also be employed. A benefit of using dopant gases such as diborane during silane or disilane deposition is that diborane enables lowering of silicon deposition temperature below 400 degrees Celsius. The amount of diborane flow can be adjusted to adjust the deposition temperature. Generally, a higher diborane flow corresponds to a lower deposition temperature, and a lower diborane flow corresponds to a higher deposition temperature. This characteristic allows the W deposition step (which is performed typically in a range from 300 degrees Celsius to 500 degrees Celsius) to be carried out in-situ within the same chamber as the process chamber employed for the silicon deposition without a vacuum break or exposure to any oxidant gas. It is believed that same chamber deposition of the silicon-containing layer 472 and the overlying tungsten layer in the same chamber without vacuum break and/or the elimination of interfacial oxidation, i.e., formation of a substantially oxygen free interface (less than 10 parts per billion in atomic concentration) considerably reduces the resistivity of tungsten and film stress.

Figure 20C:
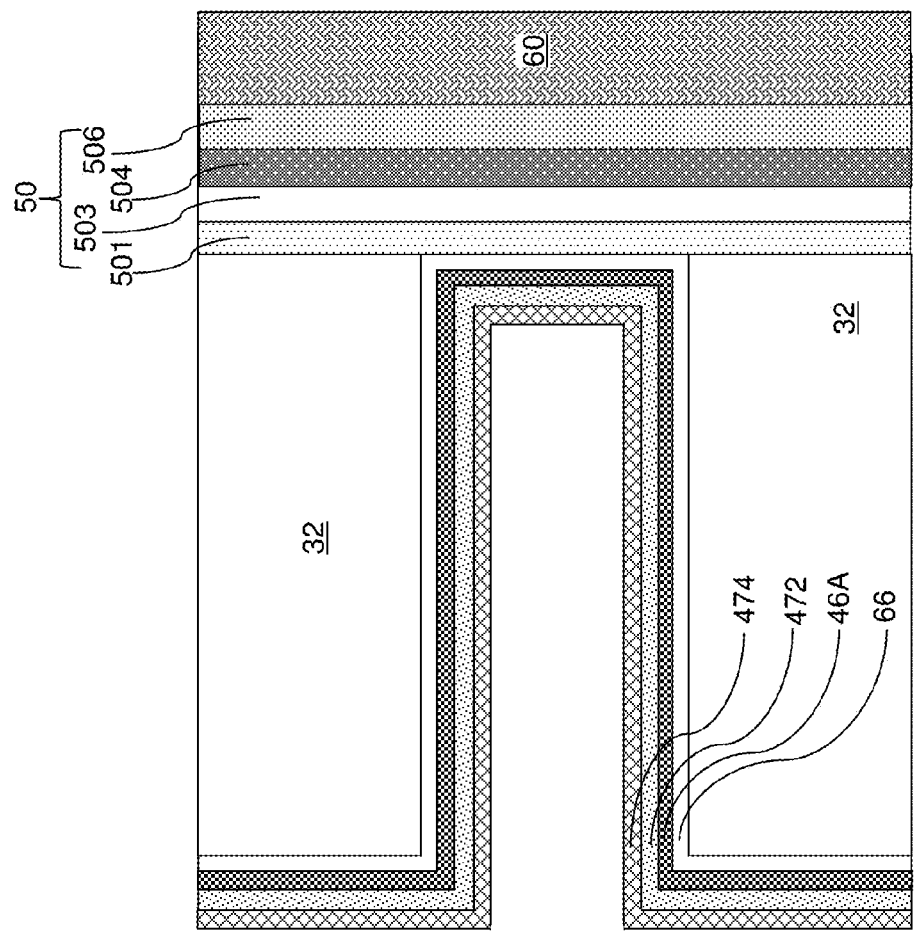

Referring to FIG. 20C, a metal silicide layer 474 including a silicide of at least one metallic element (e.g., pure metal or an alloy of the metal) can be formed in the backside recesses. The at least one metallic element can include, for example, nickel, cobalt, titanium, molybdenum, and/or tungsten.

In one embodiment, the metal silicide layer 474 by depositing a metallic element and inducing the silicidation of the deposited metallic element with at least a surface portion of the silicon-containing layer 472. For example, a first metallic element deposition process can deposit the metallic element to form a first deposited metallic element portion as a thin layer, and induce silicidation of the first deposited metallic material portion during deposition. The temperature of the first metallic element deposition process can be selected such that the silicidation proceeds or initiates upon deposition of the first deposited metallic material. In this case, the metal silicide layer 474 can be formed during first metallic element deposition process. Alternatively, the first metallic element can be deposited as a thin metal layer, and a subsequently anneal process can be performed to form the metal silicide layer 474 by reacting the metallic layer with the silicon-containing layer. The thickness of the metal silicide layer 474 can be in a range from 1 to 15 nm, such as 3 nm to 10 nm, although lesser and greater thicknesses can also be employed. The silicidation may, or may not, completely consume the silicon material. In other words, the silicon material may, or may not, remain in unsilicided form. One of the advantages of having a small amount of unreacted silicon on a metal nitride (such as titanium nitride or tungsten nitride) barrier layer is a reduction of fluorine diffusion to the memory stack structure to a level below detection limit. It is believed that a silicon interfacial layer reduces fluorine diffusion at least by a factor of 15 compared to a structure that is otherwise the same but lacks the silicon interfacial layer. Thus, the silicon interfacial layer can act as a secondary diffusion barrier layer. Even though the thin silicon interfacial layer occupies a finite volume that could otherwise be employed to increase the volume of tungsten, the benefit provided by the silicon interfacial layer in providing a secondary fluorine diffusion barrier and leading to formation of low resistivity tungsten outweighs the reduction in volume of the tungsten material caused by the presence of the interfacial silicon layer.

Alternatively, the metal silicide layer 474 may be deposited directly on a physically exposed surface of the silicon-containing layer 472 without consuming the silicon-containing layer 472. In this case, a silicon precursor gas and a metal precursor gas can be employed in the deposition process to deposit the metal silicide material in a chemical vapor deposition process or an atomic layer deposition (ALD) process. The silicon-containing layer 472 may be only partially consumed during the silicidation of at least a portion of the deposited metallic element, or may be fully consumed during the silicidation of the portion of the deposited metallic element. In one embodiment, the amorphous material of the silicon-containing layer 472 may be converted into nanocrystalline silicon-containing material (such as polysilicon) having an average grain size in a range from 1 nm to 5 nm, although lesser and greater average grains can also be formed.

Figure 20D:
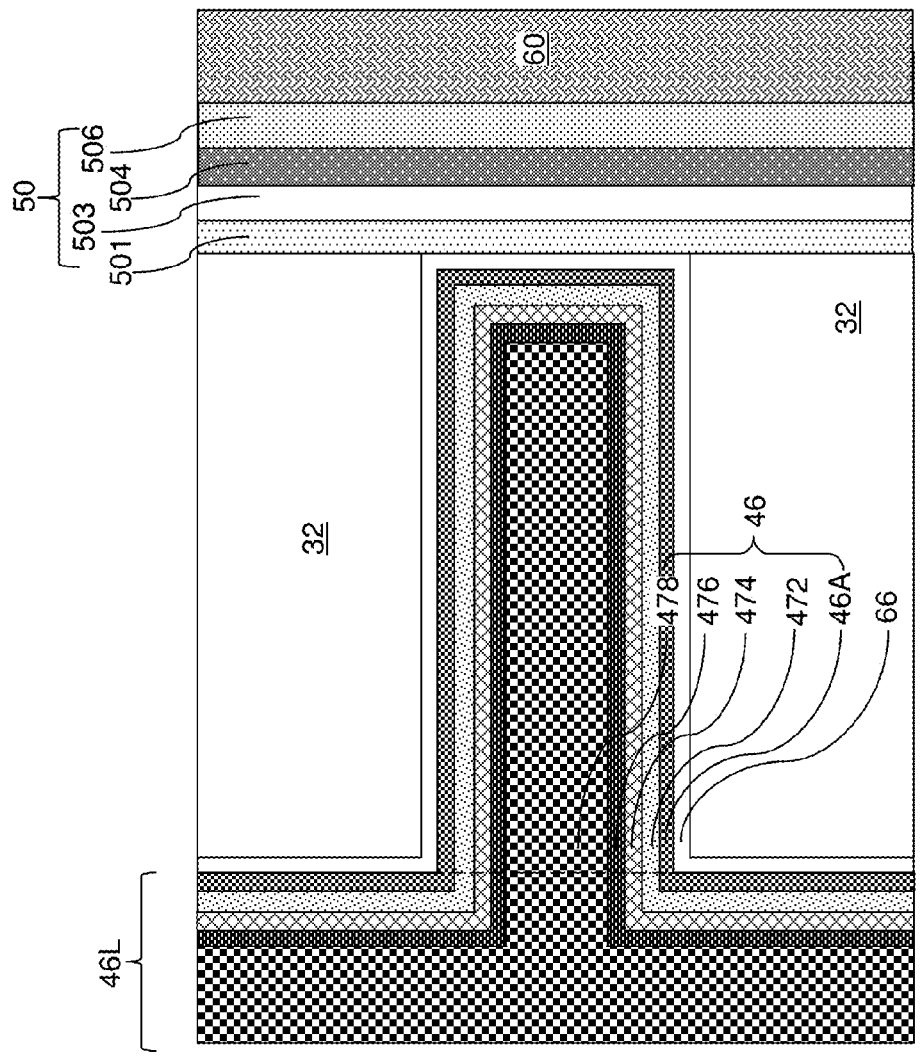

Referring to FIG. 20D, at least one second metallic element deposition process can be performed to deposit at least one additional metallic material. In one embodiment, the at least one second metallic element deposition process a second deposited metallic material potion including the same elemental metal as the first metallic element that is deposited in the first metallic element deposition process. At least one metal portion (476, 478) can be formed on the metal silicide layer 474 by deposition of at least one second metallic element by the at least one second metallic element deposition process.

The at least one metal portion (476, 478) can include a first metal portion 476 that is formed as a conformal metal layer and a second metal portion that fills remaining volumes of the backside recesses and is formed as a single continuous structure including vertically extending portions in the backside via trenches 79 and horizontally extending portions in the backside recesses. The first metal portion 476 can consist essentially of the first metallic element, which is the metallic element that is present within the metal silicide layer 474. In other words, the metal silicide layer 474 and the first metal portion 476 can comprise a same metallic element, which may be, for example, any of nickel, cobalt, titanium, molybdenum, and tungsten. The thickness of the first metal portion 476 can be in a range from 1 to 15 nm, such as 3 nm to 10 nm, although lesser and greater thicknesses can also be employed.

Generally, if the first metal portion 476 include the same elemental metal as the elemental metal in the silicide form within the metal silicide layer 474, the same deposition process can be employed to form the metal silicide layer and the first metal portion 476. By selecting a temperature that limits the thickness of the metal silicide material during deposition, a stack of the metal silicide layer 474 and the first metal portion 476 can be formed.

The second metal portion 478 can include any elemental metal that can be isotropically deposited to fill the remaining space after formation of the first metal portion 476 (which is formed as a conformal metal layer). The second metal portion 478 can include, and may consist essentially of, a metal selected from tungsten, cobalt, ruthenium, titanium, molybdenum, copper, aluminum, and combinations thereof.

In one embodiment, the metal silicide layer 474 can include tungsten silicide, and the first metal portion 476 can include fluorine-free tungsten that is deposited employing a fluorine-free tungsten precursor gas or a low fluorine tungsten deposition process. In one embodiment, the low fluorine tungsten deposition process comprises an ALD process in which tungsten hexafluoride pulses are alternated with hydrogen containing gas pulses, such as silane or diborane pulses. The hydrogen in the hydrogen containing gas purges at least a portion of the fluorine remaining from the tungsten hexafluoride pulses to form a first metal portion 476 comprising a low fluorine tungsten nucleation layer. In this case, the second metal portion 478 can be deposited by CVD employing a fluorine-containing tungsten precursor gas such as $WF_6$ on the tungsten nucleation layer. In this case, the second metal portion 478 has a higher fluorine concentration than the first metal portion (e.g., tungsten nucleation layer) 476. Alternatively, the second metal portion 478 can include a material different from tungsten such as cobalt or ruthenium.

The continuous portion of the layer stack of the conductive metal nitride layer 46A, the silicon-containing layer 472, the metal silicide layer 474, and the at least one metal portion (476, 478) located outside the backside recesses constitute a continuous conductive material layer 46L. Each portion of the layer stack of the conductive metal nitride layer 46A, the silicon-containing layer 472, the metal silicide layer 474, and the at least one metal portion (476, 478) located in a backside recess constitutes an electrically conductive layer 46. A combination of a metal silicide layer 474 and a metal portion (476 or 478) is formed in each of the backside recesses. Specifically, a combination of a metal silicide layer 474 and two metal portions (476, 478) is formed in each of the backside recesses. The at least one metal portion (476, 478) can consist essentially of at least one metallic element, which may be a single metallic element or a plurality of metallic elements. Unreacted portion(s) of the at least one metallic element constitute(s) the at least one metal portion (476, 478), while a reacted portion of the at least one metallic element is incorporated into the metal silicide layer 474.

According to an aspect of the present disclosure, the metal silicide layer 474 is formed as an amorphous structure or as nanocrystalline structure having an average grain size less than 3 nm, and preferably less than 1 nm. Such crystalline structures for the metal silicide layer 474 can be provided by forming the silicon-containing layer 472 as an amorphous material layer. The optional doping of the silicon-containing layer 472 with carbon and/or nitrogen results in a carbon and/or nitrogen doped metal silicide layer 474, which increases the temperature up to which these silicides remain amorphous or nanocrystalline. This is desirable both for forming low resistivity tungsten having a resistivity less than 20 Ohm-cm and also lowering fluorine diffusion due to reduction or elimination of grain boundaries up to much higher temperatures. Therefore, tungsten can be deposited at higher temperatures and/or annealed to a higher temperatures after deposition and still retain the amorphous structure of the underlying carbon and/or nitrogen doped metal silicide layer 474. For example, as described in J. S. Reid, et al., Thin Solid Films, 236 (1993) 319, the onset of crystallization for undoped tungsten silicide is about 550 C., and is increased up to 900 C. by nitrogen incorporation into the tungsten silicide.

The amorphous structure or the nanocrystalline structure of the metal silicide layer 474 induces formation of large grains in the at least one metal portion (476, 478) during a subsequent anneal process, which can be performed to induce growth of large grains in the at least one metal portion (476, 478). The absence of large crystalline template surface on the metal silicide layer 474 induces formation of large grains in the at least one metal portion (476, 478). In a non-limiting illustrative example, the average lateral dimension (i.e., the average diameter of a cylindrical volume that has the same as height as a corresponding grain) of the grains in segments of the second metal portion 478 located within the backside recesses can be in a range from 1.5 times the height of the segment of the second metal portion 478 to 6 times the height of the segment of the second metal portion 478. The second metal portion 478 can comprise a large grain tungsten layer having an average grain size greater than 40 nm, such as 50 to 100 nm, for example 60 to 90 nm, and a resistivity of less than 20 Ohm-cm, such as 15 to 18 Ohm-cm.

Figure 20E:
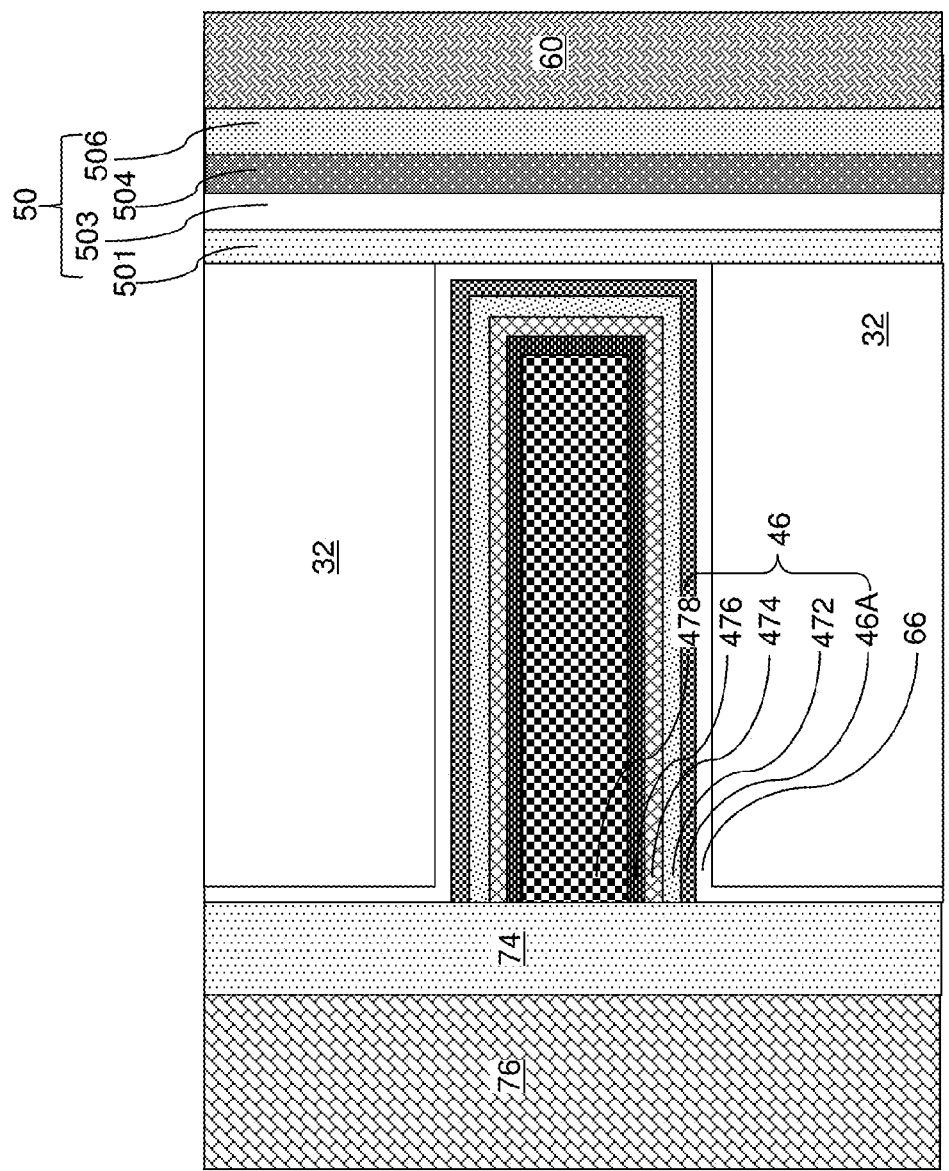

Referring to FIG. 20E, the continuous conductive material layer 46L can be removed from the periphery of the backside via trench 79 and from above the contact level dielectric layers (71, 73) by a recess etch, which may be an isotropic etch or an anisotropic etch. Subsequently, an insulating spacer and a backside contact via structure 76 can be formed in each backside via trench 79 by performing the processing steps of FIG. 18.

Figure 20F:
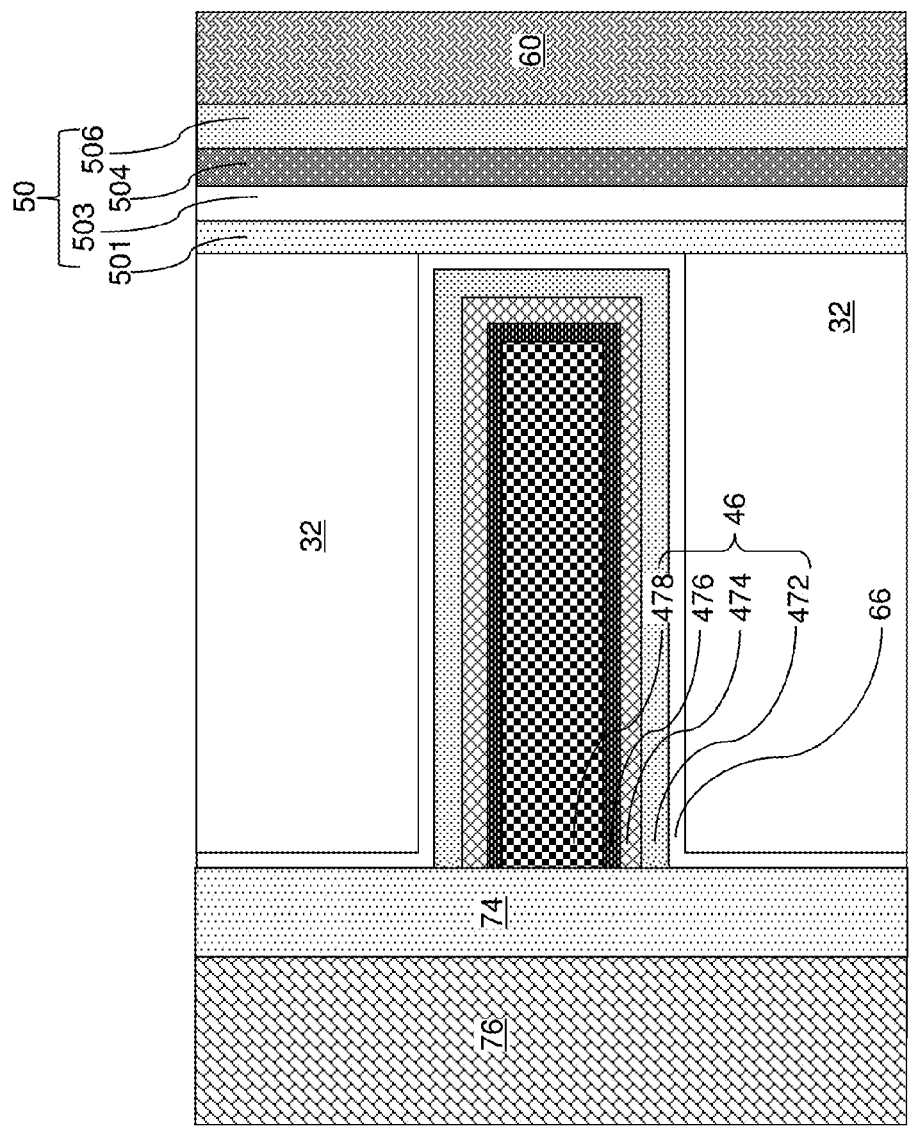
FIG. 20F is a vertical cross-sectional view of a region between a memory stack structure and a backside via trench in a variation of the eighth exemplary electrically conductive layer according to the eighth embodiment of the present disclosure.

Referring to FIG. 20F, an exemplary structure including a variation of the eighth exemplary electrically conductive layer 46 is illustrated according to the eighth embodiment of the present disclosure. The exemplary structure of FIG. 20F can be derived from the eighth exemplary electrically conductive layer 46 of FIG. 20E by omitting the processing steps for formation of the conductive metal nitride layer 46A. In this case, the silicon-containing layer 472 can be formed directly on the physically expose surfaces of the backside blocking dielectric layer 66 employing the processing steps of FIG. 20B.

Figure 20G:
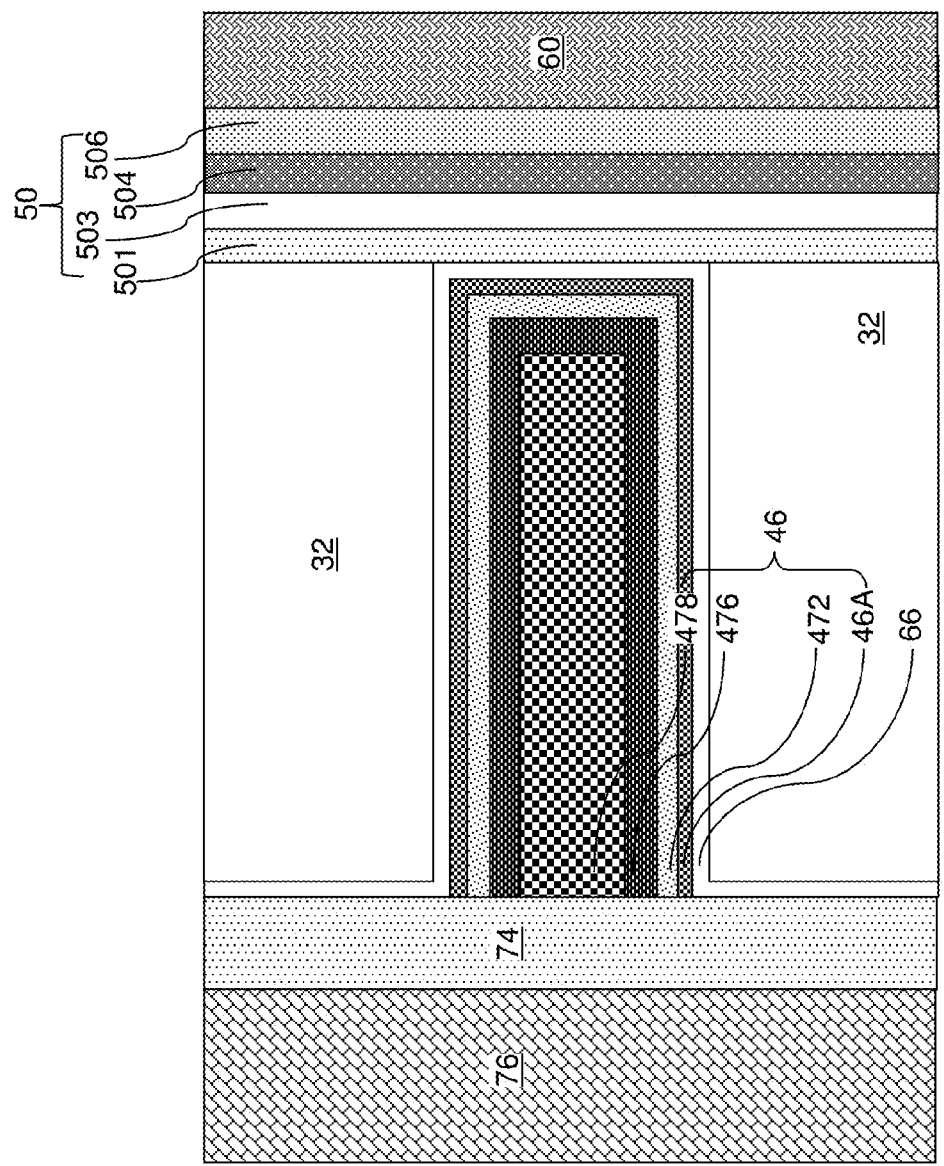
FIG. 20G is a vertical cross-sectional view of a region between a memory stack structure and a backside via trench in another variation of the eighth exemplary electrically conductive layer according to the eighth embodiment of the present disclosure.

Referring to FIG. 20G, an exemplary structure including another variation of the eighth exemplary electrically conductive layer 46 is illustrated according to the eighth embodiment of the present disclosure. The exemplary structure of FIG. 20G is an in-process structure, i.e., an intermediate structure that is subsequently changed. The structure of FIG. 20G can be formed by modifying the processing steps for forming the eighth exemplary electrically conductive layers 46. After the processing steps of FIG. 20B that forms the silicon-containing layer, a metallic element that forms the first metal portion 476 is deposited in the form of the metallic element without being silicided by the silicon-containing layer 472. For example, the temperature of the deposition process for depositing the metal element can be lower than a minimum temperature for silicide formation through reaction with the silicon atoms in the silicon-containing layer. In this case, the first metal portion 476 can be formed directly on the physically exposed surfaces of the silicon-containing layer 472.

The first metal portion 476 can be formed as a metal portion with an interface with the silicon-containing layer 472 in each of the backside recesses. A second metal portion 478 can be formed as described above. Subsequently, a metal silicide layer 474 can be formed by an anneal process that induces silicidation of surface regions of the first metal portion 476 (which may be a metal portion) by at least a portion of the silicon-containing layer 472. In one embodiment, the amorphous material of the silicon-containing layer 472 may be converted into nanocrystalline silicon-containing material (such as polysilicon) having an average grain size in a range from 1 nm to 5 nm during the anneal process, although lesser and greater average grains can also be formed. The silicon-containing layer 472 may be partially or fully consumed during the silicidation process. Subsequently, the continuous conductive material layer 46L can be removed from the periphery of the backside via trench 79 and from above the contact level dielectric layers (71, 73) by a recess etch, which may be an isotropic etch or an anisotropic etch. An insulating spacer and a backside contact via structure 76 can be formed in each backside via trench 79 by performing the processing steps of FIG. 18. The resulting structure can be the same as the structure illustrated in FIG. 20E. Optionally, the conductive metal nitride layer 46A may be omitted. In this case, the resulting structure may be the same as the structure illustrated in FIG. 20F.

Figure 21A:
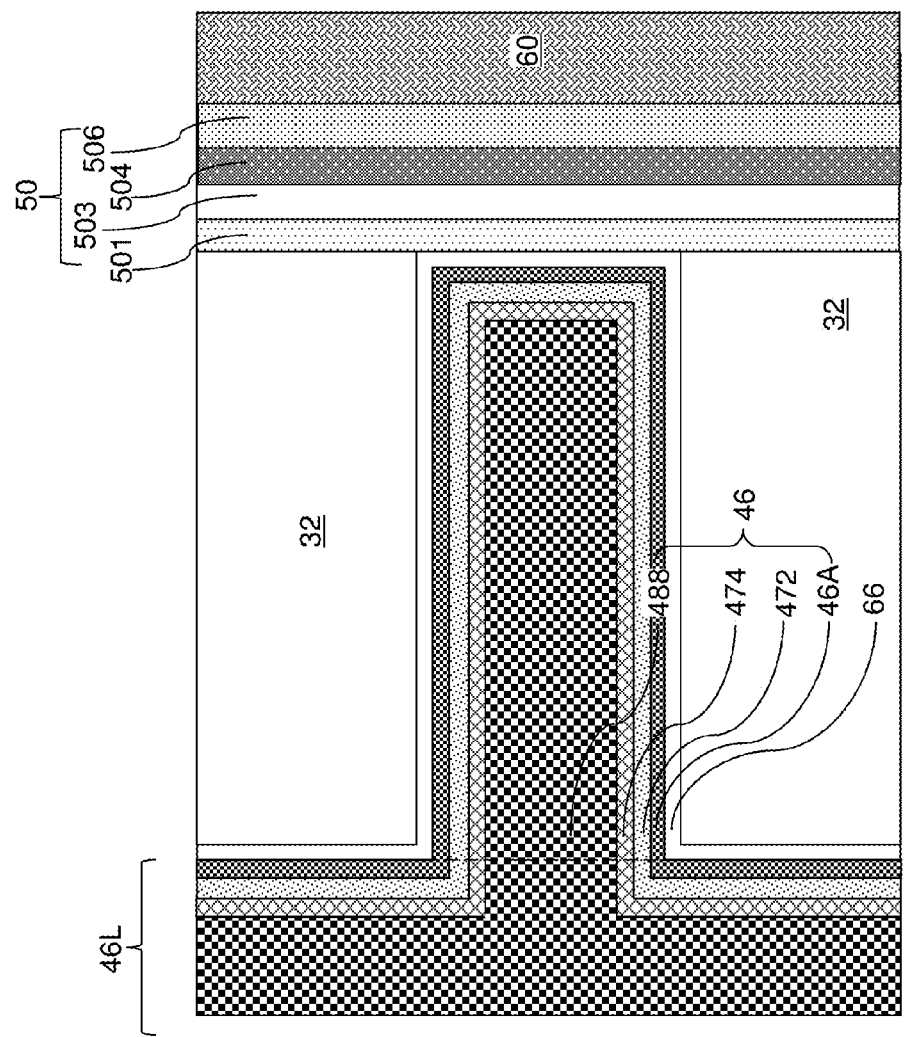
FIGS. 21A and 21B are sequential vertical cross-sectional views of a region between a memory stack structure and a backside via trench during formation of a ninth exemplary electrically conductive layer according to a ninth embodiment of the present disclosure.

Referring to FIG. 21A, an exemplary structure including a ninth exemplary electrically conductive layer is illustrated according to a ninth embodiment of the present disclosure. The exemplary structure of FIG. 21A can be derived from the exemplary structure of FIG. 20C by forming a metal portion 488 in lieu of a combination of a first metal portion 476 and a second metal portion 478. The metal portion 488 can have the same composition as the second metal portion 478. Thus, the exemplary structure of FIG. 21A can be formed by omitting formation of the first metal portion 476 at the processing steps of FIG. 20D, and by forming the metal portion 488 directly on the metal silicide layer 474.

The continuous portion of the layer stack of the conductive metal nitride layer 46A, the silicon-containing layer 472, the metal silicide layer 474, and the metal portion 488 located outside the backside recesses constitute a continuous conductive material layer 46L. Each portion of the layer stack of the conductive metal nitride layer 46A, the silicon-containing layer 472, the metal silicide layer 474, and the metal portion 488 located in a backside recess constitutes an electrically conductive layer 46. A combination of a metal silicide layer 474 and a metal portion 488 is formed in each of the backside recesses. The metal portion 488 can consist essentially of a single metallic element. An unreacted portion of the metallic element that is not consumed during the silicidation process constitutes the metal portion 488, while a reacted portion of the metallic element can be incorporated into the metal silicide layer 474.

According to an aspect of the present disclosure, the metal silicide layer 474 is formed as an amorphous structure or as nanocrystalline structure having an average grain size less than 3 nm, and preferably less than 1 nm. The amorphous structure of the nanocrystalline structure of the metal silicide layer 474 induces formation of large grains in the metal portion 488 during a subsequent anneal process, which can be performed to induce growth of large grains in the metal portion 488. The absence of large crystalline template surface on the metal silicide layer 474 induces formation of large grains in the metal portion 488. In a non-limiting illustrative example, the average lateral dimension (i.e., the average diameter of a cylindrical volume that has the same as height as a corresponding grain) of the grains in segments of the metal portion 488 located within the backside recesses can be in a range from 1.5 times the height of the segment of the metal portion 488 to 6 times the height of the segment of the metal portion 488. In one embodiment, the amorphous material of the silicon-containing layer 472 may be converted into nanocrystalline silicon-containing material (such as polysilicon) having an average grain size in a range from 1 nm to 5 nm during the anneal process, although lesser and greater average grains can also be formed. The segment of the metal portion 488 can comprise a large grain tungsten layer having an average grain size greater than 40 nm, such as 50 to 100 nm, for example 60 to 90 nm, and a resistivity of less than 20 Ohm-cm, such as 15 to 18 Ohm-cm.

Figure 21B:
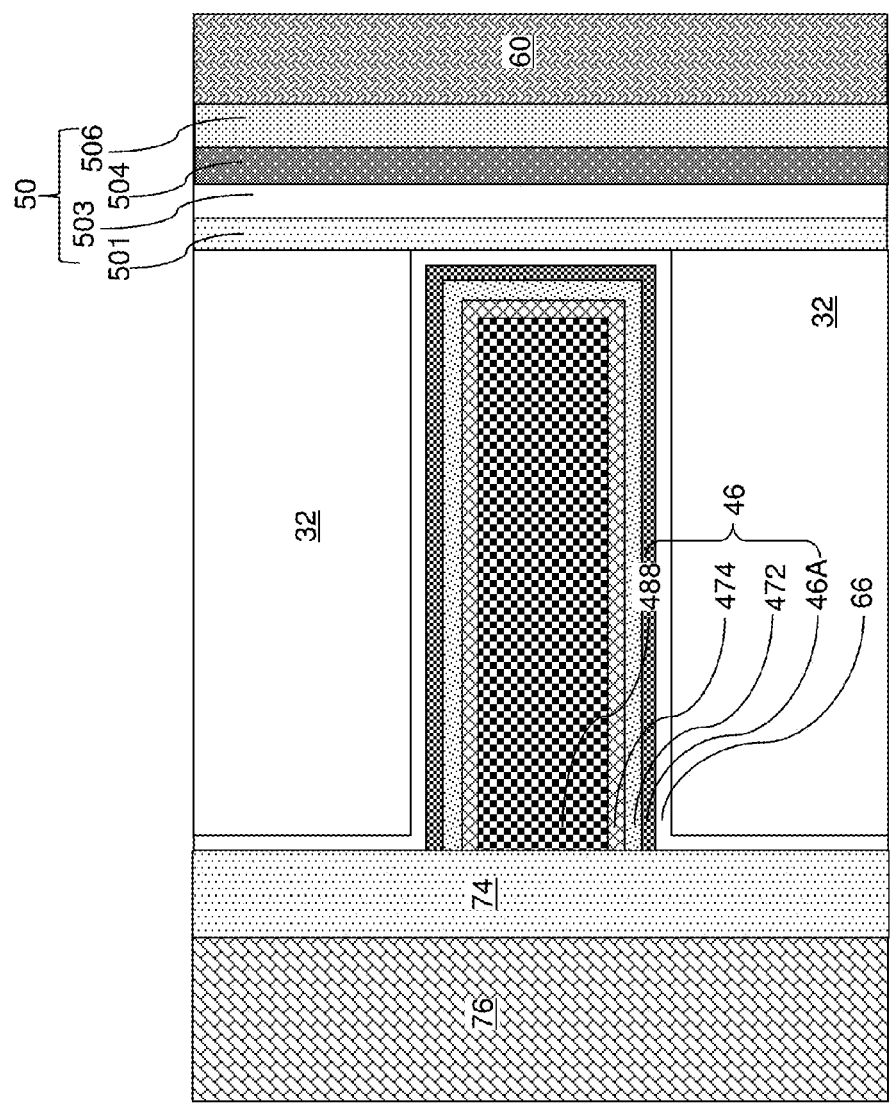

Referring to FIG. 21B, the continuous conductive material layer 46L can be removed from the periphery of the backside via trench 79 and from above the contact level dielectric layers (71, 73) by a recess etch, which may be an isotropic etch or an anisotropic etch. Subsequently, an insulating spacer and a backside contact via structure 76 can be formed in each backside via trench 79 by performing the processing steps of FIG. 18.

Figure 21C:
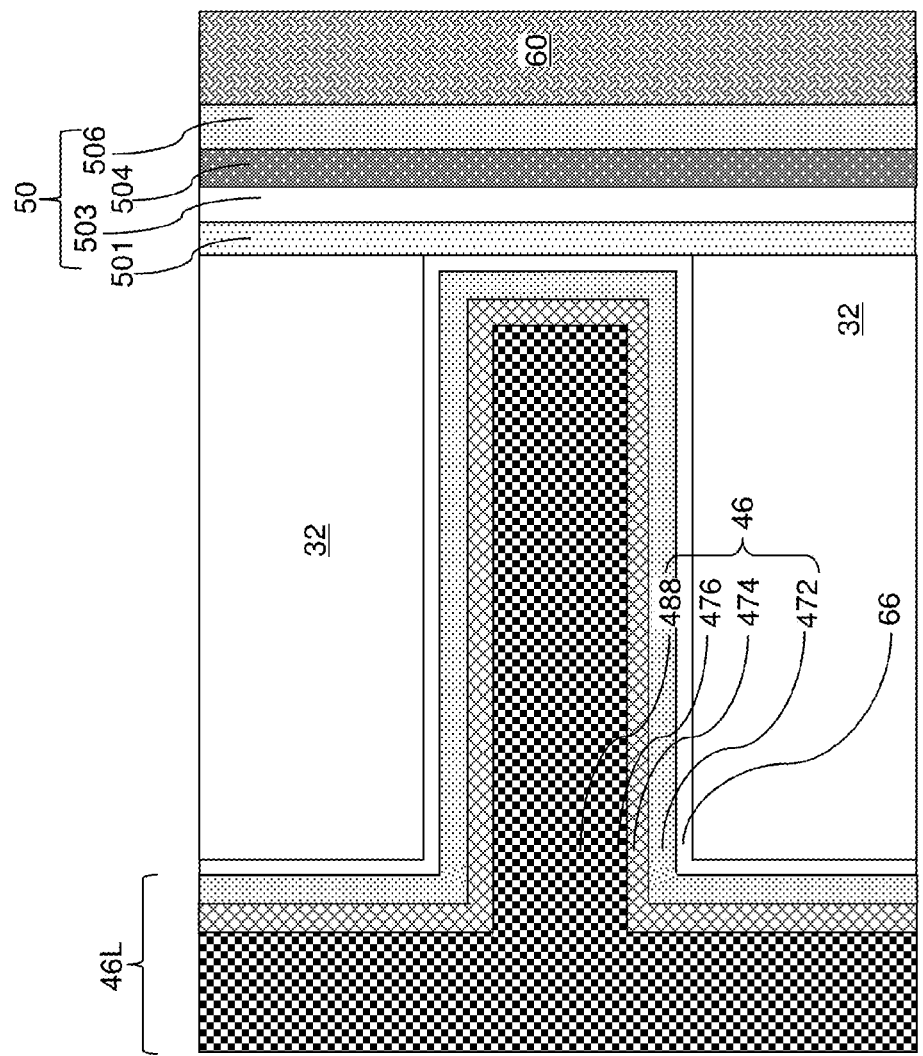
FIGS. 21C and 21D are sequential vertical cross-sectional views of a region between a memory stack structure and a backside via trench during formation of a variation of the ninth exemplary electrically conductive layer according to the ninth embodiment of the present disclosure.

Referring to FIG. 21C, an exemplary structure including a variation of the ninth exemplary electrically conductive layer 46 is illustrated according to the ninth embodiment of the present disclosure. The exemplary structure of FIG. 21C can be derived from the ninth exemplary electrically conductive layer 46 of FIG. 21A by omitting the processing steps for formation of the conductive metal nitride layer 46A. In this case, the silicon-containing layer 472 can be formed directly on the physically expose surfaces of the backside blocking dielectric layer 66 employing the processing steps of FIG. 20B.

Figure 21D:
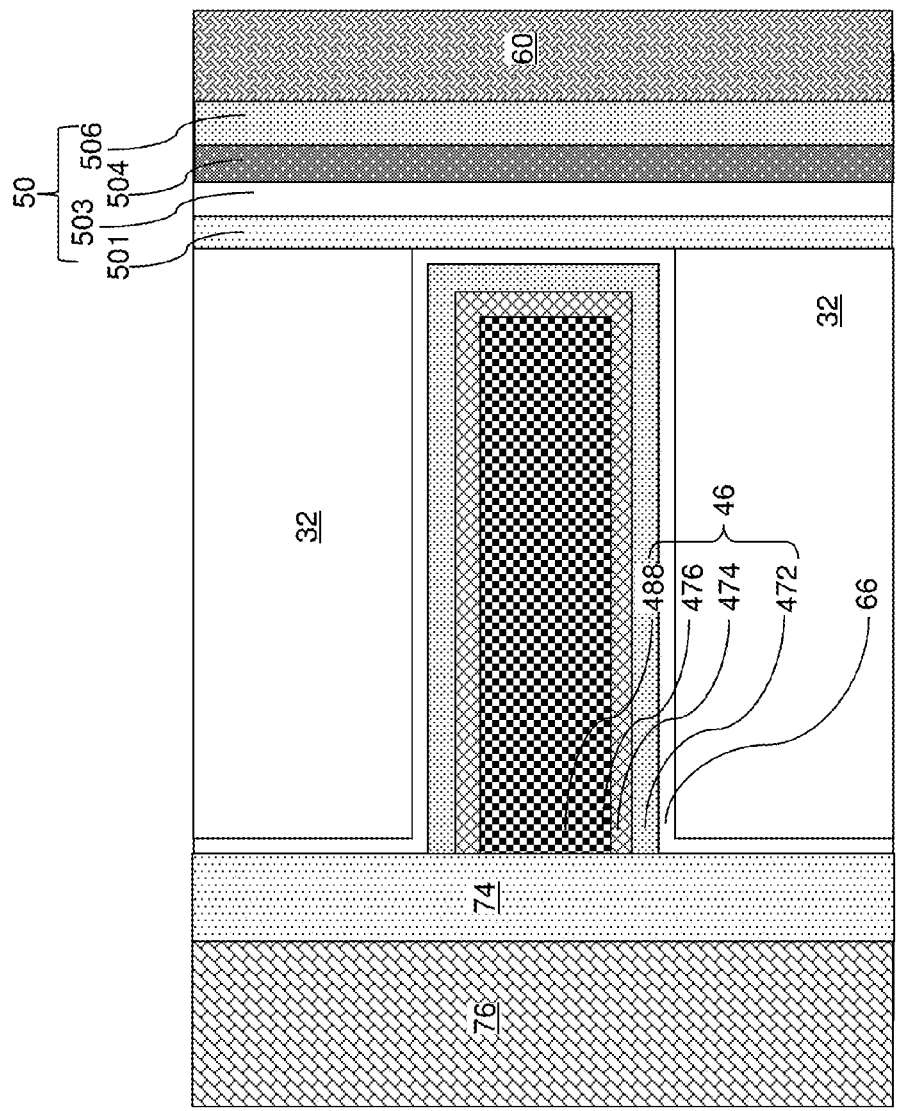

Referring to FIG. 21D, the continuous conductive material layer 46L can be removed from the periphery of the backside via trench 79 and from above the contact level dielectric layers (71, 73) by a recess etch, which may be an isotropic etch or an anisotropic etch. Subsequently, an insulating spacer and a backside contact via structure 76 can be formed in each backside via trench 79 by performing the processing steps of FIG. 18.

Figure 22A:
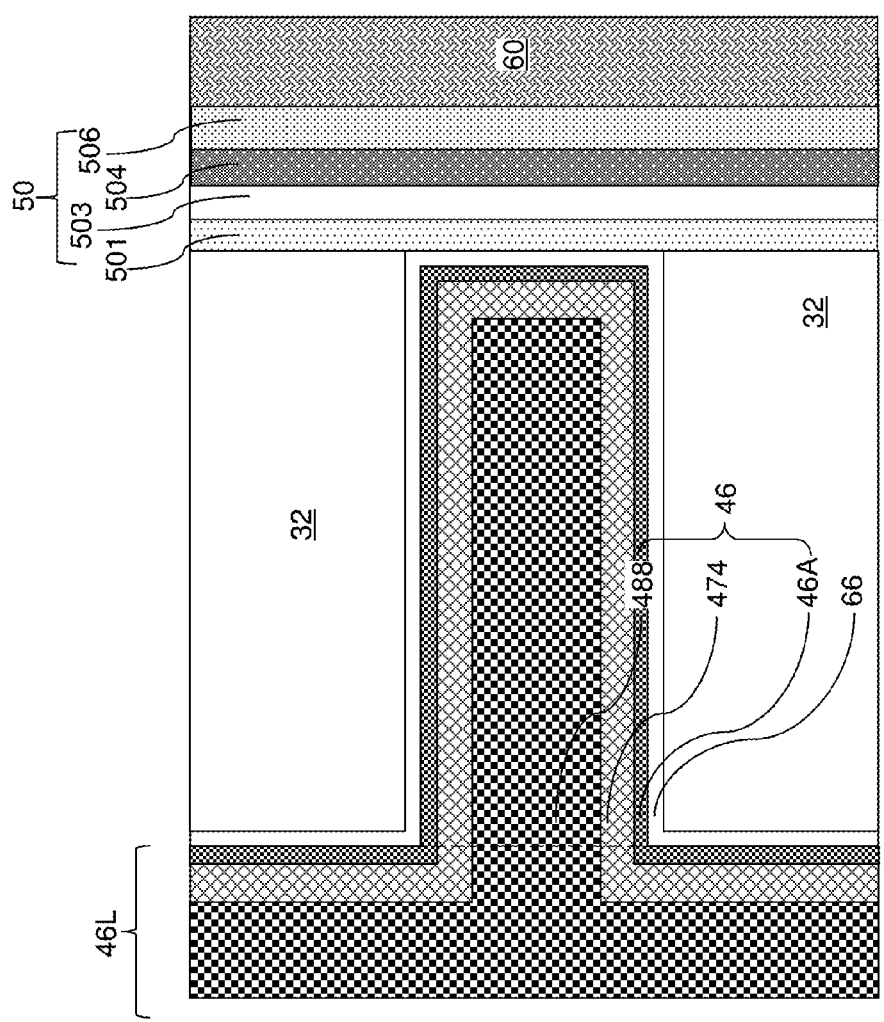
FIGS. 22A and 22B are sequential vertical cross-sectional views of a region between a memory stack structure and a backside via trench during formation of a tenth exemplary electrically conductive layer according to a tenth embodiment of the present disclosure.

Referring to FIG. 22A, an exemplary structure including a tenth exemplary electrically conductive layer 46 is illustrated according to a tenth embodiment of the present disclosure. In one embodiment, the exemplary structure of FIG. 22A can be derived from the exemplary structure of FIG. 21A by modifying the processing steps to induce complete silicidation of the silicon-containing layer 472. For example, the thickness of the silicon-containing layer and/or the temperature of the silicidation process can be adjusted to induce completer consumption of the silicon-containing layer 472. In this case, the metal silicide layer 474 can directly contact horizontal and vertical surfaces of the conductive metal nitride layer 46A. Alternatively, the exemplary structure of FIG. 22A can be derived from the exemplary structure of FIG. 20A by omitting the processing steps of FIG. 20B and by depositing a metal silicide layer 474 directly on the physically exposed surfaces of the conductive metal nitride layer 46A. Subsequently, a metal portion 488 can be formed as in the ninth exemplary structures. In an alternative embodiment, a combination of a first metal portion 476 and a second metal portion 478 can be formed in lieu of the metal portion 488 as in the eighth embodiment.

According to an aspect of the present disclosure, the metal silicide layer 474 is formed as an amorphous structure or as nanocrystalline structure having an average grain size less than 3 nm, and preferably less than 1 nm. The amorphous structure of the nanocrystalline structure of the metal silicide layer 474 induces formation of large grains in the metal portion 488 during a subsequent anneal process, which can be performed to induce growth of large grains in the metal portion 488. The absence of large crystalline template surface on the metal silicide layer 474 induces formation of large grains in the metal portion 488. In a non-limiting illustrative example, the average lateral dimension (i.e., the average diameter of a cylindrical volume that has the same as height as a corresponding grain) of the grains in segments of the metal portion 488 located within the backside recesses can be in a range from 1.5 times the height of the segment of the metal portion 488 to 6 times the height of the segment of the metal portion 488. The segment of the metal portion 488 can comprise a large grain tungsten layer having an average grain size greater than 40 nm, such as 50 to 100 nm, for example 60 to 90 nm, and a resistivity of less than 20 Ohm-cm, such as 15 to 18 Ohm-cm.

Figure 22B:
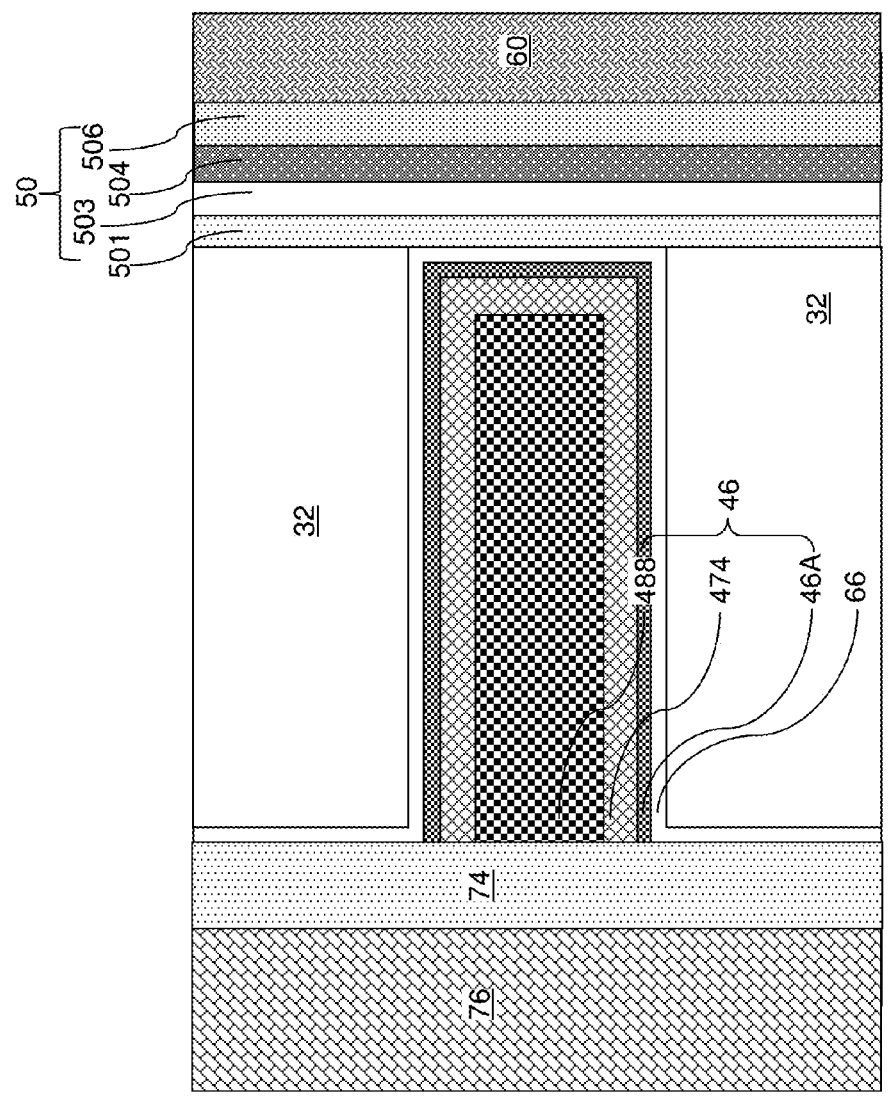

Referring to FIG. 22B, the continuous conductive material layer 46L can be removed from the periphery of the backside via trench 79 and from above the contact level dielectric layers (71, 73) by a recess etch, which may be an isotropic etch or an anisotropic etch. An insulating spacer and a backside contact via structure 76 can be formed in each backside via trench 79 by performing the processing steps of FIG. 18.

Figure 22C:
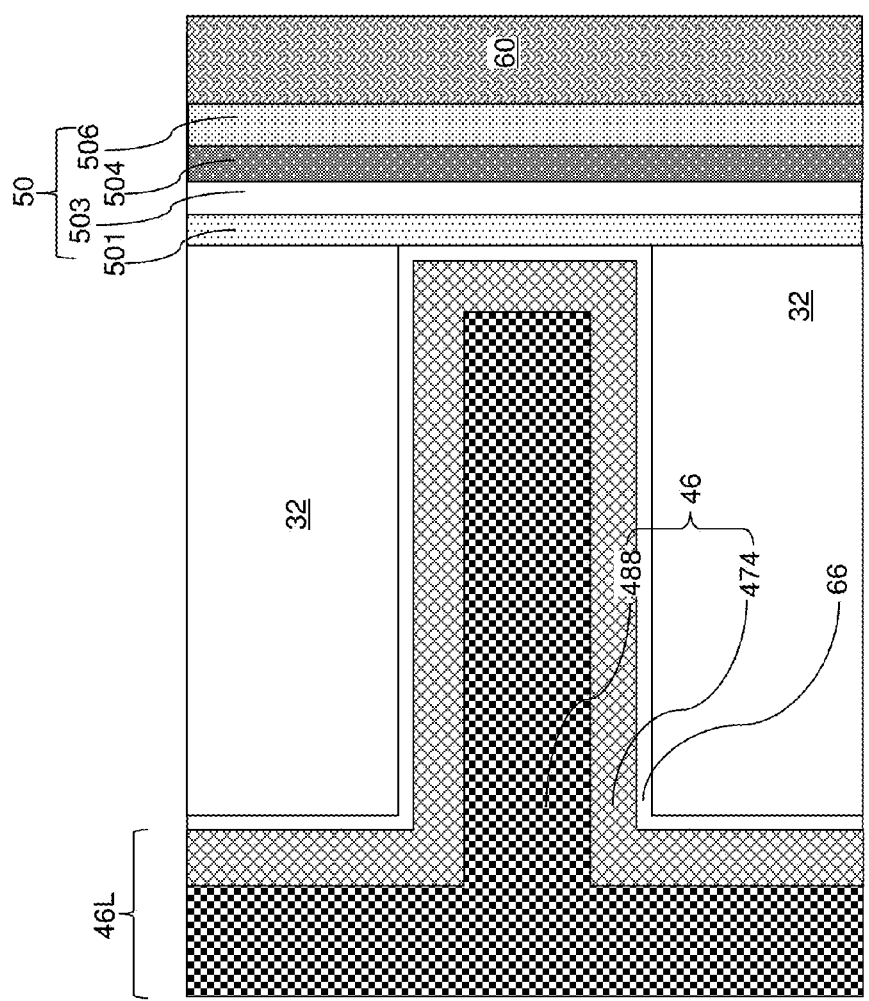
FIGS. 22C and 22D are sequential vertical cross-sectional views of a region between a memory stack structure and a backside via trench during formation of a variation of the tenth exemplary electrically conductive layer according to the tenth embodiment of the present disclosure.

Referring to FIG. 22C, an exemplary structure including a variation of the tenth exemplary electrically conductive layer 46 can be derived from the exemplary structure of FIG. 22A by omitting formation of the conductive metal nitride layer 46A. In this case, the silicon-containing layer 472 can be formed directly on the backside blocking dielectric layer 66 as illustrated in FIG. 21C, and can be completely consumed during formation of the metal silicide layer 474. The thickness of the silicon-containing layer 472 and/or the temperature of the silicidation process can be adjusted to induce completer consumption of the silicon-containing layer 472. In this case, the metal silicide layer 474 can directly contact horizontal and vertical surfaces of the backside blocking dielectric layer 66.

Alternatively, the exemplary structure of FIG. 22C can be derived from the exemplary structure of FIG. 20A by omitting formation of the conductive metal nitride layer 46A and by depositing a metal silicide layer 474 directly on the physically exposed surfaces of the backside blocking dielectric layer 66. Subsequently, a metal portion 488 can be formed as in the ninth exemplary structures. In an alternative embodiment, a combination of a first metal portion 476 and a second metal portion 478 can be formed in lieu of the metal portion 488 as in the eighth embodiment.

Figure 22D:
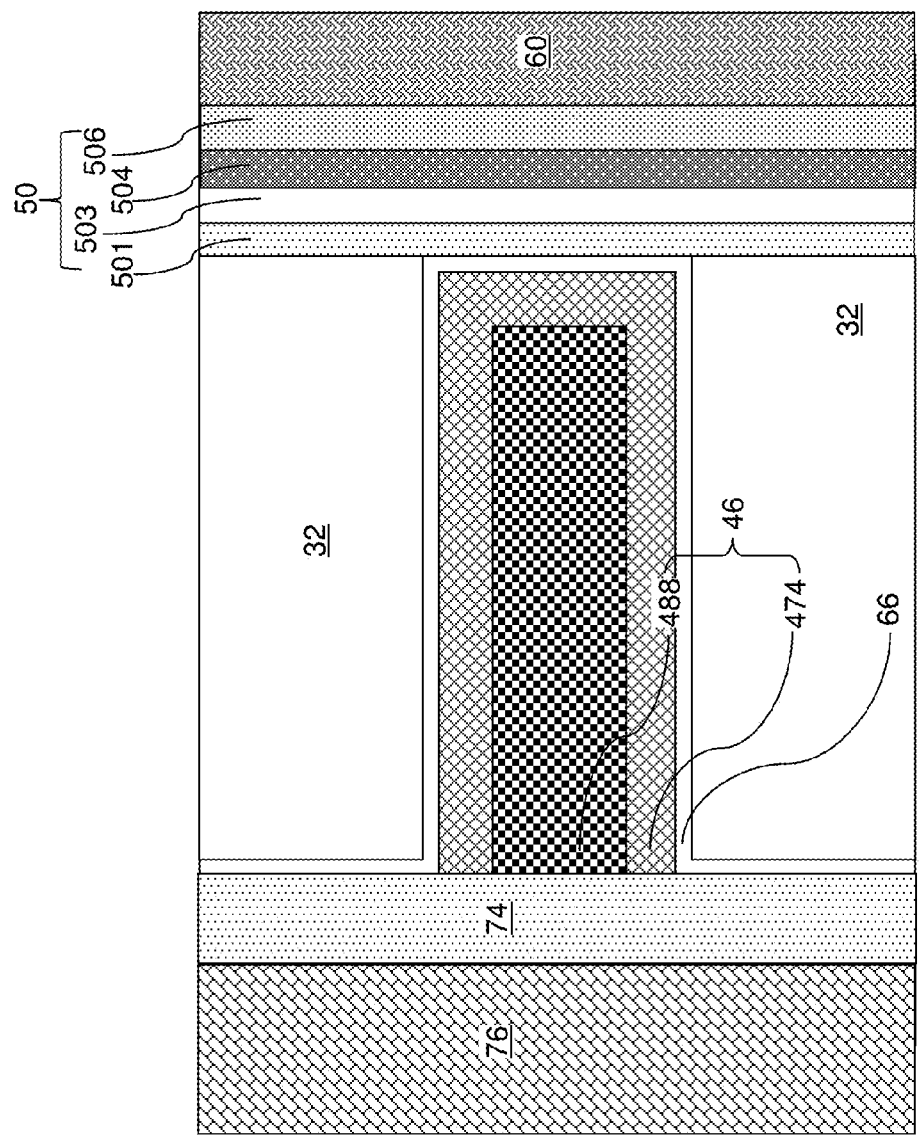

Referring to FIG. 22D, the continuous conductive material layer 46L can be removed from the periphery of the backside via trench 79 and from above the contact level dielectric layers (71, 73) by a recess etch, which may be an isotropic etch or an anisotropic etch. An insulating spacer and a backside contact via structure 76 can be formed in each backside via trench 79 by performing the processing steps of FIG. 18.

FIGS. 23A-23G illustrate a region between a memory stack structure 55 and a backside via trench during formation of an eleventh exemplary electrically conductive layer according to an eleventh embodiment of the present disclosure.

Figure 23A:
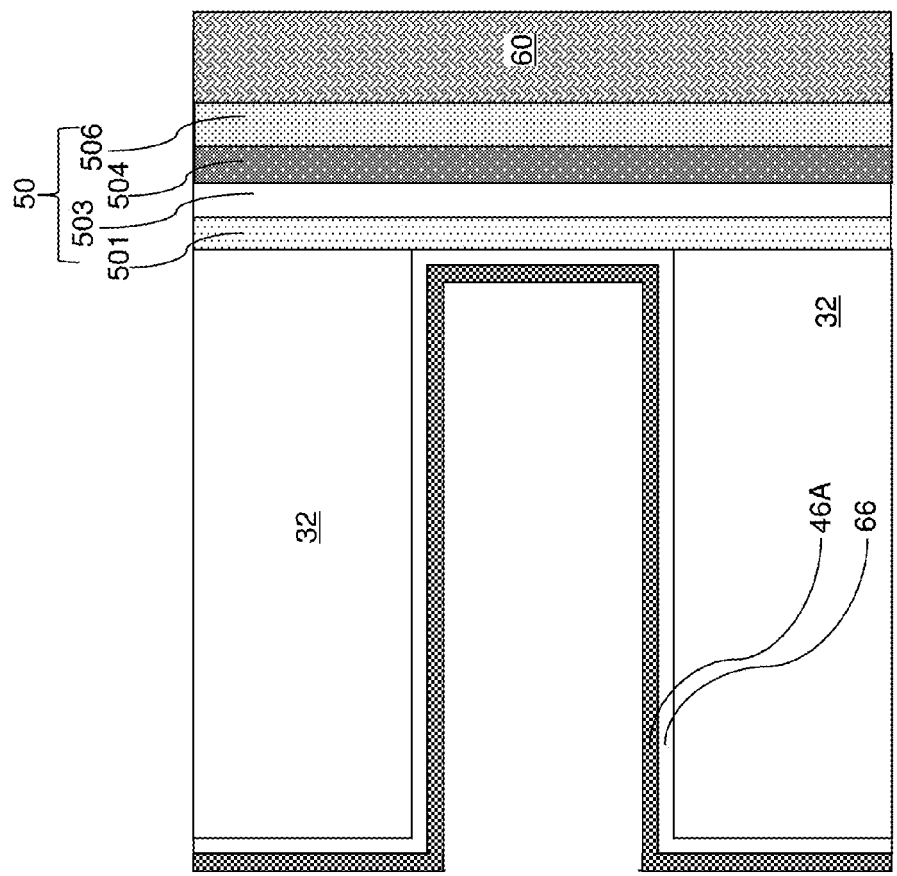
FIGS. 23A-23G are sequential vertical cross-sectional views of a region between a memory stack structure and a backside via trench during formation of an eleventh exemplary electrically conductive layer according to an eleventh embodiment of the present disclosure.

Referring to FIG. 23A, the exemplary structure for forming the eleventh exemplary electrically conductive layer can be the same as the exemplary structure illustrated in FIG. 20A. The metal nitride layer 46A can be formed by a conformal deposition process as described above.

Figure 23B:
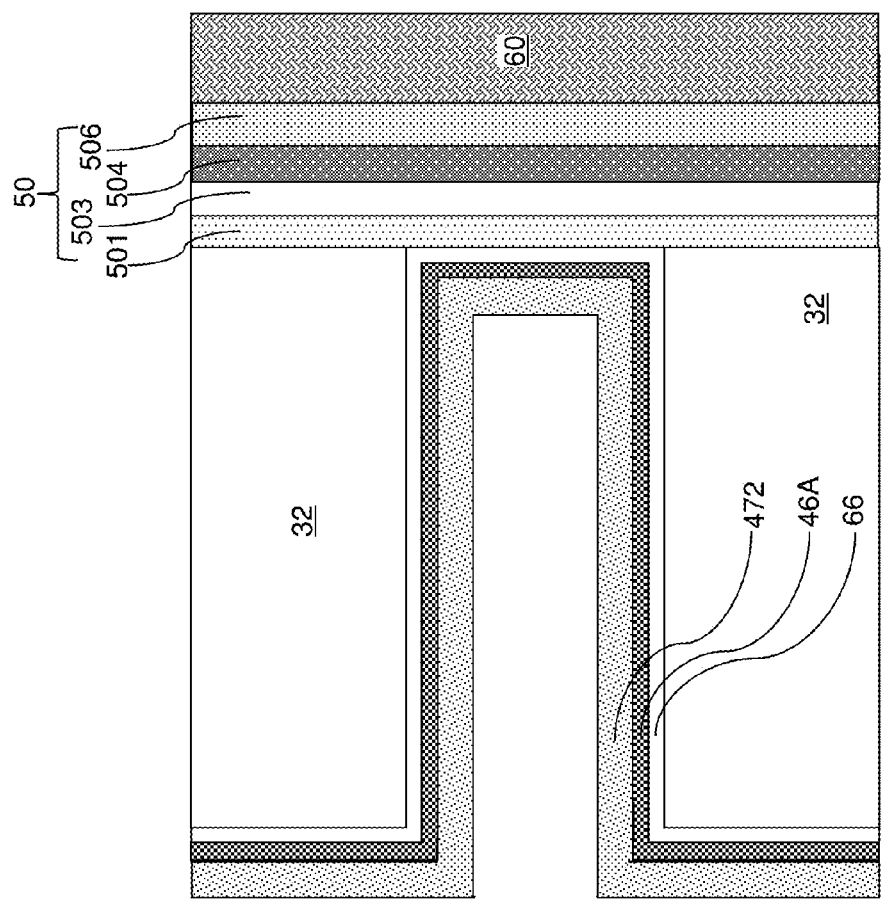

Referring to FIG. 23B, a silicon-containing layer 472 can be deposited on the conductive metal nitride layer 46A in each of the backside recesses and at a periphery of each backside via trench 79 by a conformal deposition process. The silicon-containing layer 472 can have the same composition as the silicon-containing layer 472 of the eighth through tenth embodiments, and can be formed employing same processing steps. In one embodiment, the silicon-containing layer 472 can consist essentially of an intrinsic silicon-containing semiconductor material or a doped silicon-containing semiconductor material. In one embodiment, the silicon-containing layer 472 can include undoped or doped amorphous silicon. The thickness of the silicon-containing layer 472 can be in a range from 1 to 15 nm, such as 3 nm to 10 nm, although lesser and greater thicknesses can also be employed.

Figure 23C:
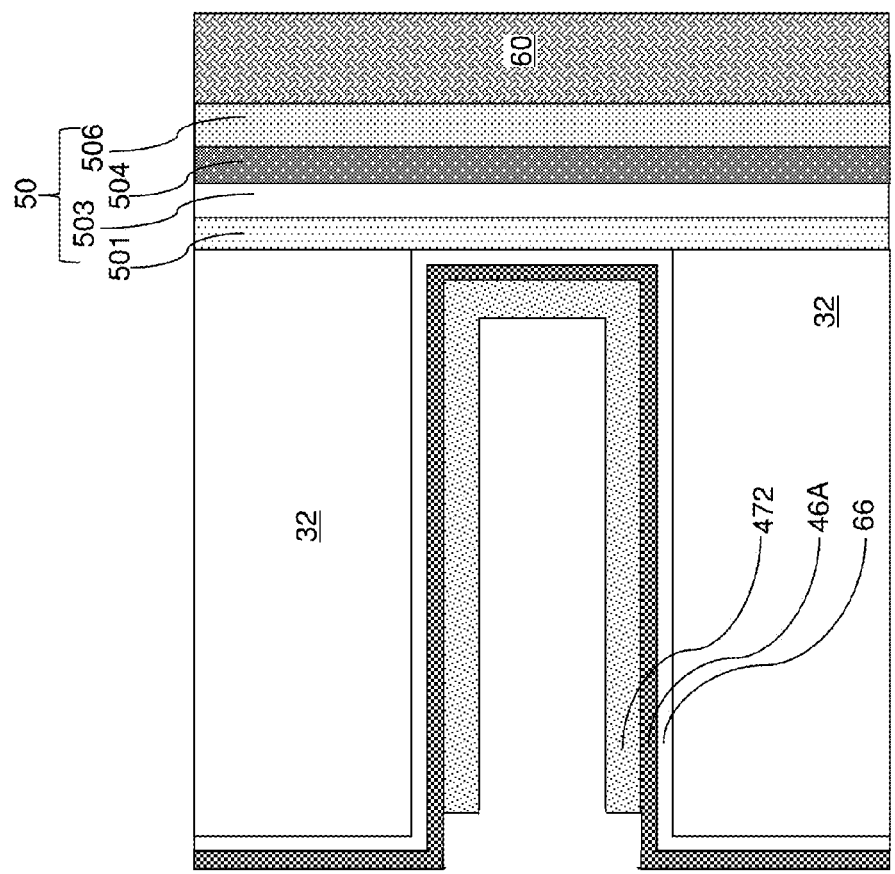

Referring to FIG. 23C, an anisotropic etch process that etches the material of the silicon-containing layer 472 selective to the material of the metal nitride layer 46A can be performed to remove vertical portions of the silicon-containing layer 472 from inside each backside via trench 79. The silicon-containing layer 472 is removed from the periphery of each backside via trench 79, while a remaining portion of the silicon-containing layer 472 is present in each of the backside recesses. In one embodiment, the anisotropic etch process can have a small isotropic etch component to laterally recess remaining portions of the silicon-containing layer 472 from a vertical plane including a most proximal sidewall of the backside via trench 79, i.e., the vertical interface between the insulating layers 32 and the backside blocking dielectric layer 66 or, in case the backside blocking dielectric layer 66 is not employed, the vertical interface between the insulating layers 32 and the vertical portions of the metal nitride layer 46A. The recess distance between the sidewalls of the remaining portions of the silicon-containing layer 472 and the vertical plane including the most proximal sidewall of the backside via trench 79 can be in a range from 3 nm to 30 nm, although lesser and greater recess distances can also be employed.

Figure 23D:
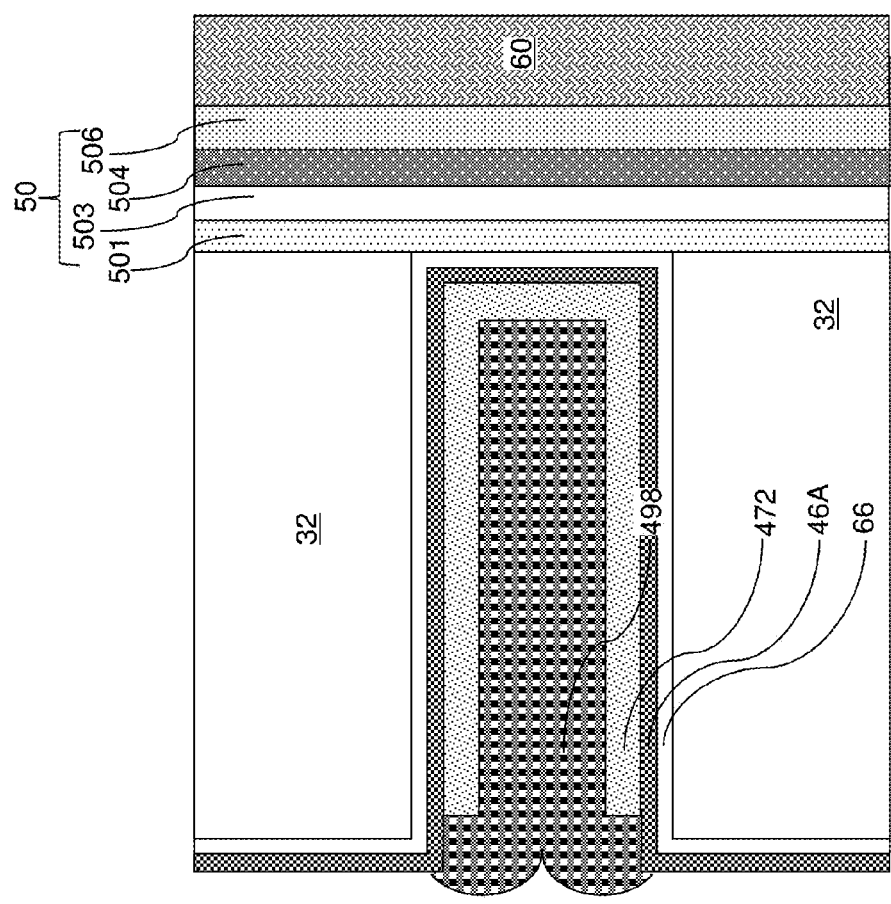

Referring to FIG. 23D, a metallic element can be deposited by a selective metal deposition process on the surfaces of the silicon-containing layer 472. The selective metal deposition process can include a chemical vapor deposition process and/or a selective atomic layer deposition process. The selective metal deposition process deposits the metallic element on the surface of the remaining portion of the silicon-containing layer 472 at a greater deposition rate than on physically exposed surfaces in the backside via trench 79 such as the surfaces of the metal nitride layer 46A.

For example, cobalt deposited by a metal-organic chemical vapor deposition process can have different nucleation rates on different surfaces. Nucleation of cobalt proceeds rapidly on surfaces of silicon, while nucleation of cobalt is delayed significantly on metallic nitride surfaces such as surfaces of titanium nitride. Further, nucleation of cobalt is slower on surfaces of silicon oxide, titanium oxide, aluminum oxide, and WCN relative to nucleation of cobalt on silicon. In an illustrative example, less than 10 nm of cobalt can be deposited on the surfaces of titanium nitride while more than 20 nm of cobalt is deposited on the surfaces of silicon. Other elemental metals can be employed for the selective metal deposition process provided that such elemental metals display delayed nucleation characteristics on the surfaces of the metal nitride layer 46A (or surfaces of the backside blocking dielectric layer 66 or surfaces of the insulating layers 32) relative to the surfaces of the silicon-containing layer 472.

In one embodiment, the height of each cavity in the backside recesses (as measured by the separation distance between the upper horizontal portion and the lower horizontal portion of each portion of the silicon-containing layer 472) can be small enough so that each metal portion 498 deposited by the selective metal deposition process grows only from the surfaces of the silicon-containing layer 472, and does not grow from the surfaces of the metal nitride layer 46A. In one embodiment, the height of each cavity in the backside recesses can be in a range from 8 nm to 24 nm, such as from 10 nm to 20 nm.

In another embodiment, an etchant can be intermittently flowed one or more times between flow of the reactant(s) during the selective metal deposition process to etch any nucleation sites from the surfaces of the metal nitride layer 46A to prevent deposition of the metallic element during the selective metal deposition process. In yet another embodiment, an etchant can be flowed concurrently with the flow of the reactant(s) to continually remove nucleation sites from the surfaces of the metal nitride layer 46A to prevent deposition of the metallic element during the selective metal deposition process.

Thus, the selective metal deposition process can grow material portions of the metallic element from the surfaces of the silicon-containing layer 472 without growing the metallic element from surfaces of the metal nitride layer 46A. In one embodiment, two portions of the deposited elemental metal that grow from the upper horizontal portion of a silicon-containing layer 472 and from the lower horizontal portion of the silicon-containing layer 472 can merge at a periphery of the backside via trench 79 to form two convex surfaces that are adjoined at a horizontal seam.

Figure 23E:
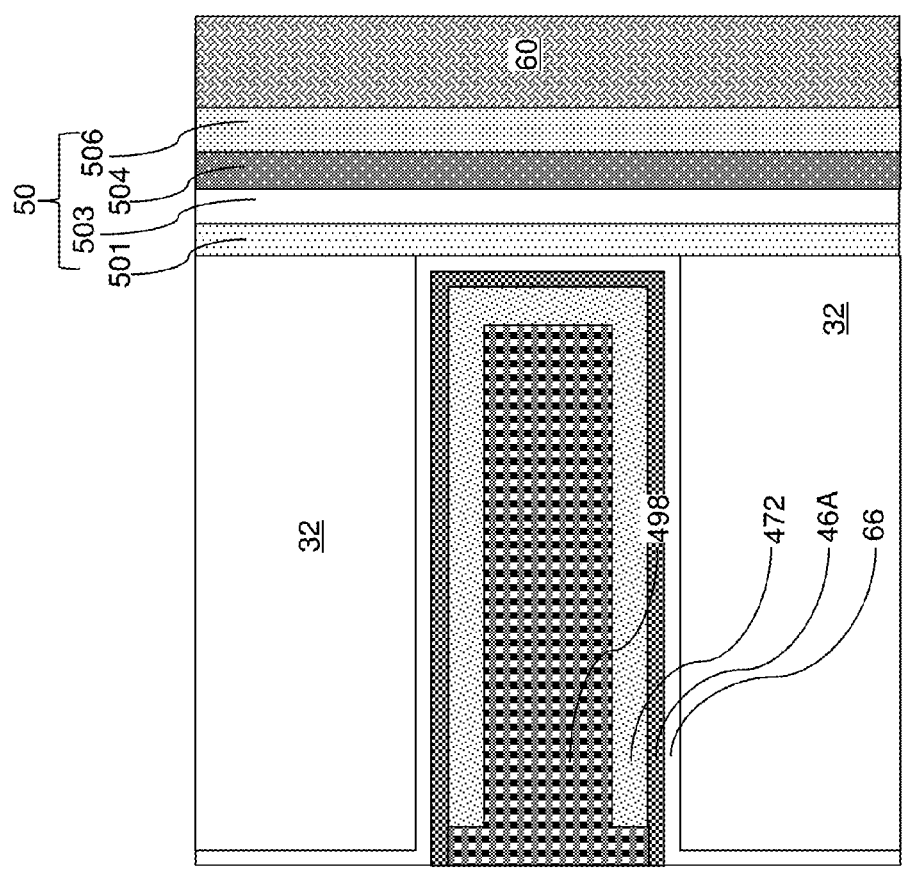

Referring to FIG. 23E, portions of the metal nitride layer 46A at the periphery of the backside via trench 79 can be removed by an etch process. In one embodiment, the etch process can be an isotropic etch process (such as a wet etch process) or an anisotropic etch process (such as a reactive ion etch process) that removes the material of the metal nitride layer 46A selective to the material of the backside blocking dielectric layer 66. Alternatively, in case the etch process collaterally removes the material of the backside blocking dielectric layer 66, the etch process can be selective to the dielectric material of the insulating layers 32.

In one embodiment, the region of each metal portion 498 that protrudes into the backside via trench 79 can be collaterally removed during removal of the metal nitride layer 46A from inside the backside via trench 79. In one embodiment, an anisotropic etch process may be employed to remove the protruding regions of the metal portions 498, each metal portion 498 can have a planar vertical sidewall that faces the backside via trench 79. In one embodiment, the planar vertical sidewalls of the metal portions 498 can be vertically coincident with the sidewalls of the backside blocking dielectric layer 66. In case the backside blocking dielectric layer 66 is not employed, the planar vertical sidewalls of the metal portions 498 can be vertically coincident with the sidewalls of the insulating layers 32. If an isotropic etch process is employed, each metal portion 498 can have a pair of convex sidewalls that are adjoined to each other at a horizontally extending seam.

Alternatively, the metal portions 498 can be formed by a non-selective deposition of an elemental metal, and an etch process that removes the segments of the elemental metal that are deposited within the backside via trenches 79 by an isotropic etch or an anisotropic etch.

Each backside recess can be completely filled with a combination of a backside blocking dielectric layer 66, a metal nitride layer 46A, a silicon-containing layer 472, and a metal portion 498, which may be, for example, a cobalt portion. The metal portions 498 are formed as discrete structures that are vertically spaced among one another. As discrete structures, physical separation of the metal portions 498 is not necessary. The methods of the present disclosure can provide a recess-free metal fill process that forms the metal portions 498 as discrete material portions.

Figure 23F:
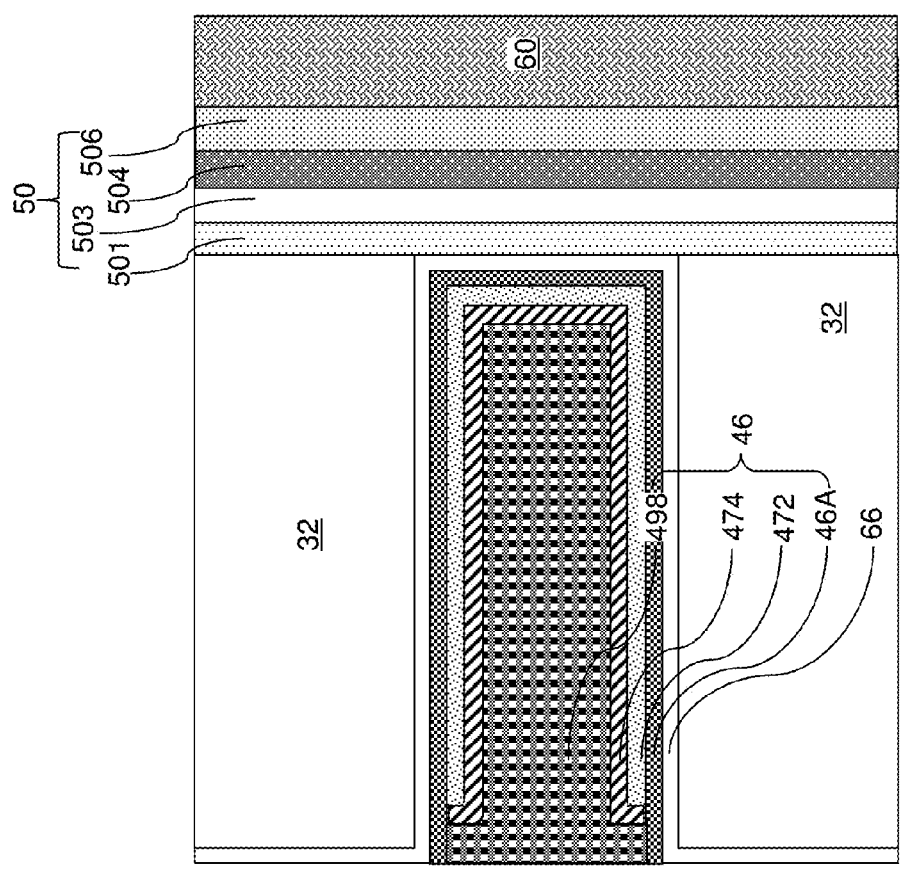

Referring to FIG. 23F, an anneal process can be optionally performed to increase the grain size in each metal portion 498. According to an aspect of the present disclosure, the silicon-containing layer 472 can include an amorphous silicon-containing material such as amorphous silicon. The amorphous structure of the silicon-containing layer 472 induces formation of large grains in the metal portion 498 during the anneal process, which can be performed to induce growth of large grains in the metal portion 498. The absence of large crystalline template surface in the silicon-containing layer 472 induces formation of large grains in the metal portion 488. In a non-limiting illustrative example, the average lateral dimension (i.e., the average diameter of a cylindrical volume that has the same as height as a corresponding grain) of the grains in segments of the metal portion 498 located within the backside recesses can be in a range from 1.5 times the height of the segment of the metal portion 498 to 6 times the height of the segment of the metal portion 498.

The anneal process that induces growth of the grain size in the metal portions 498 can collaterally induce formation of a metal silicide material at the interface with the silicon-containing layer 472. A metal silicide layer 474 can be collaterally formed. The thickness of the metal silicide layer 474 depends on the duration and temperature of the silicidation anneal process. In one embodiment, only a surface portion of the silicon-containing layer 472 may be consumed during formation of the metal silicide layer 474, such as a cobalt silicide layer.

In one embodiment, the nitrogen atoms of the metal nitride layer 46A can diffuse into the silicon-containing layer 472 during the anneal process. The presence of the nitrogen atoms from the metal nitride layer 46A in the silicon-containing layer 472 can retard growth of grains in the silicon-containing layer 472 during the anneal process. In one embodiment, the atomic concentration of nitrogen atoms in the silicon containing layer 472 may be in a range from 0.5% to 20%, such as from 5% to 15%. In another embodiment, the metal atoms from the metal nitride layer 46A, such as tungsten atoms from WN or WCN metal nitride layer 46A react with the silicon atoms from the silicon-containing layer 472 to convert all or part of the silicon-containing layer 472 to the metal silicide layer 474, such as a tungsten silicide layer.

In one embodiment, the amorphous material of the silicon-containing layer 472 may be converted into nanocrystalline silicon-containing material (such as polysilicon) having an average grain size in a range from 1 nm to 5 nm, although lesser and greater average grains can also be formed. Each combination of adjacent metal nitride layer 46A, silicon-containing layer 472, metal silicide layer 474, and metal portion 498 constitutes an electrically conductive layer 46 (e.g., word line/control gate electrode of a three dimensional NAND memory device). Alternatively, the electrically conductive layer 46 may exclude the silicon-containing layer 472 if this layer is entirely consumed during formation of the metal silicide layer 474.

Figure 23G:
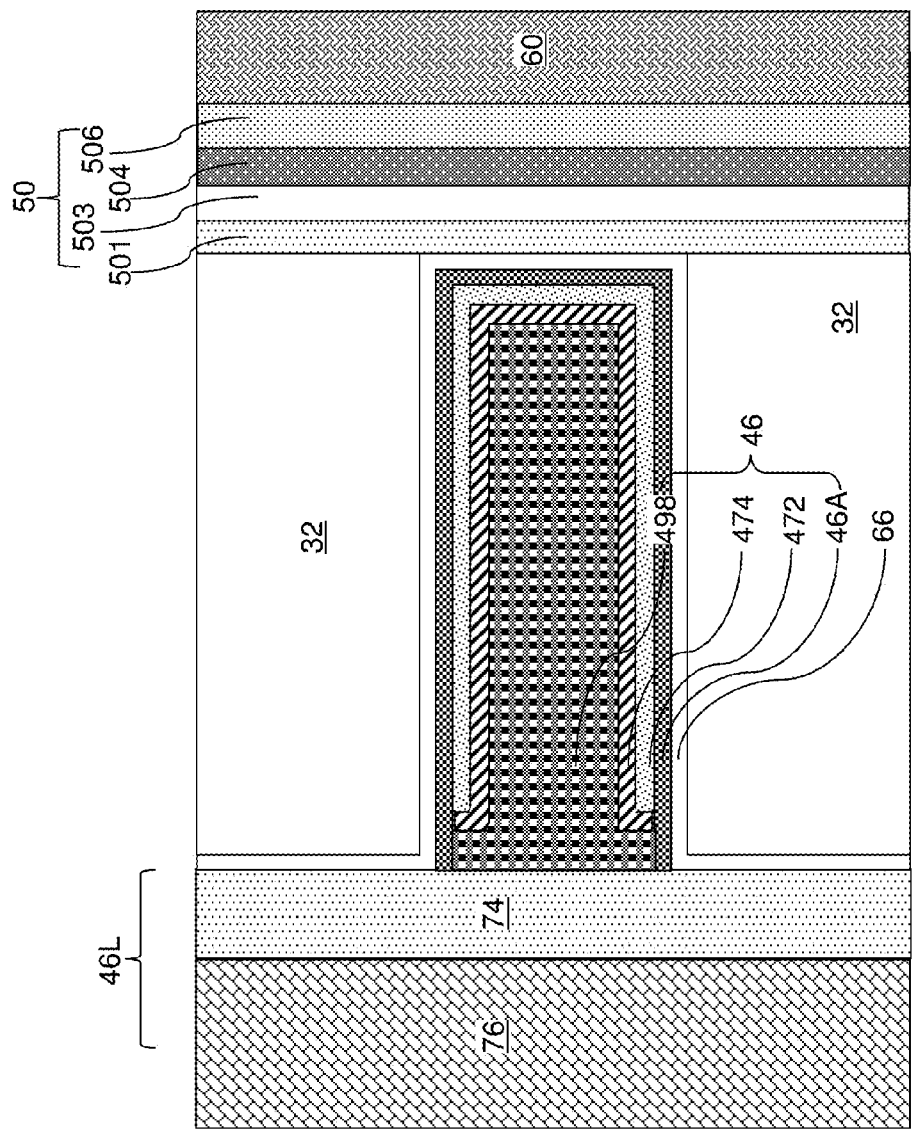

Referring to FIG. 23G, an insulating spacer and a backside contact via structure 76 can be formed in each backside via trench 79 by performing the processing steps of FIG. 18.

Figure 23H:
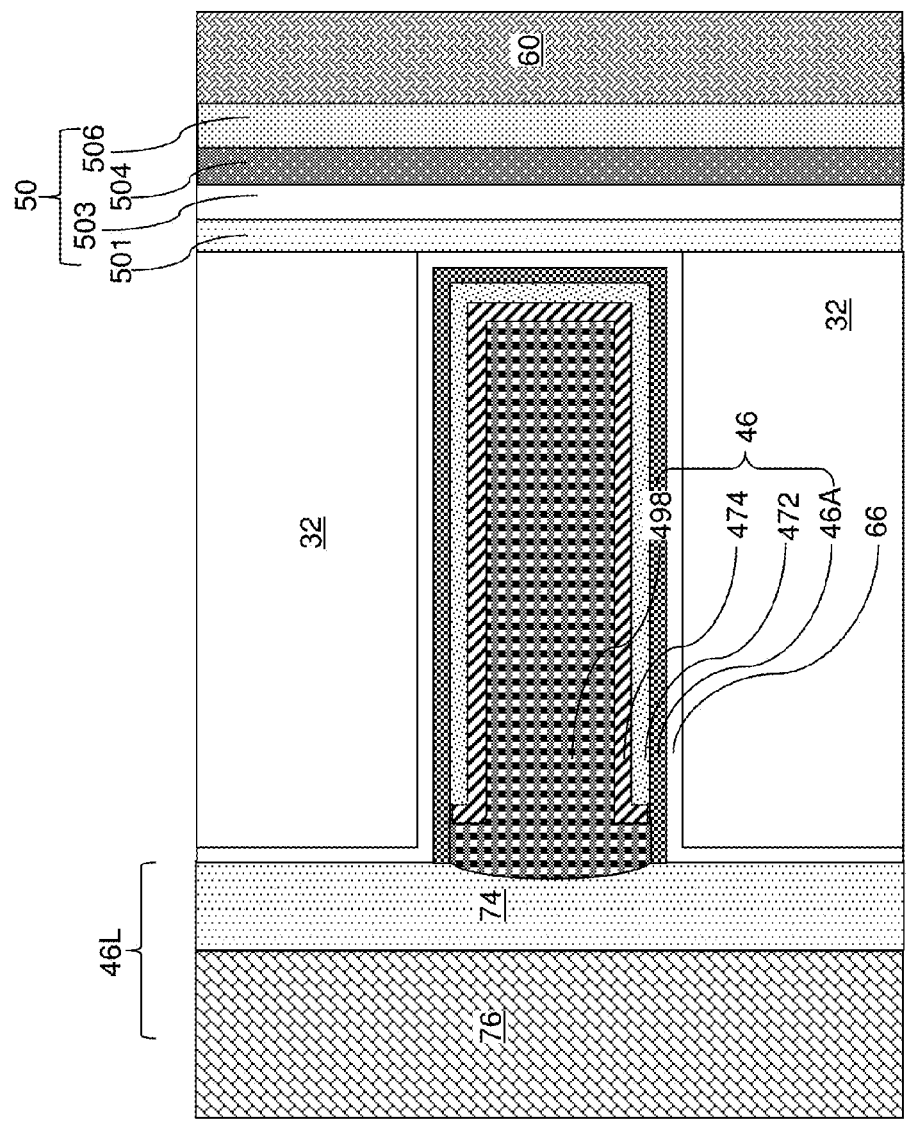
FIG. 23H is a vertical cross-sectional view of a region between a memory stack structure and a backside via trench in a first variation of the eleventh exemplary electrically conductive layer according to the eleventh embodiment of the present disclosure.

Referring to FIG. 23H, a first variation of the eleventh exemplary structure can be derived from the eleventh exemplary structure of FIG. 23G by inducing agglomeration of the material of the metal portions 498 during the anneal process that increases the grain size in the metal portions 498. In this case, a convex surface can be formed on the side of each metal portion 498 that faces the backside via trench 76. The convex surface of each metal portion 498 can contact an outer sidewall of the insulating spacer 74.

Figure 23I:
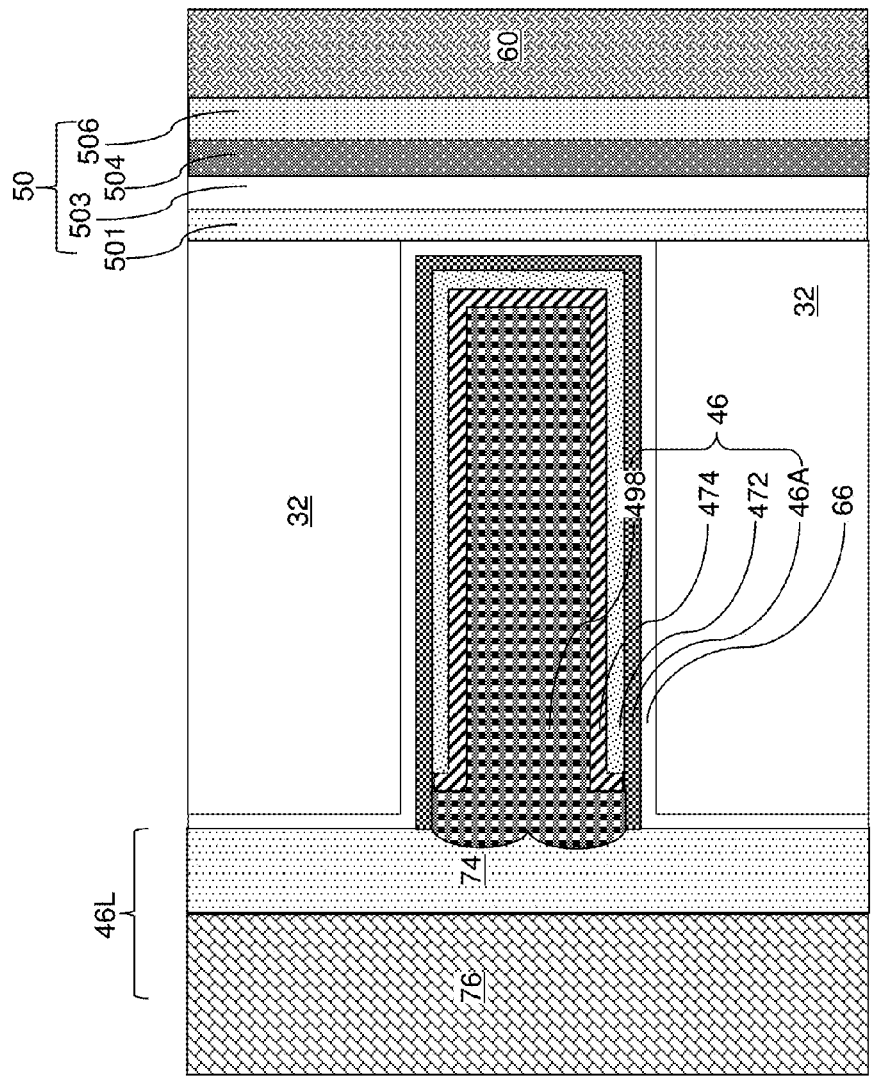
FIG. 23I is a vertical cross-sectional view of a region between a memory stack structure and a backside via trench in a second variation of the eleventh exemplary electrically conductive layer according to the eleventh embodiment of the present disclosure.

Referring to FIG. 23I, a second variation of the eleventh exemplary structure can be derived from the eleventh exemplary structure of FIG. 23G if an etch process that does not etch the metal portions 498 is employed to remove the vertical portions of the metal nitride layer 46A in the backside via trench 79, or if an isotropic etch process is employed to remove the vertical portions of the metal nitride layer 46A in the backside via trench 79. In this case, a pair of convex surfaces can be present on the side of each metal portion 498 that faces the backside via trench 76. The pair of convex surfaces of each metal portion 498 can contact an outer sidewall of the insulating spacer 74.

FIGS. 24A-24F illustrate a region between a memory stack structure and a backside via trench during formation of a twelfth exemplary electrically conductive layer according to a twelfth embodiment of the present disclosure. In the twelfth embodiment, the eleventh embodiment of the present disclosure is modified to omit formation of the metal nitride layer 46A.

Figure 24A:
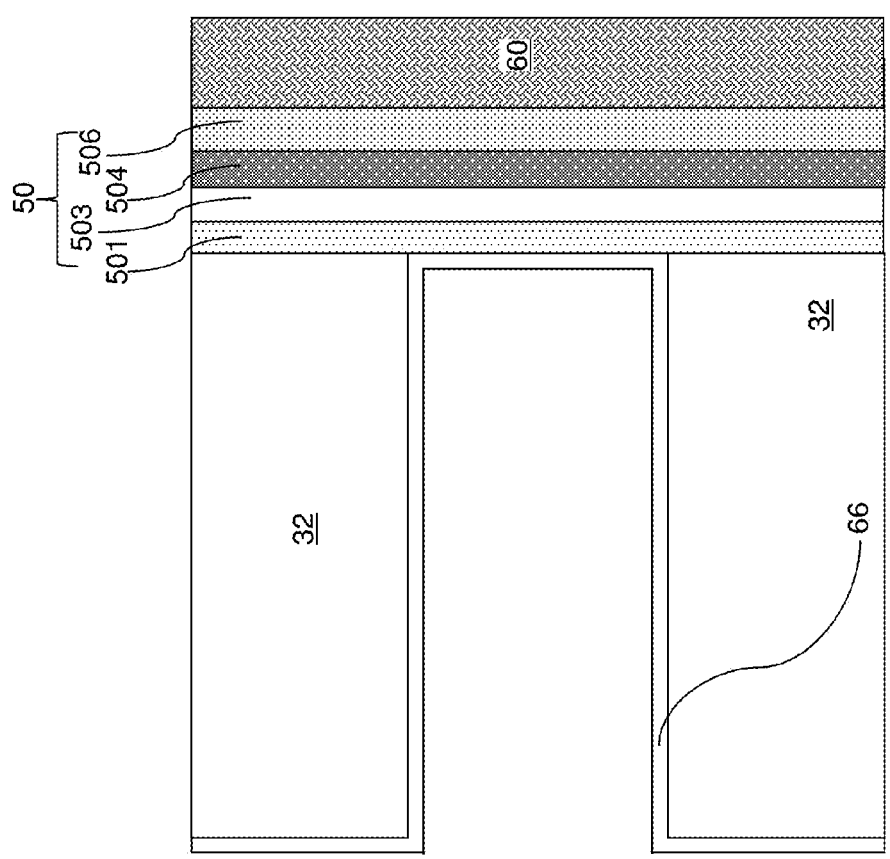
FIGS. 24A-24F are sequential vertical cross-sectional views of a region between a memory stack structure and a backside via trench during formation of a twelfth exemplary electrically conductive layer according to a twelfth embodiment of the present disclosure.

Referring to FIG. 24A, the exemplary structure for forming the twelfth exemplary electrically conductive layer can be derived from the exemplary structure illustrated in FIG. 20A by omitting formation of the metal nitride layer 46A.

Figure 24B:
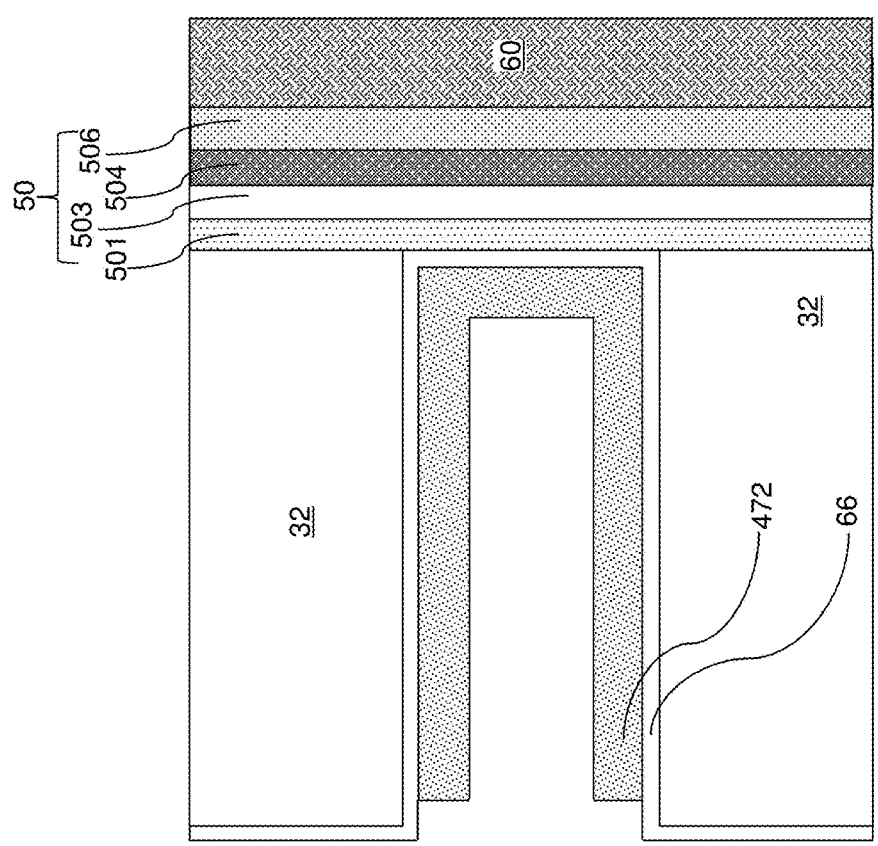

Referring to FIG. 24B, a silicon-containing layer 472 can be deposited on the blocking dielectric layer 66 by a conformal deposition process. The silicon-containing layer 472 can have the same composition as the silicon-containing layer 472 of the eighth through tenth embodiments, and can be formed employing same processing steps. In one embodiment, the silicon-containing layer 472 can consist essentially of an intrinsic silicon-containing semiconductor material or a doped silicon-containing semiconductor material. In one embodiment, the silicon-containing layer 472 can include undoped or doped amorphous silicon. The thickness of the silicon-containing layer 472 can be in a range from 1 to 15 nm, such as 3 nm to 10 nm, although lesser and greater thicknesses can also be employed.

An anisotropic etch process can be performed to etch the material of the silicon-containing layer 472 selective to the material of the backside blocking dielectric layer 66. Vertical portions of the silicon-containing layer 472 can be removed from inside each backside via trench 79. The silicon-containing layer 472 is removed from the periphery of each backside via trench 79, while a remaining portion of the silicon-containing layer 472 is present in each of the backside recesses. In one embodiment, the anisotropic etch process can have a small isotropic etch component to laterally recess remaining portions of the silicon-containing layer 472 from a vertical plane including a most proximal sidewall of the backside via trench 79, i.e., the vertical interface between the insulating layers 32 and the backside blocking dielectric layer 66 or, in case the backside blocking dielectric layer 66 is not employed, the sidewalls of the insulating layers 32 that are exposed to the backside via trench 79. The recess distance between the sidewalls of the remaining portions of the silicon-containing layer 472 and the vertical plane including the most proximal sidewall of the backside via trench 79 can be in a range from 3 nm to 30 nm, although lesser and greater recess distances can also be employed.

Figure 24C:
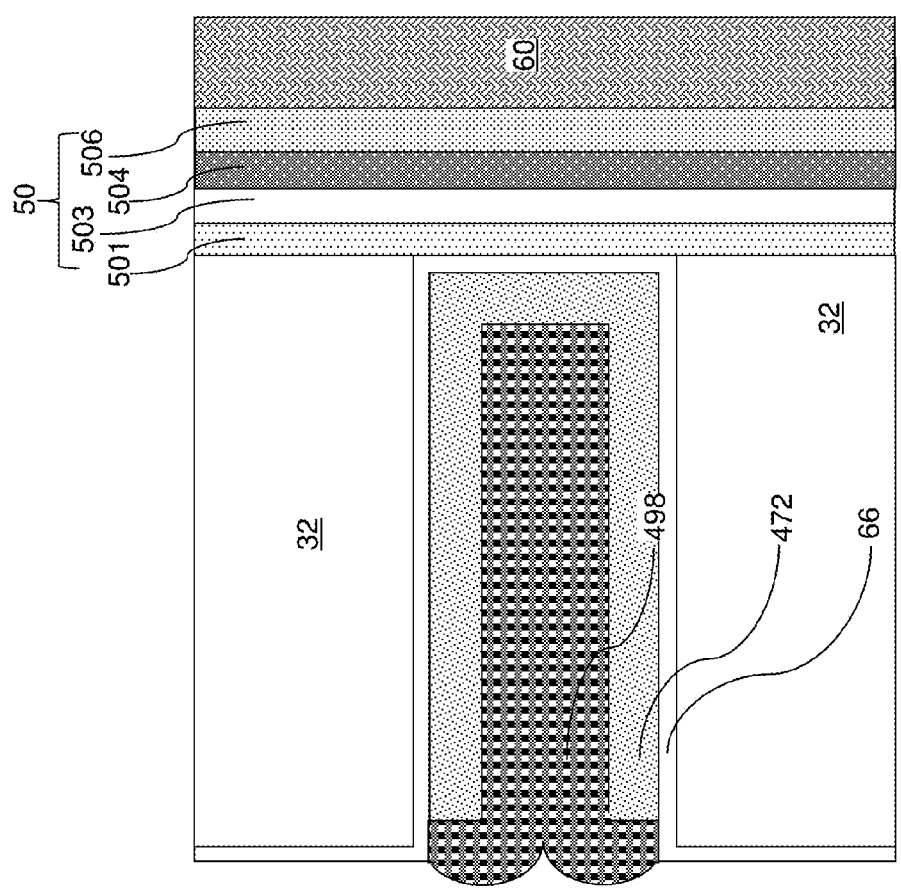

Referring to FIG. 24C, a metallic element can be deposited by a selective metal deposition process on the surfaces of the silicon-containing layer 472. The selective metal deposition process can be the same as in the processing steps of FIG. 23D.

The selective metal deposition process can include a chemical vapor deposition process and/or a selective atomic layer deposition process. The selective metal deposition process deposits the metallic element on the surface of the remaining portion of the silicon-containing layer 472 at a greater deposition rate than on physically exposed surfaces in the backside via trench 79 such as the surfaces of the blocking dielectric layer 66.

In one embodiment, the height of each cavity in the backside recesses (as measured by the separation distance between the upper horizontal portion and the lower horizontal portion of each portion of the silicon-containing layer 472) can be small enough so that each metal portion 498 deposited by the selective metal deposition process grows only from the surfaces of the silicon-containing layer 472, and does not grow from the surfaces of the backside blocking dielectric layer 66. In one embodiment, the height of each cavity in the backside recesses can be in a range from 8 nm to 24 nm, such as from 10 nm to 20 nm.

In another embodiment, an etchant can be intermittently flowed one or more times between flow of the reactant(s) during the selective metal deposition process to etch any nucleation sites from the surfaces of the backside blocking dielectric layer 66 to prevent deposition of the metallic element during the selective metal deposition process. In yet another embodiment, an etchant can be flowed concurrently with the flow of the reactant(s) to continually remove nucleation sites from the surfaces of the backside blocking dielectric layer 66 to prevent deposition of the metallic element during the selective metal deposition process.

Thus, the selective metal deposition process can grow material portions of the metallic element from the surfaces of the silicon-containing layer 472 without growing the metallic element from surfaces of the blocking dielectric layer 66. In one embodiment, two portions of the deposited elemental metal that grow from the upper horizontal portion of a silicon-containing layer 472 and from the lower horizontal portion of the silicon-containing layer 472 can merge at a periphery of the backside via trench 79 to form two convex surfaces that are adjoined at a horizontal seam.

Figure 24D:
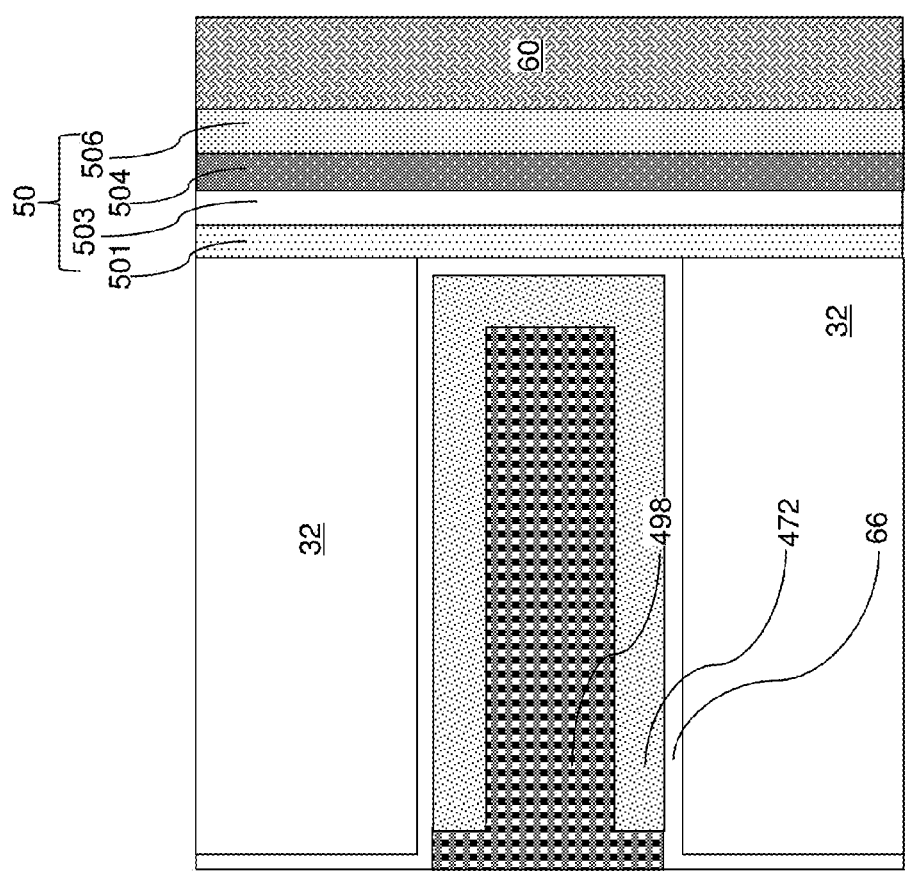

Referring to FIG. 24D, the region of each metal portion 498 that protrudes into the backside via trench 79 may be optionally etched by an anisotropic etch process. In this case, each metal portion 498 can have a planar vertical sidewall that faces the backside via trench 79. In one embodiment, the planar vertical sidewalls of the metal portions 498 can be vertically coincident with the sidewalls of the backside blocking dielectric layer 66. In case the backside blocking dielectric layer 66 is not employed, the planar vertical sidewalls of the metal portions 498 can be vertically coincident with the sidewalls of the insulating layers 32.

Each backside recess can be completely filled with a combination of a backside blocking dielectric layer 66, a silicon-containing layer 472, and a metal portion 498, which may be, for example, a cobalt portion. The metal portions 498 are formed as discrete structures that are vertically spaced among one another. As discrete structures, physical separation of the metal portions 498 is not necessary. The methods of the present disclosure can provide a recess-free metal fill process that forms the metal portions 498 as discrete material portions.

Alternatively, the metal portions 498 can be formed by a non-selective deposition of an elemental metal, and an etch process that removes the segments of the elemental metal that are deposited within the backside via trenches 79 by an isotropic etch or an anisotropic etch.

Figure 24E:
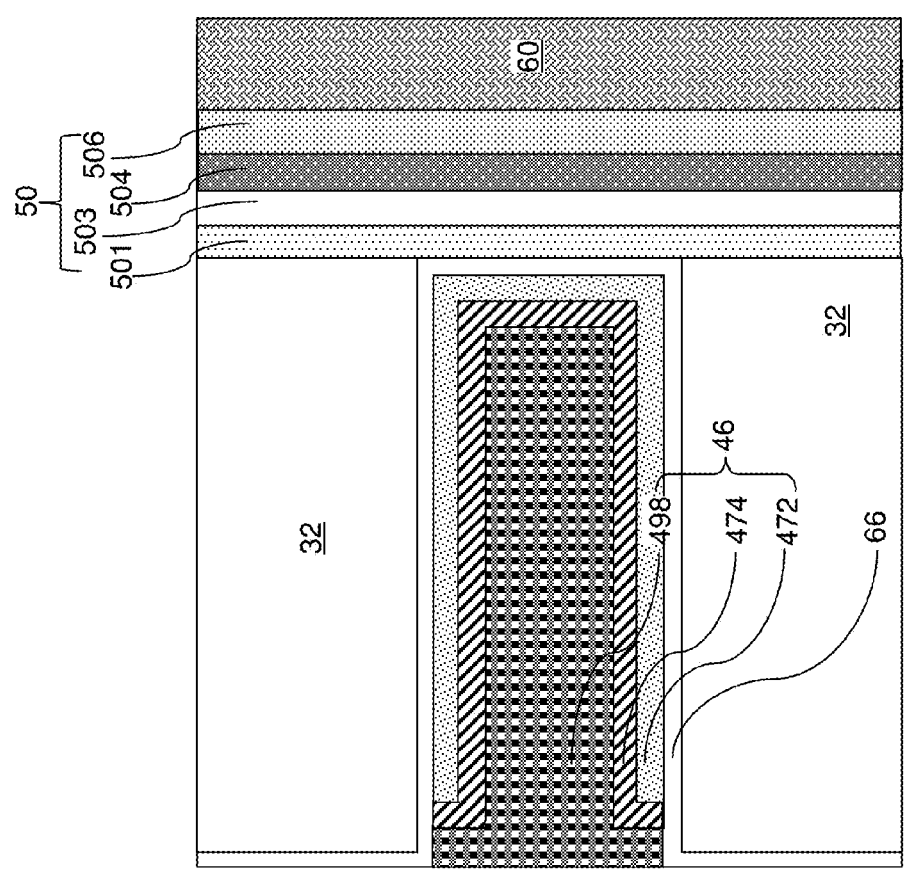

Referring to FIG. 24E, an anneal process can be optionally performed to increase the grain size in each metal portion 498. According to an aspect of the present disclosure, the silicon-containing layer 472 can include an amorphous silicon-containing material such as amorphous silicon. The amorphous structure of the silicon-containing layer 472 induces formation of large grains in the metal portion 498 during the anneal process, which can be performed to induce growth of large grains in the metal portion 498. The absence of large crystalline template surface in the silicon-containing layer 472 induces formation of large grains in the metal portion 488. In a non-limiting illustrative example, the average lateral dimension (i.e., the average diameter of a cylindrical volume that has the same as height as a corresponding grain) of the grains in segments of the metal portion 498 located within the backside recesses can be in a range from 1.5 times the height of the segment of the metal portion 498 to 6 times the height of the segment of the metal portion 498.

The anneal process that induces growth of the grain size in the metal portions 498 can collaterally induce formation of a metal silicide material at the interface with the silicon-containing layer 472. A metal silicide layer 474 can be collaterally formed. The thickness of the metal silicide layer 474 depends on the duration and temperature of the silicidation anneal process. In one embodiment, only a surface portion of the silicon-containing layer 472 may be consumed during formation of the metal silicide layer 474 (e.g., cobalt silicide layer).

In one embodiment, the amorphous material of the silicon-containing layer 472 may be converted into nanocrystalline silicon-containing material (such as polysilicon) having an average grain size in a range from 1 nm to 5 nm, although lesser and greater average grains can also be formed. Each combination of adjacent silicon-containing layer 472, metal silicide layer 474, and metal portion 498 constitutes an electrically conductive layer 46 (e.g., word line/control gate electrode of a three dimensional NAND memory device). Alternatively, the electrically conductive layer 46 may exclude the silicon-containing layer 472 if this layer is entirely consumed during formation of the metal silicide layer 474.

Figure 24F:
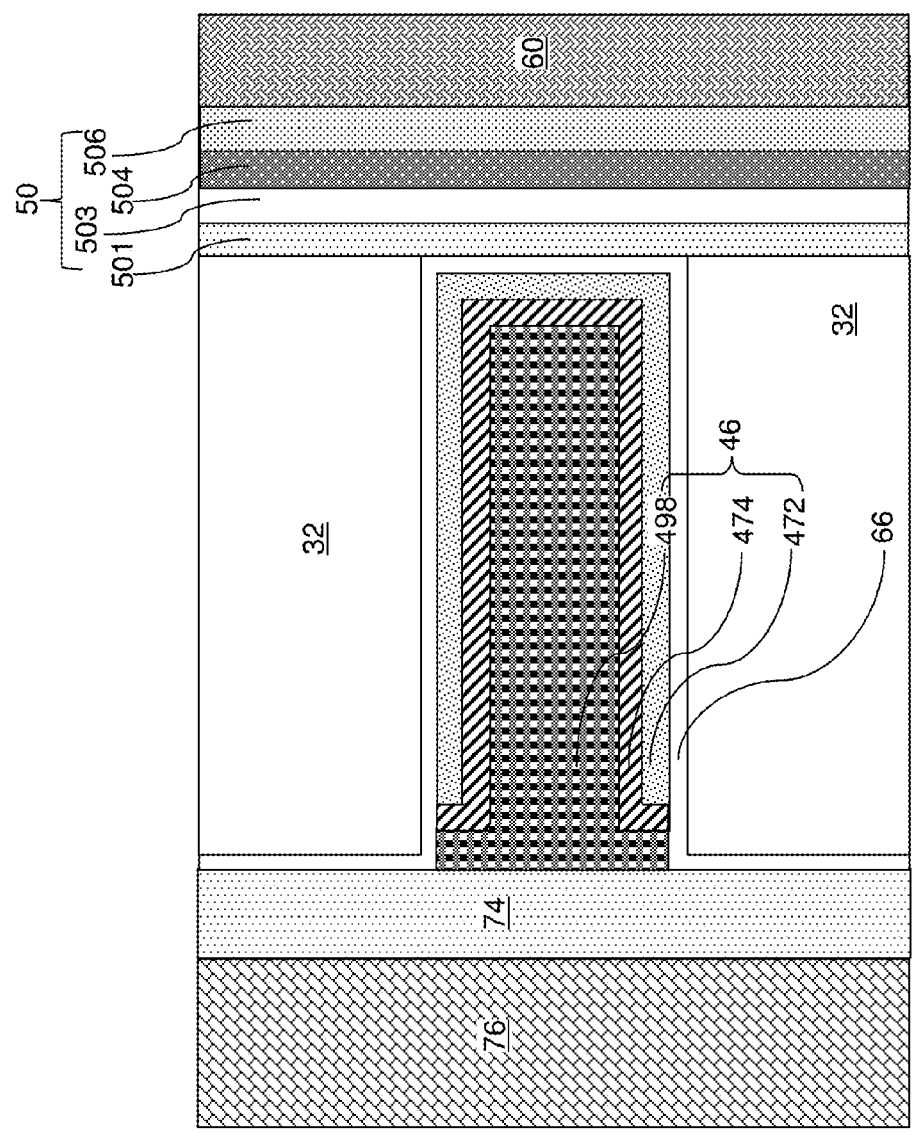

Referring to FIG. 24F, an insulating spacer and a backside contact via structure 76 can be formed in each backside via trench 79 by performing the processing steps of FIG. 18.

Figure 24G:
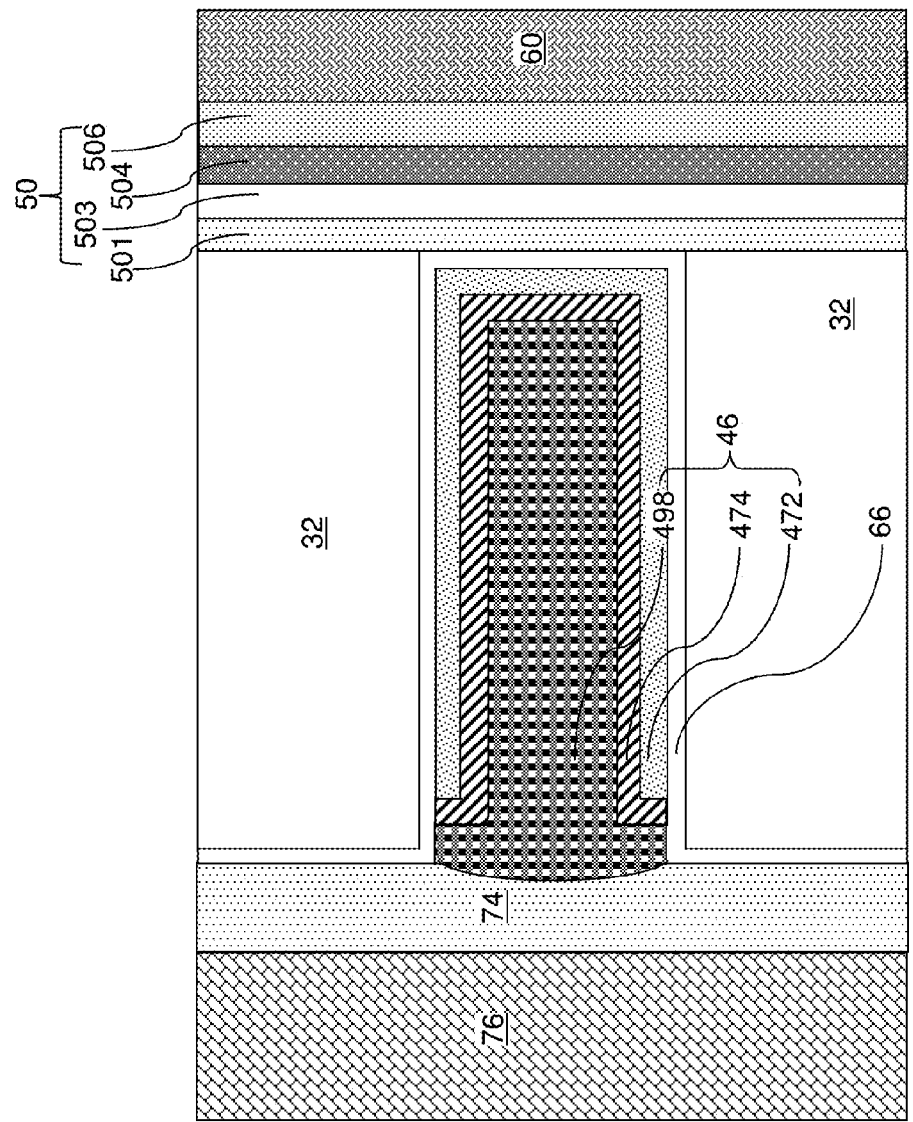
FIG. 24G is a vertical cross-sectional view of a region between a memory stack structure and a backside via trench in a first variation of the twelfth exemplary electrically conductive layer according to the twelfth embodiment of the present disclosure.

Referring to FIG. 24G, a first variation of the twelfth exemplary structure can be derived from the eleventh exemplary structure of FIG. 24F by inducing agglomeration of the material of the metal portions 498 during the anneal process that increases the grain size in the metal portions 498. In this case, a convex surface can be formed on the side of each metal portion 498 that faces the backside via trench 76. The convex surface of each metal portion 498 can contact an outer sidewall of the insulating spacer 74.

Figure 24H:
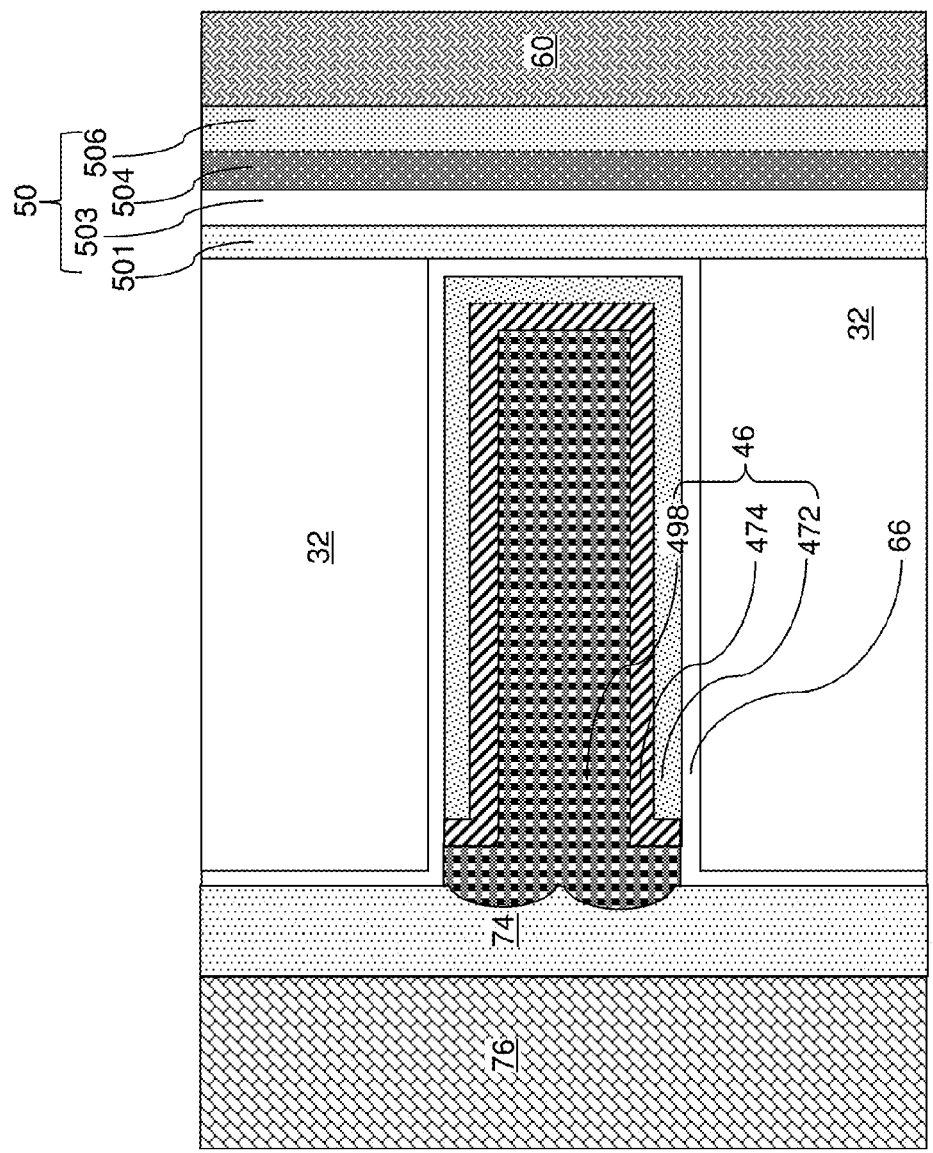
FIG. 24H is a vertical cross-sectional view of a region between a memory stack structure and a backside via trench in a second variation of the twelfth exemplary electrically conductive layer according to the twelfth embodiment of the present disclosure.

Referring to FIG. 24H, a second variation of the twelfth exemplary structure can be derived from the eleventh exemplary structure of FIG. 24F if the processing steps of FIG. 24D are omitted. In this case, a pair of convex surfaces can be present on the side of each metal portion 498 that faces the backside via trench 76. The pair of convex surfaces of each metal portion 498 can contact an outer sidewall of the insulating spacer 74.

The various exemplary structures of the present disclosure include a three-dimensional memory device. The three-dimensional memory device can comprise: an alternating stack of insulating layers 32 and electrically conductive layers 46 and located over a substrate (9, 10); and a memory stack structure 55 extending through the alternating stack (32, 46) and comprising, from outside to inside, charge storage elements (as embodied as portions of the charge storage layer 54 located at levels of the electrically conductive layers 46), a tunneling dielectric layer 54, and a vertical semiconductor channel 60. Each of the electrically conductive layers 46 comprises: a metal silicide layer (471, 474) including a silicide of a metallic element; and a metal portion {46B, (476, 478), 488, or 498} comprising the metallic element and embedded in the metal silicide layer (471, 474) and contacting horizontal surfaces and an outer sidewall (i.e., a sidewall that is distal from the memory stack structure 55) of the metal silicide layer (471, 474).

In some embodiments, each of the electrically conductive layers 46 further comprises a silicon-containing layer 472 that includes silicon at an atomic concentration of at least 60%, is essentially free of the metallic element, and embeds the metal silicide layer (471, 474). In one embodiment, the three-dimensional memory device further comprises: a backside via trench 79 vertically extending through each layer within the alternating stack (32, 46); and a dielectric material portion (such as an insulating spacer 74) located in the backside via trench 79 and extending through each layer within the alternating stack (32, 46).

In some embodiments such as the first, third, and eighth through tenth embodiments, each silicon-containing layer 472 and each metal portion {46B, (476, 478), 488} of the electrically conductive layers 46 directly contact a sidewall of the dielectric material portion 74.

In some embodiments such as the eleventh and twelfth embodiments, each metal portion 498 of the electrically conductive layers 46 directly contacts a sidewall of the dielectric material portion 76; and each silicon-containing layer 472 of the electrically conductive layers 46 does not directly contact, and is laterally spaced by a respective metal portion 498 from, the dielectric material portion 74.

In some embodiments, each of the electrically conductive layers 46 further comprises a metal nitride layer 46A consisting essentially of a conducive metal nitride material and embeds the metal silicide layer 472.

In some embodiments such as the first, third, and eighth through tenth embodiments, each metal nitride layer 46A and each metal portion {46B, (476, 478), 488} of the electrically conductive layers 46 directly contact a sidewall of the dielectric material portion 74.

In some embodiments such as the eleventh and twelfth embodiments, each metal portion 498 of the electrically conductive layers 46 directly contacts a sidewall of the dielectric material portion 74; and each metal nitride layer 46A of the electrically conductive layers 46 does not directly contact, and is laterally spaced by a respective metal portion 498 from, the dielectric material portion 74.

In some embodiments, the metal silicide layer (471, 474) and the metal portion {46B, (476, 478), 488, 498} within each electrically conductive layer 46 directly contacts horizontal surfaces of a respective one of the metal nitride layers 46A of the electrically conductive layers 46.

In some embodiments, each of the electrically conductive layers 46 is laterally spaced from the memory stack structure 55 by a vertical portion of a backside blocking dielectric layer 66, and is vertically spaced from each overlying one of the insulating layers 32 and from each underlying one of the insulating layers 32 by horizontal portions of the backside blocking dielectric layer 66, and the metal silicide layer 474 and the metal portion {(476, 478), 488} within each electrically conductive layer 46 directly contacts horizontal surfaces of the backside blocking dielectric layer 66.

In each embodiment in which the metal silicide layer (471, 474) is present, the metal silicide layer (471, 474) may include at least one of carbon and nitrogen at an atomic concentration in a range from 1% to 20%, and may include at least one of a metal element and nitrogen atoms at a respective atomic concentration in a range from 1% to 20%. The atomic concentration of silicon may be at least 60% in such cases.

Due to the diffusion of the various elements from, and into, the metal nitride layer 46A and from, and into, the metal portion {46B, (476, 478), 488}, the metal silicide layer (471, 474) can have a gradient in atomic concentration of silicon such that the atomic concentration of silicon increases with distance from an interface between the metal silicide layer (471, 474) and the metal portion {46B, (476, 478), 488}.

Some embodiments, including the eighth through twelfth embodiments, can increase the average grain size of the material of the metal portion {46B, (476, 478), 488} by employing amorphous or nanocrystalline seed layers during an anneal process. By increasing the average grain size, the resistivity of the electrically conductive layers 46 can be lowered, and performance of the three-dimensional memory device can be enhanced.

In some embodiment, the three-dimensional memory device can include a stack of alternating layers comprising insulating layers 32 and electrically conductive layers 46 and located over a substrate (9, 10), a memory opening 49 extending through the stack; and a memory stack structure 55 located in the memory opening and comprising, from outside to inside, a memory material layer 504, a tunneling dielectric layer 506, and a semiconductor channel 60. Each of the electrically conductive layers 46 can comprise a silicon-containing-material layer (which may be a silicon nucleation layer 451, an amorphous silicon nucleation layer 452, a variable thickness silicon layer 451', and/or a tungsten silicide layer 471), and at least one tungsten layer embedded in the silicon-containing-material layer and contacting horizontal surfaces and an outer sidewall of the silicon-containing material layer.

In one embodiment, the silicon-containing-material layer can comprise a silicon nucleation layer (451, 451', or 452) consisting essentially of silicon atoms or consisting essentially of silicon atoms and electrical dopant atoms. In another embodiment, the silicon-containing material layer can comprise a tungsten silicide layer 471.

In one embodiment, a backside contact via structure 76 extending through the alternating stack (32, 46) and to the substrate (9, 10) can be provided. The silicon-containing material layer can comprise a variable thickness material layer 451' having a variable thickness that increases with a lateral distance from a most proximal sidewall of the backside contact via structure 76.

In one embodiment, each of the electrically conductive layers 46 may comprise a conductive metal nitride layer 46A, and each silicon-containing-material layer may be located directly on a respective conductive metal nitride layer.

The monolithic three-dimensional memory device comprises a stack of alternating layers comprising insulating layers 32 and electrically conductive layers 46 and located over a substrate (9, 10), an array of memory openings extending through the stack; and a plurality of memory stack structures 55 located within a respective memory opening. Each electrically conductive layer 46 can laterally surround the plurality of memory stack structures 55.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. Top and bottom electrically conductive layers in the stack may comprise drain and source select gate electrodes. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10). In one embodiment, the plurality of semiconductor channels can comprise a common horizontal semiconductor channel portion that is a portion of the doped well layer 10 between a source region 61 and the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The methods of the present disclosure provide various benefits including, but not limited to, the following. The silicon nucleation layer 451 does not include any fluorine atoms. In this regard, the silicon nucleation layer 451 is different from previously known tungsten nucleation layers because previously known tungsten nucleation layers employ fluorine at a concentration of about $1.0 \times 10^{21}/cm^3$. As discussed above, fluorine diffusion has been associated with formation of voids in the word line oxide layers after thermal processing steps. Since fluorine is absent in the silicon nucleation layer 451, there is less chance of void formation.

Another drawback of the conventional nucleation layer employed to nucleate tungsten is high resistivity, which can be in the range of several hundreds of microOhm-cm. While intrinsic silicon has an even higher resistivity, introduction of electrical dopants (such as p-type dopants or n-type dopants) can reduce the resistivity to a level lower than the resistivity of conventional nucleation layers. Thus, with electrical doping, the silicon nucleation layer 451 can provide a lower resistivity than conventional nucleation layers. In addition, the contribution of the silicon nucleation layer 451 to the electrical resistivity can be further lowered in embodiments in which a metal silicide material is subsequently formed. Since the nucleation layer is expected to takes up for a greater percentage of the total thickness of a word line in the devices of future generations, the contribution of the resistivity of the nucleation layer to the total resistivity of a word line is expected to increase. Employing doped silicon for the silicon nucleation layer 451 can significantly reduce the total resistivity of each word line in future generations.

As far as stress is concerned, even though conventional nucleation layers are relatively thin, the conventional nucleation layers contribute significantly to stress in the device structure because of its high moduli of elasticity. The silicon nucleation layer 451 of the present disclosure can significantly lower the component of stress caused by the nucleation layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a semiconductor device, comprising:
    forming an alternating stack of insulating layers and sacrificial material layers over a substrate;
    forming a plurality of memory openings through the stack;
    forming memory stack structures in the plurality of memory openings, each of the memory stack structures comprising, from outside to inside, a memory material layer, a tunneling dielectric layer, and a semiconductor channel;
    forming a backside via trench through the alternating stack;
    forming backside recesses by removing the sacrificial material layers selective to the insulating layers employing an etchant introduced through the backside via trench;
    depositing a silicon-containing layer in the backside recesses; and
    forming a metal silicide layer and a metal portion in the backside recesses after depositing the silicon-containing layer,
    wherein the metal silicide layer and the metal portion are formed in the backside recesses by:
        depositing a metal element in remaining volumes of the backside recesses;
        inducing silicidation of a portion of the deposited metal element,
        wherein the silicon-containing layer is at least partially consumed during silicidation of the portion of the deposited metal element, and an unreacted portion of the deposited metal element constitutes the metal portion; and
    wherein the silicon-containing layer is only partially consumed during the silicidation of the portion of the deposited metal element.

2. A method of manufacturing a semiconductor device, comprising:
    forming an alternating stack of insulating layers and sacrificial material layers over a substrate;
    forming a plurality of memory openings through the stack;
    forming memory stack structures in the plurality of memory openings, each of the memory stack structures comprising, from outside to inside, a memory material layer, a tunneling dielectric layer, and a semiconductor channel;

forming a backside via trench through the alternating stack;

forming backside recesses by removing the sacrificial material layers selective to the insulating layers employing an etchant introduced through the backside via trench;

depositing a silicon-containing layer in the backside recesses;

forming a metal silicide layer and a metal portion in the backside recesses after depositing the silicon-containing layer; and removing the silicon-containing layer from the periphery of the backside via trench while a remaining portion of the silicon-containing layer is present in each of the backside recesses, wherein the metal element is deposited directly on a surface of the remaining portion of the silicon-containing layer.

3. The method of claim 2, wherein:

the metal element comprises cobalt; and the metal element is deposited by a selective chemical vapor deposition process or a selective atomic layer deposition process that deposits the metal element on the surface of the remaining portion of the silicon-containing layer at a greater deposition rate than on physically exposed surfaces in the backside via trench.

4. The method of claim 3, further comprising:

depositing a metal nitride layer in the backside recesses prior to depositing the silicon-containing layer, wherein the silicon-containing layer is deposited directly on the metal nitride layer and the physically exposed surfaces in the backside via trench comprise a surface of a metal nitride layer; and removing portions of the metal nitride layer from the periphery of the backside via trench after formation of the metal portion in the backside recesses.

5. A method of manufacturing a semiconductor device, comprising:

forming an alternating stack of insulating layers and sacrificial material layers over a substrate;

forming a plurality of memory openings through the stack;

forming memory stack structures in the plurality of memory openings, each of the memory stack structures comprising, from outside to inside, a memory material layer, a tunneling dielectric layer, and a semiconductor channel;

forming a backside via trench through the alternating stack;

forming backside recesses by removing the sacrificial material layers selective to the insulating layers employing an etchant introduced through the backside via trench;

depositing a silicon-containing layer in the backside recesses; and forming a metal silicide layer and a metal portion in the backside recesses after depositing the silicon-containing layer, wherein:

the metal silicide layer is an amorphous or microcrystalline metal silicide layer, and the metal portion comprises a tungsten layer having an average grain size greater than 40 nm and a resistivity of less than 20 Ohm-cm;

the silicon-containing layer includes silicon at an atomic concentration of at least 60%;

the tungsten layer have an average grain size of 60 to 90 nm and a resistivity of 15 to 18 Ohm-cm;

the metal silicide layer comprises amorphous tungsten silicide or microcrystalline tungsten silicide having an average grain size of less than 3 nm;

depositing the silicon-containing layer comprises depositing an in-situ boron-doped silicon layer using diborane as a dopant in a first chamber; and forming the metal silicide layer comprises depositing a tungsten layer on the boron-doped silicon layer in the first chamber without a vacuum break, followed by reacting the tungsten layer with the boron-doped silicon layer to form the amorphous or microcrystalline tungsten silicide layer.

6. A three-dimensional memory device comprising:

an alternating stack of insulating layers and electrically conductive layers and located over a substrate; and a memory stack structure extending through the alternating stack and comprising, from outside to inside, a memory material layer, a tunneling dielectric layer, and a vertical semiconductor channel;

wherein each of the electrically conductive layers comprises:

a metal silicide layer;

a metal portion contacting horizontal surfaces and an outer sidewall of the metal silicide layer; and a silicon-containing layer that includes silicon at an atomic concentration of at least 60%, is essentially free of the metal element, and located between the memory stack structures and the metal silicide layer.

7. The three-dimensional memory device of claim 6, further comprising:

a backside via trench vertically extending through each layer within the alternating stack; and a dielectric material portion located in the backside via trench and extending through each layer within the alternating stack, wherein each silicon-containing layer and each metal portion of the electrically conductive layers directly contact a sidewall of the dielectric material portion.

8. The three-dimensional memory device of claim 6, further comprising:

a backside via trench vertically extending through each layer within the alternating stack; and a dielectric material portion located in the backside via trench and extending through each layer within the alternating stack, wherein:

each metal portion of the electrically conductive layers directly contacts a sidewall of the dielectric material portion; and each silicon-containing layer of the electrically conductive layers does not directly contact, and is laterally spaced by a respective metal portion from, the dielectric material portion.

9. A three-dimensional memory device comprising:

an alternating stack of insulating layers and electrically conductive layers and located over a substrate; and a memory stack structure extending through the alternating stack and comprising, from outside to inside, a memory material layer, a tunneling dielectric layer, and a vertical semiconductor channel;

wherein each of the electrically conductive layers comprises:

a metal silicide layer;

a metal portion contacting horizontal surfaces and an outer sidewall of the metal silicide layer; and a metal nitride layer located between the memory stack structures and the metal silicide layer.

10. The three-dimensional memory device of claim 9, further comprising:

a backside via trench vertically extending through each layer within the alternating stack; and a dielectric material portion located in the backside via trench and extending through each layer within the alternating stack, wherein each metal nitride layer and each metal portion of the electrically conductive layers directly contact a sidewall of the dielectric material portion.

11. The three-dimensional memory device of claim 9, further comprising:
- a backside via trench vertically extending through each layer within the alternating stack; and
- a dielectric material portion located in the backside via trench and extending through each layer within the alternating stack, wherein:
- each metal portion of the electrically conductive layers directly contacts a sidewall of the dielectric material portion; and
- each metal nitride layer of the electrically conductive layers does not directly contact, and is laterally spaced by a respective metal portion from, the dielectric material portion.

12. The three-dimensional memory device of claim 9, wherein the metal silicide layer directly contacts horizontal surfaces of a respective one of the metal nitride layers of the electrically conductive layers.

13. A three-dimensional memory device comprising:
- an alternating stack of insulating layers and electrically conductive layers and located over a substrate; and
- a memory stack structure extending through the alternating stack and comprising, from outside to inside, a memory material layer, a tunneling dielectric layer, and a vertical semiconductor channel;

wherein each of the electrically conductive layers comprises:
- a metal silicide layer; and
- a metal portion contacting horizontal surfaces and an outer sidewall of the metal silicide layer; and wherein the metal silicide layer has a gradient in atomic concentration of silicon such that the atomic concentration of silicon increases with distance from an interface between the metal silicide layer and the metal portion.

* * * * *